United States Patent
Uchida et al.

(10) Patent No.: US 7,048,172 B2
(45) Date of Patent: May 23, 2006

(54) VISCOUS FLUID TRANSFER APPARATUS AND TRANSFER METHOD, ELECTRONIC COMPONENT MOUNTING APPARATUS AND MOUNTING METHOD, AND SEMICONDUCTOR DEVICE

(75) Inventors: Hideki Uchida, Kofu (JP); Kazuo Kido, Kofu (JP); Tomoyuki Nakano, Kofu (JP); Takeshi Kuribayashi, Yamanashi (JP); Yoshihiko Misawa, Katano (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/925,625

(22) Filed: Aug. 25, 2004

(65) Prior Publication Data

US 2005/0017052 A1    Jan. 27, 2005

Related U.S. Application Data

(62) Division of application No. 10/016,455, filed on Dec. 10, 2001, now Pat. No. 6,789,720.

(30) Foreign Application Priority Data

Dec. 11, 2000    (JP) .............................. 2000-376265

(51) Int. Cl.
*B23K 1/00* (2006.01)
*B23K 5/22* (2006.01)
(52) U.S. Cl. ............................ 228/22; 228/19; 228/33; 228/207
(58) Field of Classification Search .................... 228/8, 228/19, 22, 32–34, 207, 214–216, 248.1, 228/223, 224
See application file for complete search history.

(56) References Cited

U.S. PATENT DOCUMENTS

| 5,297,333 A | | 3/1994 | Kusaka | |
|---|---|---|---|---|
| 5,601,229 A | * | 2/1997 | Nakazato et al. | 228/246 |
| 5,680,984 A | | 10/1997 | Sakemi | 228/246 |
| 5,750,199 A | * | 5/1998 | Sakemi | 427/357 |

(Continued)

FOREIGN PATENT DOCUMENTS

JP        62-056145        3/1987

(Continued)

OTHER PUBLICATIONS

IBM Technical Disclosure Bulletin, IBM Corp. New York, "Known Good Dye Test and Direct Chip Attach Assembly", Jul. 1, 1996, pp. 215, 217, vol. 39, No. 07.

*Primary Examiner*—Lynne R. Edmondson
(74) *Attorney, Agent, or Firm*—Pearne & Gordon LLP

(57) ABSTRACT

A squeegee unit having a stirring squeegee and a leveling squeegee fixed thereto is rocked with the reciprocating operation of a transfer unit moving mechanism to cause the stirring squeegee and the leveling squeegee to approach the pan surface of a transfer unit on going and returning paths. Consequently, the stirring squeegee stirs a viscous fluid put on the transfer unit on the going path of the transfer unit and the leveling squeegee uniformly flattens the viscous fluid stirred on the going path to have a predetermined thickness on the returning path of the transfer unit, thereby forming a flat viscous fluid transfer surface on the transfer unit. By immersing the terminal portion of the electronic component in the viscous fluid transfer surface, the viscous fluid is transferred to the electronic component and the electronic component is then mounted in a predetermined mounting position.

5 Claims, 51 Drawing Sheets

U.S. PATENT DOCUMENTS

| | | |
|---|---|---|
| 5,783,870 A | 7/1998 | Mostafazadeh et al. |
| 5,791,243 A | 8/1998 | Marcoux et al. |
| 6,099,681 A | 8/2000 | Arikado et al. ............. 156/285 |
| 6,537,400 B1 | 3/2003 | Fogal et al. ................... 156/64 |
| 6,576,495 B1 | 6/2003 | Jiang et al. ................. 438/108 |
| 6,581,282 B1 | 6/2003 | Mori et al. .................... 29/840 |
| 6,789,720 B1* | 9/2004 | Uchida et al. ................ 228/22 |
| 6,957,759 B1* | 10/2005 | Uchida et al. ................ 228/22 |
| 2002/0195007 A1* | 12/2002 | Sano et al. ................. 101/123 |
| 2004/0035306 A1 | 2/2004 | Onishi et al. ............... 101/123 |
| 2004/0108368 A1* | 6/2004 | Onishi et al. ............ 228/248.1 |
| 2005/0077340 A1* | 4/2005 | Nagafuku et al. ............. 228/8 |

FOREIGN PATENT DOCUMENTS

| | | |
|---|---|---|
| JP | 06-238869 | 8/1994 |
| JP | 08-187836 A * | 1/1995 |
| JP | 08-187836 | 7/1996 |
| JP | 11-198348 | 7/1999 |
| JP | 2001-267728 | 9/2001 |
| JP | 2001-339196 | 12/2001 |
| WO | WO 00/05936 | 2/2000 |

* cited by examiner

← DIRECTION OF PROGRESS OF SQUEEGEE (FIRST MOUNTING STEP)

(FIRST REFLOW STEP)

(SECOND MOUNTING STEP)

(SECOND REFLOW STEP)

(THIRD MOUNTING STEP)

(THIRD REFLOW STEP)

(FOURTH MOUNTING STEP)

(FOURTH REFLOW STEP)

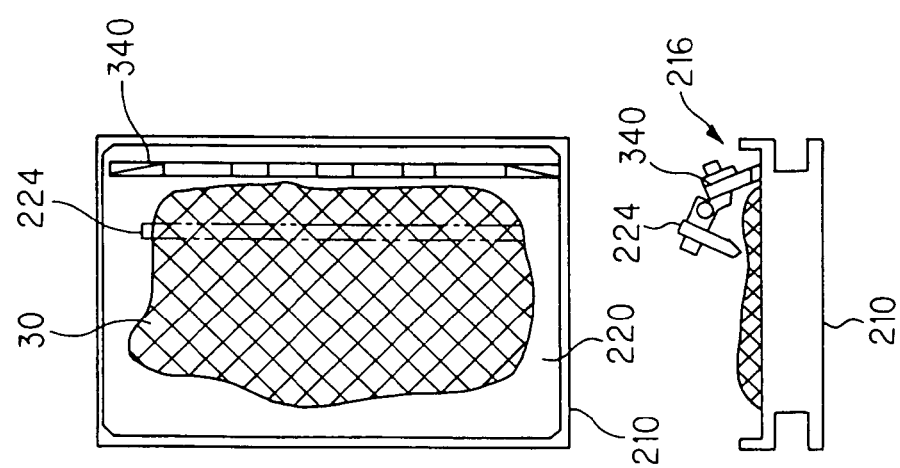
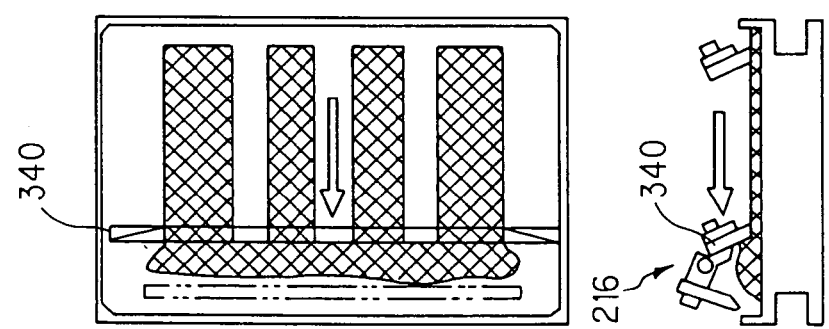
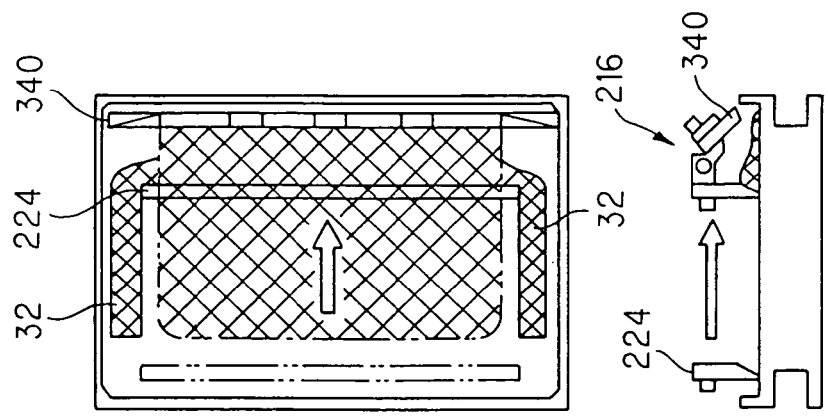
FIG. 44(a)
FIG. 44(b)
FIG. 44(c)

us 7,048,172 B2

VISCOUS FLUID TRANSFER APPARATUS AND TRANSFER METHOD, ELECTRONIC COMPONENT MOUNTING APPARATUS AND MOUNTING METHOD, AND SEMICONDUCTOR DEVICE

CROSS-REFERENCE TO RELATED APPLICATIONS

This application is a division of U.S. patent application Ser. No. 10/016,455 filed Dec. 10, 2001 now U.S. Pat. No. 6,789,720.

BACKGROUND OF THE INVENTION

1. Field of the Invention

The present invention relates to a viscous fluid transfer apparatus and method for transferring a viscous fluid to the connecting terminal of a package component such as an IC. The present invention also relates to an electronic component mounting apparatus and method using the viscous fluid transfer apparatus, and a semiconductor device. Moreover, the present invention particularly relates to a three-dimensional mounting technique for providing an electronic component in plural stages.

2. Description of the Related Art

In the recent electronic apparatus industry, a high functionality and a reduction in a size and a weight of a product have been vigorously developed, and various mounting methods such as double-sided mounting have been employed for an electronic component such as an IC in order to reduce a mounting area to a circuit board in addition to an increase in the integration of a semiconductor device itself.

In the package technique of the electronic component, moreover, a DIP (Dual Inline Package) which has conventionally been used widely is switched to a QFP (Quad Flat Package) and an SOP (Small Outline Package) which have a space between leads as shown in a double-sided mounting state of FIG. 58(a), and furthermore, attention has been paid to an area array type package such as a BGA (Ball Grid Array) or a CSP (Chip Size Package) shown in FIG. 58(b) as a technique for a practical stage.

On the other hand, a bare chip mounting method for carrying out direct mounting onto a circuit board without packaging has also been partially employed. However, there has still been a problem to be solved for a mass production and a reduction in a cost. In the bare chip mounting method, a flux is transferred onto a bare chip component to be mounted on a circuit board. In this case, examples of a flux transfer device for transferring the flux include a device for forming the transfer surface of the flux by reciprocating a squeegee 512 having almost the same structure over a transfer unit 510 as shown in FIGS. 59(a), 59(b), 60(a), and 60(b). The bare chip component is mounted by moving the squeegee 512 over the transfer unit 510 to extend the flux over the whole pan surface and immersing the bare chip component on the extended flux to transfer the flux to the component side, and by pressure welding the bare chip component into a predetermined position on the circuit board after the transfer.

Moreover, there have been various methods for mounting the electronic component of the area array type package onto the circuit board, and the mounting can be carried out in the following manner, for example. First of all, a land is formed in a position on the circuit board corresponding to the solder ball of an electronic component (BGA) and a solder cream is mask printed on the land. Then, the electronic component is mounted in the predetermined position on the circuit board to superpose the printed solder cream on the solder ball of the electronic component, and the electronic component is temporarily fixed to the circuit board with the viscosity of the solder cream. The circuit board is subjected to a reflow process so that the solder cream and the solder ball are molten and the land and the solder ball of the electronic component are connected and fixed to each other.

In the mounting method for the electronic component of the conventional area array type package, however, a reduction in a mounting area has further been required. And furthermore, a mask hole forming technique having high precision for a solder cream printing screen and a mask aligning technique have been required with an enhancement in the fine pitch of the electronic component. For this reason, stable mounting having high precision has been restricted over the extension of a current method and it is inevitably hard to carry out further high density mounting so that the development of other different mounting methods has been desired.

A technique for forming an electronic component with a stack structure having several stages has variously been investigated. However, the electronic component is not simply stacked but a jig accommodating the electronic component therein is provided or a contact structure is very complicated. Consequently, there has been a problem in that the design of a conventional circuit pattern is forcibly changed considerably and a mounting cost is hard to reduce.

Moreover, it has also been supposed that the electronic component is three-dimensionally mounted by stack on a rear face opposite to the mounting surface side of the electronic component for an area array type package such as a BGA or a CSP having the small pitch of a connecting terminal. There has been a problem in that a method of giving a solder cream for the stack is to be established or alignment precision is to be maintained. Therefore, the practical use has not been attained.

When a solder cream is to be put and transferred onto the electronic component in place of the flux by using the flux transfer device for transferring the flux onto the bare chip component, the viscosity of the solder cream is extremely higher than that of the flux. Therefore, the solder cream overflows from the transfer unit so that the flux transfer device cannot be actually substituted for solder cream transfer.

FIGS. 59(a), 59(b), 60(a) and 60(b) show a state in which the solder cream is put onto the flux transfer device to move the squeegee 512, (a) being a plan view and (b) being a side view. As shown in FIGS. 59(a) and (b), when the squeegee 512 is moved from the left side to the right side in the drawing, the solder cream is protruded from the end in the longitudinal direction of the squeegee 512 based on a difference in a viscosity so that it overflows from the edge portion of the transfer unit 510. In the same manner as in FIGS. 60(a) and (b), when the squeegee 512 is moved from the right side to the left side in the drawing, the solder cream further overflows.

In addition, the solder cream coming in contact as shown in FIG. 61 is transmitted toward the upper part of each squeegee 512 due to a viscosity thereof, and finally, the solder cream sticks to each portion of the apparatus and the solder cream is dropped off from a part of the apparatus. As a result, the solder cream is scattered to the surrounding environment so that maintenance is often required. Consequently, a manufacturing man-hour is increased and the quality of a product is deteriorated.

Moreover, there is also a problem regarding a sucking nozzle 514 to be used for the transfer of the solder cream. More specifically, as shown in FIG. 62, when an electronic component 520 is to be pushed against an inclined surface, for example, the solder cream is to be transferred to the electronic component 520 by using the transfer unit 510 having the inclined pan surface, the sucking nozzle 514 usually has a sucking tip portion 514a formed of a metal and the rear face of the electronic component 520 is inclined. Therefore, a clearance is generated between the sucking tip portion 514a and the rear face of the electronic component 520 so that air leaks from the clearance and suction cannot be carried out.

It can be proposed that a component sucking property can be improved by attaching a rubber pad 516 to the sucking tip portion 514a. However, when the solder cream is to be transferred to the electronic component 520 as shown in FIG. 62, for example, the rubber pad 516 is elastically deformed and contracted in the direction of push-in so that a push-in depth cannot be controlled even if the electronic component 520 is pushed in from the surface of the solder cream up to a predetermined depth. Thus, if the solder cream cannot be given to the electronic component necessarily and sufficiently, connection cannot be carried out reliably so that the conduction failures of the electronic component after mounting or mechanical fixing failures might be caused.

The invention has been made in consideration of the conventional circumstances. It is the first object of the invention to provide a viscous fluid transfer apparatus and a transfer method for transferring a viscous fluid to the terminal portion of an electronic component and laminating an electronic component, in order to increase a space efficiency to mount an area array type package component to a circuit board at a high density.

Moreover, it is the second object of the invention to provide an electronic component mounting apparatus and a mounting method of laminating and mounting an electronic component onto a circuit board by using the viscous fluid transfer apparatus and the transfer method.

Furthermore, it is the third object of the invention to provide a semiconductor device capable of carrying out high density mounting as a stack structure having plural stages.

SUMMARY OF THE INVENTION

In order to achieve the objects, a first aspect of the invention is directed to a viscous fluid transfer apparatus for forming a flat viscous fluid transfer surface for transferring a viscous fluid to a connecting terminal of an electronic component. The viscous fluid transfer apparatus includes a transfer unit having a planar pan surface for putting a viscous fluid thereon, a squeegee unit having a planar stirring squeegee for stirring the viscous fluid put on the pan surface, a planar leveling squeegee for uniformly flattening the viscous fluid thus stirred, and a squeegee fixing member serving to separate the squeegees from each other and to fix them in parallel and having both ends rockably supported pivotally above the transfer unit, a transfer unit moving mechanism for reciprocating the transfer unit such that the squeegee is relatively moved along the pan surface of the transfer unit, and a squeegee driving mechanism for rocking the squeegee unit such that the stirring squeegee and the leveling squeegee approach the pan surface on going and returning paths, respectively.

The viscous fluid transfer apparatus rocks the squeegee unit having the stirring squeegee and the leveling squeegee fixed thereto with the reciprocating operation of the transfer unit moving mechanism through the squeegee driving mechanism, and to cause the stirring squeegee and the leveling squeegee to approach the pan surface of the transfer unit on going and returning paths, respectively. Consequently, the stirring squeegee stirs the viscous fluid over the transfer unit on the going path of the transfer unit and the leveling squeegee causes the viscous fluid stirred on the going path to uniformly have a predetermined thickness on the returning path of the transfer unit. As a result, the flat viscous fluid transfer surface is formed on the transfer unit.

A second aspect of the invention is directed to the viscous fluid transfer apparatus, further including a protrusion formed on a pan surface side of both ends in the longitudinal direction of the stirring squeegee, wherein the protrusion scrapes the viscous fluid put on the pan surface toward a central side in a longitudinal direction of the stirring squeegee.

In the viscous fluid transfer apparatus, when the stirring squeegee is relatively moved again after the leveling squeegee is relatively moved, the viscous fluid overflowing from both ends in the longitudinal direction of the leveling squeegee during the relative movement of the leveling squeegee at the last time can be scraped toward the central side in the longitudinal direction of the squeegee through a formed discharge portion. Thus, the viscous fluid can be prevented from overflowing from the pan surface of the transfer unit.

A third aspect of the invention is directed to the viscous fluid transfer apparatus, wherein the protrusion of the stirring squeegee has a taper face inclined in such a direction as to narrow a passage for the viscous fluid rearward from a front part in a direction of progress of the squeegee within a thickness of the squeegee.

In the viscous fluid transfer apparatus, the protrusion of the stirring squeegee has the taper face for reducing the flow of the viscous fluid. Consequently, the viscous fluid can be scraped toward the central side in the longitudinal direction of the squeegee along the taper face by the relative movement of the stirring squeegee on the transfer unit and the viscous fluid can overflow from the pan surface of the transfer unit with a simple structure.

A fourth aspect of the invention is directed to the viscous fluid transfer apparatus, further including an intermediate protrusion formed between the protrusions on both ends of the stirring squeegee, wherein the intermediate protrusion forms the viscous fluid put on the pan surface like a band.

In the viscous fluid transfer apparatus, the intermediate protrusion is formed between the protrusions. Consequently, when the stirring squeegee is relatively moved over the transfer unit, the viscous fluid is partially scraped by the intermediate protrusion. As a result, the viscous fluid is formed like a band over the transfer unit. Consequently, the viscous fluid is scraped from the lower surface of the transfer unit so that the stirring effect can be enhanced. When the next leveling squeegee is relatively moved, the viscous fluid formed like a band is flattened to have a uniform thickness so that an excellent viscous fluid transfer surface can always be obtained.

A fifth aspect of the invention is directed to the viscous fluid transfer apparatus, wherein the intermediate protrusion has a taper face inclined in such a direction as to narrow the passage for the viscous fluid rearward from the front part in the direction of progress of the squeegee within the thickness of the squeegee.

In the viscous fluid transfer apparatus, the intermediate protrusion has the taper face inclined in such a direction as to narrow the passage for the viscous fluid. Consequently, the viscous fluid is scraped along the taper face during the relative movement of the stirring squeegee so that the viscous fluid can be prevented from overflowing from the pan surface of the transfer unit.

A sixth aspect of the invention is directed to the viscous fluid transfer apparatus, wherein a concave sectional curved portion and a convex sectional curved portion are sequentially formed on the pan surface side of the leveling squeegee from the front part in the direction of progress of the squeegee.

In the viscous fluid transfer apparatus, when the leveling squeegee is relatively moved, the viscous fluid on the transfer unit is pressurized and extended in the tip portion of the convex sectional curved portion, and furthermore, the excessive viscous fluid is rolled in the concave sectional curved portion and is returned in the direction of progress of the squeegee. Consequently, it is possible to prevent the viscous fluid from being transmitted toward the upper part of the squeegee.

A seventh aspect of the invention is directed to the viscous fluid transfer apparatus, wherein a tip on the pan surface side of the leveling squeegee is formed to have a V-shaped section.

In the viscous fluid transfer apparatus, the tip on the pan surface side of the leveling squeegee is formed to have a V section which can easily be processed. Consequently, the shape of the tip portion of the squeegee can be simplified to reduce the manufacturing cost of the squeegee itself.

An eighth aspect of the invention is directed to the viscous fluid transfer apparatus, further including a corner portion formed in the middle of a inclined surface on a part in a direction of progress of the leveling squeegee, wherein the corner portion is protruded outward and formed over a longitudinal direction of the leveling squeegee, and wherein a section of the corner portion is an obtuse angle.

In the viscous fluid transfer apparatus, the corner portion is formed in the middle of the inclined surface of the leveling squeegee. Consequently, even if the viscous fluid is transmitted upward from the tip portion of the squeegee during the relative movement of the leveling squeegee, it falls down and is returned at the formed corner portion. Consequently, the viscous fluid can be prevented from excessively sticking to the squeegee.

A ninth aspect of the invention is directed to the viscous fluid transfer apparatus, further including a pressure generating member provided in the longitudinal direction of the leveling squeegee in the vicinity of a tip on the pan surface side at the front part in the direction of progress of the squeegee, wherein the pressure generating member forms a narrow path through which the viscous fluid flows between the pan surface and the pressure generating member, while the squeegee is moving.

In the viscous fluid transfer apparatus, the pressure generating member is provided in the vicinity of the tip on the pan surface side at the front part in the direction of progress of the leveling squeegee. Consequently, the narrow path is formed between the pressure generating member and the pan surface. Therefore, the viscous fluid flowing between the pressure generating member and the pan surface is maintained in a high pressure state. Consequently, even if a squeegee speed is high, the viscous fluid can be stably put on the pan surface in a predetermined thickness.

A tenth aspect of the invention is directed to the viscous fluid transfer apparatus, wherein a length of the stirring squeegee is equal to or greater than a scraping width of the leveling squeegee.

In the viscous fluid transfer apparatus, the stirring squeegee has a length which is equal to or greater than the scraping width of the leveling squeegee. Consequently, when the stirring squeegee is relatively moved over the transfer unit, a scraping track can be completely scraped by the leveling squeegee and the viscous fluid can be stirred without overflowing from the transfer unit.

An eleventh aspect of the invention is directed to the viscous fluid transfer apparatus, further including a stepped portion provided on the pan surface of the transfer unit at both ends in a direction of delivery of the leveling squeegee in a direction of the movement of the squeegee, wherein the stepped portion is protruded from the pan surface by a predetermined height to support both ends of the leveling squeegee in hanging down.

In the viscous fluid transfer apparatus, the stepped portion protruded from the pan surface of the transfer unit by a predetermined height is provided. Consequently, both ends of the leveling squeegee are supported in hanging down so that a clearance for the height of the stepped portion is generated together with the pan surface. Consequently, the viscous fluid having a desirable thickness can be put on the transfer unit by setting the height of the stepped portion to be a desirable height.

A twelfth aspect of the invention is directed to the viscous fluid transfer apparatus, further including a stepped portion provided on the pan surface side at both ends in the longitudinal direction of the leveling squeegee, wherein the stepped portion is protruded by a predetermined height.

In the viscous fluid transfer apparatus, the stepped portion protruded by a predetermined height is provided on both ends in the longitudinal direction of the leveling squeegee. Consequently, when the leveling squeegee is pushed against the transfer unit, the stepped portion on both ends of the squeegee contacts on the pan surface of the transfer unit so that a clearance for the height of the stepped portion is generated together with the pan surface in a region other than both ends of the squeegee. Therefore, the viscous fluid having a desirable thickness can be put on the transfer unit by setting the height of the stepped portion to be a desirable height.

A thirteenth aspect of the invention is directed to the viscous fluid transfer apparatus, wherein the squeegee driving mechanism includes a rocking arm having one of ends fixed to a rocking center shaft of the squeegee fixing member and the other end connected to a horizontal driving mechanism for rocking the squeegee fixing member, and an arm stopper for contacting on the rocking arm to control a rocking angle of the rocking arm.

In the viscous fluid transfer apparatus, the rocking arm has one of ends fixed to the rocking center shaft of the squeegee fixing member and the other end connected to a horizontal driving mechanism for rocking the squeegee fixing member. Consequently, the squeegee fixing member can be rocked around the rocking center shaft. Thus, the stirring squeegee and the leveling squeegee can be caused to alternately approach the transfer unit. Moreover, the arm stopper is provided to contact on the rocking arm at a predetermined rocking angle. Therefore, the rocking angle of the rocking arm can be controlled and the contact position of the arm stopper on the rocking arm can be regulated so that the heights of the squeegee and the transfer unit surface can be controlled finely.

A fourteenth aspect of the invention is directed to the viscous fluid transfer apparatus further including, a V block holding the squeegee fixing member on the end the of the squeegee fixing member, and a table having a projection and supporting the squeegee fixing member on the other end side of the squeegee fixing member by the projection, wherein the squeegee fixing member including a cylindrical pin in an axial direction to one of end side in a longitudinal direction of the squeegee fixing member, and an engagement portion having a key groove parallel with the axial direction is provided on the other end side of the squeegee fixing member, wherein the projection engaged with the key groove, and wherein the squeegee unit is supported removably by the V block, the table and the squeegee fixing member.

In the viscous fluid transfer apparatus, the squeegee fixing member has the pin connected to one of end sides in the longitudinal direction and the engagement portion having the key groove provided on the other end side. Consequently, the squeegee fixing member has one of the end sides thereof held by the V block and the other end supported on the formed table of the projection, thereby supporting the squeegee unit. Therefore, the squeegee unit can be removably supported and the squeegee fixing member can be prevented from being twisted, thereby enhancing the reproducibility of the attachment position. Accordingly, even if the squeegee unit is removed when cleaning the squeegee unit, it can be easily attached to an accurate position again so that maintenance can be enhanced.

A fifteenth aspect of the invention is directed to a viscous fluid transfer apparatus for forming a flat viscous fluid transfer surface for transferring a viscous fluid to a connecting terminal of an electronic component, including a belt conveyer having a planar belt surface on which the viscous fluid is to be put, a squeegee for uniformly flattening the viscous fluid put on the belt surface by a delivery operation of the belt conveyer, and a stirring mechanism provided in a front stage of the squeegee in a direction of delivery of the belt conveyer and serving to stir the viscous fluid on the belt surface.

In the viscous fluid transfer apparatus, after the viscous fluid put on the belt surface of the belt conveyer is stirred by the stirring mechanism, it is uniformly flattened over the belt surface through the squeegee with the delivery operation of the belt conveyer. Therefore, the viscous fluid transfer surface can be formed continuously. Consequently, a new viscous fluid transfer surface can always be exposed continuously.

A sixteenth aspect of the invention is directed to a viscous fluid transfer method of forming a flat viscous fluid transfer surface by a squeegee and immersing a terminal portion of an electronic component in the viscous fluid transfer surface, thereby transferring a viscous fluid to the electronic component, wherein the viscous fluid is put on a transfer unit having a flat pan surface, a plate-shaped stirring squeegee is relatively moved with respect to the pan surface in a forward direction, thereby stirring the viscous fluid, and a plate-shaped leveling squeegee is then moved relatively with respect to the pan surface in a reverse direction, thereby uniformly flattening the stirred viscous fluid on the transfer unit to form a viscous fluid transfer surface.

In the viscous fluid transfer method, the viscous fluid put on the transfer unit is stirred by relatively moving the stirring squeegee over the pan surface in a forward direction and the viscous fluid thus stirred is then flattened uniformly by relatively moving the leveling squeegee over the pan surface in a reverse direction, thereby forming a flat viscous fluid transfer surface, and the terminal portion of the electronic component is immersed in the viscous fluid transfer surface to transfer the viscous fluid to the electronic component. By relatively moving the two squeegees alternately, thus, the flat viscous fluid transfer surface can be formed stably and the viscous fluid can be uniformly transferred to the terminal portion of the electronic component.

A seventeenth aspect of the invention is directed to the viscous fluid transfer method, wherein when the leveling squeegee is relatively moved and the stirring squeegee is then moved relatively again in a forward direction, the viscous fluid overflowing from both ends in a longitudinal direction of the leveling squeegee during the relative movement of the leveling squeegee is scraped toward a central side in the longitudinal direction of the squeegee during the relative movement of the stirring squeegee.

In the viscous fluid transfer method, the viscous fluid overflowing from both ends in the longitudinal direction of the leveling squeegee is scraped toward the central side in the longitudinal direction of the squeegee during the relative movement of the stirring squeegee. Consequently, the viscous fluid can be prevented from overflowing from the transfer unit and the stirring squeegee and the leveling squeegee can be relatively moved continuously without causing the viscous fluid to overflow from the transfer unit.

An eighteenth aspect of the invention is directed to the viscous fluid transfer method, wherein a thickness of the viscous fluid transfer surface to be formed on the transfer unit is set by regulating a height of a rise from the pan surface of the transfer unit of the leveling squeegee.

In the viscous fluid transfer method, the thickness of the viscous fluid transfer surface to be formed on the transfer unit can be optionally set by regulating a rising height from the pan surface of the transfer unit of the leveling squeegee.

A nineteenth aspect of the invention is directed to the viscous fluid transfer method, wherein the height of the rise from the pan surface is regulated by causing the leveling squeegee to contact on the pan surface of the transfer unit over a whole width and setting a position of the contact to be a reference height.

In the viscous fluid transfer method, first of all, the leveling squeegee is caused to contact on the pan surface of the transfer unit over the whole width, thereby holding the leveling squeegee in parallel with the pan surface. Then, the position of the contact is set to be the reference height and the leveling squeegee is raised by a predetermined height from the reference height, thereby regulating the rising height from the pan surface. Consequently, the degree of parallelism of the leveling squeegee and the pan surface can be increased so that the rising height can be regulated with a high degree of parallelism maintained. Accordingly, the thickness of the viscous fluid transfer surface can be made uniform with high precision.

A twentieth aspect of the invention is directed to the viscous fluid transfer method, wherein the thickness of the viscous fluid transfer surface is set by a height of a stepped portion provided on the pan surface side on both ends in the longitudinal direction of the leveling squeegee.

In the viscous fluid transfer method, when the protrusion height of the stepped portion provided on both ends in the longitudinal direction of the leveling squeegee is set to be a predetermined height to cause the stepped portion of the leveling squeegee to contact on the pan surface of the transfer unit, the clearance generated between the leveling squeegee and the pan surface in a region other than both ends of the squeegee is set corresponding to the protrusion height of the stepped portion and the thickness of the formed viscous fluid transfer surface is set. Consequently, the thickness of the height of the stepped portion provided in the leveling squeegee is automatically set without requiring a regulating work.

A twenty-first aspect of the invention is directed to a viscous fluid transfer method of forming a flat viscous fluid transfer surface by a squeegee and immersing a terminal portion of an electronic component in the viscous fluid transfer surface, thereby transferring a viscous fluid to the electronic component, wherein the viscous fluid is stirred and put on a belt surface of a belt conveyer, and the viscous fluid put on the belt surface is uniformly flattened by a squeegee provided above the belt surface with a delivery operation of the belt conveyor, thereby forming the viscous fluid transfer surface.

In the viscous fluid transfer method, the viscous fluid is stirred and put on the belt surface of the belt conveyer and is uniformly flattened over the belt surface through the squeegee so that the viscous fluid transfer surface can be formed continuously. Consequently, a new viscous fluid transfer surface can always be exposed continuously.

A twenty-second aspect of the invention is directed to an electronic component mounting apparatus for sucking and holding an electronic component and mounting the electronic component into a predetermined mounting position, including an electronic component supply member for mounting a plurality of electronic components to supply a desirable one of the electronic components, a sucking nozzle for removably sucking and holding the electronic component, an attachment head for holding the sucking nozzle to rise and fall freely, a head moving portion for moving the attachment head in a horizontal plane, and the viscous fluid transfer apparatus for uniformly flattening a viscous fluid on a transfer unit to form a flat viscous fluid transfer surface, wherein the electronic component sucked by the electronic component supply member is moved onto the transfer unit of the viscous fluid transfer apparatus and a terminal portion of the electronic component is immersed in the viscous fluid transfer surface by the up-down operation of the attachment head, thereby transferring the viscous fluid to the electronic component.

In the electronic component mounting apparatus, a desirable electronic component is sucked and held through the sucking nozzle from the electronic component supply member mounting a plurality of electronic components thereon, and is positioned on the transfer unit of the viscous fluid transfer apparatus by moving the attachment head through the head moving portion. Then, the attachment head is brought up and down to immerse the terminal portion of the electronic component in the viscous fluid transfer surface on the transfer unit, thereby transferring the viscous fluid to the electronic component. Consequently, the viscous fluid can be uniformly transferred to the electronic component and the electronic component to which the viscous fluid is transferred can be mounted in a predetermined position.

A twenty-third aspect of the invention is directed to the electronic component mounting apparatus, wherein the attachment head includes a rubber pad provided in a tip portion of the sucking nozzle and having a sucking surface which can be inclined freely and can be extended freely in a direction of suction, and a sucking attitude correcting member provided around the rubber pad in which a tip portion has a contact face to contact on a rear face of the electronic component during the suction of the electronic component.

In the electronic component mounting apparatus, the attachment head includes a rubber pad provided in the tip portion of the sucking nozzle and a sucking attitude correcting member provided around the rubber pad. Consequently, when the rubber pad is caused to contact on the rear face of the electronic component to suck the electronic component, the rubber pad is contracted in a sucking direction so that the rear face of the electronic component contacts on the tip portion of the sucking attitude correcting member. Consequently, the contact face of the tip portion of the sucking attitude correcting member is pushed against the rear face of the electronic component so that the sucking attitude of the electronic component is corrected. Then, in the case in which the sucking nozzle is pushed against the inclined surface with the electronic component sucked and a part of the electronic component is separated from the sucking attitude correcting member, the rubber pad is inclined along the inclined surface so that the suction of the electronic component is maintained and the electronic component is not removed from the sucking nozzle. Accordingly, the electronic component can be always sucked and maintained stably.

A twenty-fourth aspect of the invention is directed to the electronic component mounting apparatus, wherein the sucking attitude correcting member is constituted by a pair of rod bodies provided on both sides of the rubber pad.

In the electronic component mounting apparatus, the sucking attitude correcting member has such a structure that a pair of rod bodies are provided on both sides of the rubber pad. Consequently, the sucking attitude of the electronic component can be corrected with a simple structure.

A twenty-fifth aspect of the invention is directed to the electronic component mounting apparatus, wherein the contact face of the sucking attitude correcting member is formed to be inclined from a horizontal plane.

In the electronic component mounting apparatus, the contact face of the sucking attitude correcting member is formed to be inclined from the horizontal plane. Consequently, the electronic component can be inclined at an optional angle to be sucked and held into the sucking nozzle. For example, when the electronic component is to be pushed against the inclined surface or is to be sucked from the inclined surface, the contact face is previously inclined at the inclination angle so that the sucking state of the electronic component can be maintained stably.

A twenty-sixth aspect of the invention is directed to the electronic component mounting apparatus, further including a multi-head having a plurality of attachment heads arranged in parallel, the transfer unit of the viscous fluid transfer apparatus including a pan surface having a greater width than an attachment head arrangement width of the multi-head.

In the electronic component mounting apparatus, the transfer unit of the viscous fluid transfer apparatus includes a pan surface having a greater width than the attachment head arrangement width of the multi-head. Consequently, the electronic component sucked into the attachment head of the multi-head is simultaneously brought up and down by each attachment head so that the viscous fluid can be transferred at a time. Consequently, the efficiency of the transfer of the viscous fluid to the electronic component can be enhanced and a mounting speed can be increased.

A twenty-seventh aspect of the invention is directed to the electronic component mounting apparatus, wherein the transfer unit includes a pan surface having a greater width than a double of the attachment head arrangement width of the multi-head.

In the electronic component mounting apparatus, the transfer unit includes the pan surface having a greater width than a double of the attachment head arrangement width of the multi-head. Consequently, it is possible to obtain a sufficient space for simultaneously bringing each attachment head of the multi-head up and down plural times over the same viscous fluid transfer surface and it is not necessary to form the viscous fluid transfer surface again for each transfer operation. Consequently, the viscous fluid transfer efficiency can be enhanced and the mounting speed can be increased.

A twenty-eighth aspect of the invention is directed to an electronic component mounting method of mounting an electronic component in a predetermined mounting position, including the steps of sucking an electronic component by an attachment head having a sucking nozzle, while uniformly flattening a viscous fluid on a transfer unit having a planar pan surface to form a viscous fluid transfer surface, moving the sucked attachment head of the electronic component to an upper position of the viscous fluid transfer surface, bringing the sucking nozzle down until a terminal portion of the electronic component is immersed in the viscous fluid transfer surface, raising the sucking nozzle after transferring the viscous fluid to the electronic component and moving the attachment head to a predetermined mounting position, and bringing down the sucking nozzle in the mounting position, thereby mounting the electronic component.

In the electronic component mounting method, the electronic component is sucked into the sucking nozzle of the attachment head, while the viscous fluid is uniformly flattened over the transfer unit to form the viscous fluid transfer surface, thereby moving the sucked attachment head of the electronic component to the upper position of the viscous fluid transfer surface. Consequently, the transfer of the viscous fluid is completely prepared. Next, the sucking nozzle is brought down until the terminal portion of the electronic component is immersed in the viscous fluid transfer surface so that the viscous fluid is transferred to the terminal portion, and the sucking nozzle is then raised and the attachment head is moved to the predetermined mounting position. Consequently, the electronic component to which the viscous fluid is transferred is positioned in the upper part of the mounting position. The sucking nozzle is brought down, thereby mounting the electronic component having the terminal portion to which the viscous fluid is transferred.

A twenty-ninth aspect of the invention is directed to the electronic component mounting method, wherein the sucking nozzles of a multi-head having a plurality of attachment heads arranged in parallel are controlled to be brought up and down at the same time.

In the electronic component mounting method, each sucking nozzle of the multi-head having a plurality of attachment heads arranged in parallel is controlled to carry out the up-down operation at the same time. For example, consequently, in the case in which the same kind of electronic components are sucked into each sucking nozzle, the viscous fluid can be transferred at the same time so that the transfer efficiency can be enhanced and the mounting speed can be increased.

A thirtieth aspect of the invention is directed to the electronic component mounting method, wherein a height of the viscous fluid transfer surface of the transfer unit is detected before the viscous fluid is transferred to the electronic component, and an amount of fall of the sucking nozzle of the attachment head is set according to the height thus detected.

In the electronic component mounting method, the height of the viscous fluid transfer surface of the transfer unit is detected before the viscous fluid is transferred to the electronic component so that the amount of fall of the sucking nozzle required before the electronic component comes in contact with the viscous fluid transfer surface is obtained with high precision. Accordingly, the height of the electronic component from the viscous fluid transfer surface can be set with high precision and the viscous fluid can be immersed in the electronic component in a desirable thickness.

A thirty-first aspect of the invention is directed to the electronic component mounting method, wherein the viscous fluid transfer surface having a predetermined thickness is formed on the transfer unit and the terminal portion of the electronic component is pushed to contact on the pan surface of the transfer unit, thereby transferring the viscous fluid having the predetermined thickness to the electronic component.

In the electronic component mounting method, the terminal portion of the electronic component is pushed against the viscous fluid transfer surface formed on the transfer unit in a predetermined thickness to contact on the pan surface. Consequently, the viscous fluid for the height of the viscous fluid transfer surface is transferred from the pan surface to the terminal portion of the electronic component. Accordingly, when the viscous fluid having a thickness suitable for the electronic component is formed on the transfer unit, the viscous fluid can be easily transferred in a proper thickness to the electronic component by a simple push operation without setting the amount of movement of the sucking nozzle with high precision.

A thirty-second aspect of the invention is directed to the electronic component mounting method, wherein the electronic component to which the viscous fluid is transferred is stacked and mounted on a rear face opposite to a mounting surface side of the electronic component which has already been mounted on a circuit board.

In the electronic component mounting method, the electronic component to which the viscous fluid is transferred is stacked and mounted on the rear face opposite to the mounting surface side of the electronic component which has already been mounted on a circuit board. Consequently, the electronic component can be stacked and mounted in the same space in the plane of the circuit board so that the mounting density of the circuit board can be enhanced.

A thirty-third aspect of the invention is directed to the electronic component mounting method, wherein a reference mark for alignment provided on the rear face of the mounted electronic component is detected and a mounting position of the electronic component to be stacked and mounted on the rear face is corrected by setting the detected reference mark as a reference.

In the electronic component mounting method, the reference mark for alignment provided on the rear face of the mounted electronic component is detected and the mounting position or mounting angle of the electronic component is detected. By setting the detected reference mark as a reference to correct the mounting position of the electronic component to be mounted on the rear face, the electronic component can be mounted on the rear face of the mounted electronic component by canceling a shift in the mounting position. Accordingly, the electronic component to be mounted on the rear face of the mounted electronic component can be aligned and stacked with high precision for the mounted electronic component.

A thirty-fourth aspect of the invention is directed to a semiconductor device having a plurality of solder balls arranged as connecting terminals on a mounting surface side, wherein a land for terminal connection is provided in a position corresponding to the connecting terminal of the semiconductor device on a rear face opposite to the mounting surface side.

In the semiconductor device, the land for terminal connection is provided in the position corresponding to the connecting terminal of the semiconductor device on the rear face of the semiconductor device. Consequently, the land of the semiconductor device on the lower stage side and the connecting terminal of the semiconductor device on the upper stage side are connected to each other when the semiconductor device is stacked. Thus, the semiconductor device can be simplified and can be constituted as a stacked structure.

A thirty-fifth aspect of the invention is directed to the semiconductor device, wherein the connecting terminal of the semiconductor device has a solder fixed to a heat-resistant pin.

In the semiconductor device, even if the length of the pin is not equal, the solder absorbs the shortage of the length thereof and is reliably connected to the land. By setting the lower end of the pin to be a plane, moreover, the attitude of the electronic component can be stably fixed without an inclination from the circuit board surface. Even if the solder is exposed to a high temperature in a reflow process carried out again, furthermore, it is maintained to stick around the pin by a surface tension. Therefore, electrodes can be prevented from being short-circuited.

A thirty-sixth aspect of the invention is directed to the semiconductor device, wherein a reference mark for alignment is provided on the rear face opposite to the mounting surface side.

In the semiconductor device, when the semiconductor device is to be stacked and mounted, the connecting terminal of the semiconductor device on the upper stage side can be aligned with the land of the semiconductor device on the lower stage side with high precision. Even if the semiconductor device on the lower stage side is shifted from a predetermined position, the amount of the shift can be cancelled and the semiconductor device can be stacked.

BRIEF DESCRIPTION OF THE DRAWINGS

FIGS. 44(a), (b), and (c) are views illustrating a state in which a solder cream transfer surface is formed on a transfer unit by using the stirring squeegee FIGS. 45(a) and (b) are views showing the shape of a stirring squeegee according to a fifth embodiment.

DETAILED DESCRIPTION OF THE PREFERRED EMBODIMENTS

Preferred embodiments of a viscous fluid transfer apparatus, an electronic component mounting apparatus and a semiconductor device according to the invention will be described below in detail with reference to the drawings.

Figure 1:
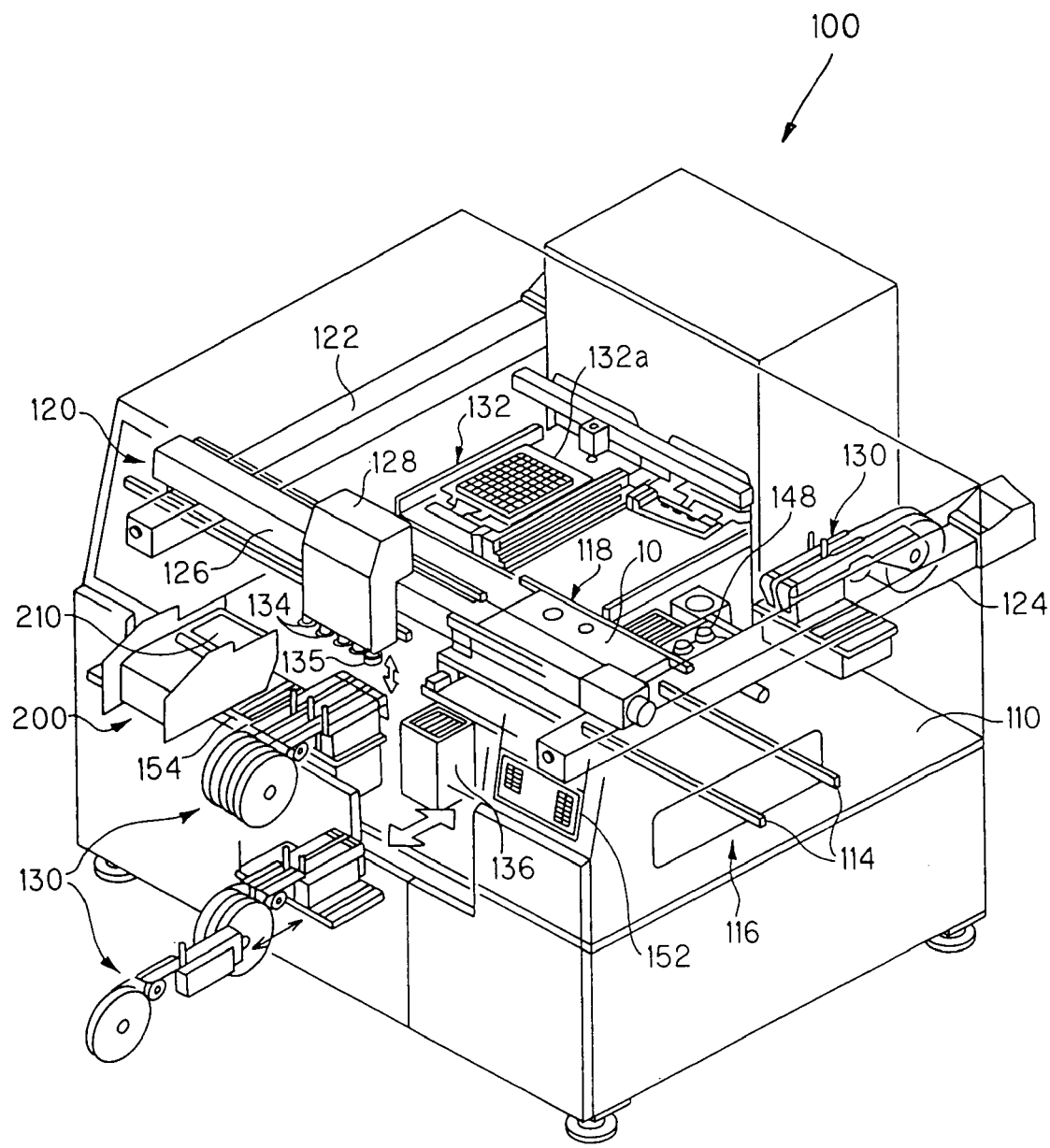
FIG. 1 is a perspective view showing an electronic component mounting apparatus including a viscous fluid transfer apparatus according to the invention.
Figure 2:
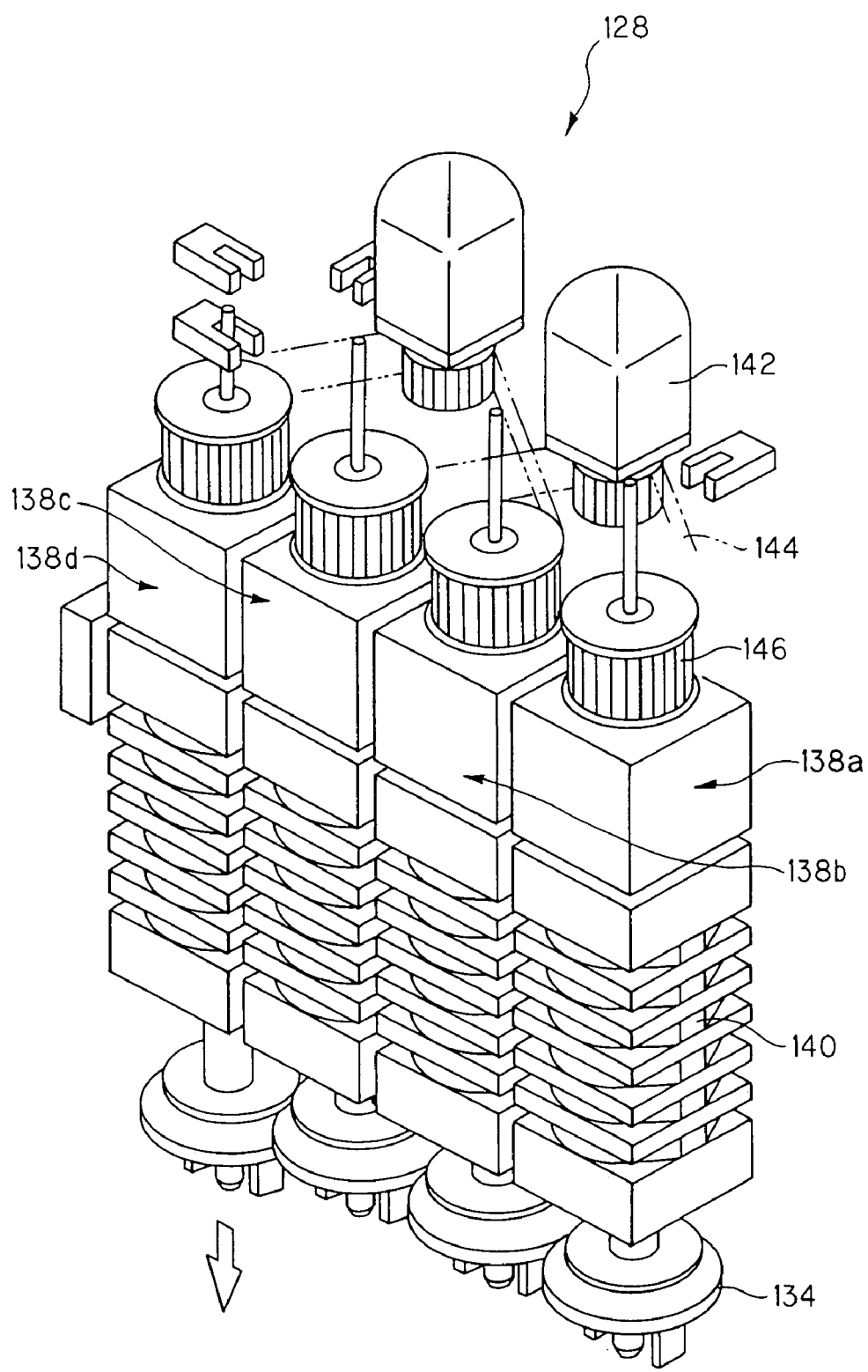
FIG. 2 is an enlarged perspective view showing the transfer head of the electronic component mounting apparatus.
Figure 3:
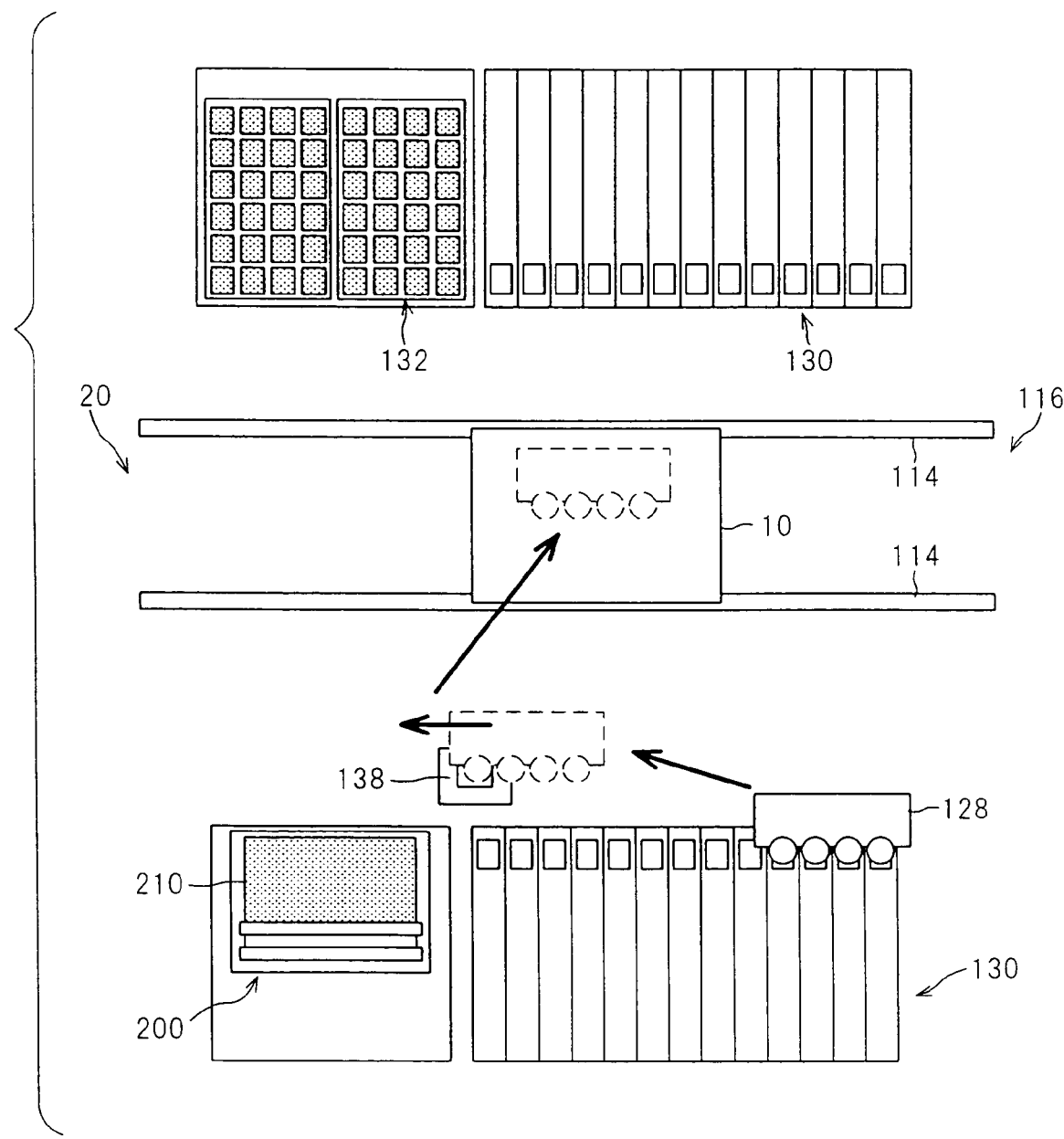
FIG. 3 is a schematic plan view for illustrating the operation of the electronic component mounting apparatus.

FIG. 1 is a perspective view showing an electronic component mounting apparatus including a viscous fluid transfer apparatus (hereinafter referred to as a solder cream transfer apparatus using a solder cream as a viscous fluid) according to the invention. FIG. 2 is an enlarged perspective view showing the transfer head of the electronic component mounting apparatus. FIG. 3 is a schematic plan view for illustrating the operation of the electronic component mounting apparatus.

First of all, the structure of an electronic component mounting apparatus 100 according to the invention will be described.

As shown in FIG. 1, a guide rail 114 for mounting a circuit board 10 is provided on the center of the upper surface of a base 110 of the electronic component mounting apparatus 100, and the circuit board 10 is delivered from a loader portion 116 on one of end sides to an electronic component mounting position 118, and furthermore, from the mounting position 118 to an unloader portion 120 on the other end side through the delivery belt of the guide rail 114.

Both side portions of the upper surface of the upper base 110 provided above the circuit board 10 are provided with Y tables 122 and 124 respectively, and an X table 126 is provided between these two Y tables 122 and 124. Moreover, a transfer head 128 is attached to the X table 126 so that the transfer head 128 can be moved in an X-Y plane.

The transfer head 128 mounted on a head moving portion including the X table 126 and the Y tables 122 and 124 and movable over the X-Y plane (horizontal plane) is constituted such that a desirable electronic component is sucked through a sucking nozzle 134 from a parts feeder 130 for feeding an electronic component such as a resistance chip or a chip capacitor or a parts tray 132 for feeding a comparatively large-sized electronic component such as an IC, for example, an SOP, a GFP or a BGA or a connector and the sucking attitude of the electronic component is detected from a recognizing device 136 and the electronic component can be then attached to the predetermined position of the circuit board 10. Moreover, the transfer head 128 is provided with a recognizing camera 135 such as a CCD camera for detecting the position of the circuit board and a length measuring sensor, which is not shown (the details will be described below).

Such an electronic component mounting operation is controlled based on a preset mounting program by a controller (main controller) which is not shown. Data can be input to the controller through an operation panel 152.

The mounting program serves to carry out a recombination process of a mounting order over NC information input to the electronic component mounting apparatus 100 and having information about an electronic component to be mounted and to convert the recombined data thus created into an instruction configuration for driving the head moving portion or the nozzle of the transfer head. The mounting program is created through the input of an operator by using the NC information recording information about the mounting position of each electronic component and component data registering information about the electrode shape of each electronic component. The controller executes the mounting program thus created so that the electronic component is mounted onto the circuit board.

A large number of parts feeders 130 are arranged on both ends of the guide rail 114 and a tape-shaped component roll accommodating an electronic component such as a resistance chip or a chip capacitor is attached to each of the parts feeders 130.

Moreover, the parts tray 132 can mount two trays 132*a* in total which are elongated in a direction orthogonal to the guide rail 114, and each of the trays 132*a* is so constituted as to slide toward the guide rail 114 side corresponding to the number of components to be fed, thereby maintaining a component take-out position in a Y direction to be a constant position. The electronic component such as a QFP or a BGA is mounted on the ray 132*a*.

The recognizing device 136 is provided in the side portion of the guide rail 114 and includes an attitude recognizing camera for detecting the two-dimensional shift (suction attitude) of an electronic component sucked into the sucking nozzle 134 and for carrying out correction on the transfer head 128 side to cancel the shift. The attitude recognizing camera is provided in a bottom portion on the inside of the recognizing device 136 and the internal surface of the housing of the recognizing device 136 provided around the attitude recognizing camera is provided with a plurality of multi-stage light emitting elements such as a light emitting diode LED for illuminating the electronic component sucked into the sucking nozzle 134. Consequently, light can be irradiated on the mounting surface of the electronic component at a desirable angle and an image can be picked up at a proper illumination angle according to the type of the component. The pick-up data thus obtained are subjected to a recognition process by the controller, and the central position or the electrode position of the sucked electronic component is recognized and is used for correction data on a mounting position and a rotation angle.

The transfer head 128 is constituted as a multiple multi-head having a plurality of (four in the embodiment) attachment heads (a first attachment head 138*a*, a second attachment head 138*b*, a third attachment head 138*c* and a fourth attachment head 138*d*) coupled in a transverse direction. The four attachment heads 138*a*, 138*b*, 138*c* and 138*d* have the same structure and include the sucking nozzle 134, an actuator 140, a motor 142, a timing belt 144 and a pulley 146. The actuator 140 causes the sucking nozzle 134 to carry out a vertical operation. And the three members, that are the motor 142, the timing belt 144, and the pulley 146, cause the sucking nozzle 134 to carry out a θ rotation.

The sucking nozzle 134 of each attachment head is exchangeable and other sucking nozzles, that are substitutive nozzles, are previously accommodated in a nozzle stocker 148 provided on the base 110 of the electronic component mounting apparatus 100. Examples of the sucking nozzle 134 include an S size nozzle sucking a very small chip component having a size of approximately 1.0×0.5 mm and an M size nozzle sucking a QFP of 18 mm square which are selectively used depending on the type of the electronic component to be attached.

Moreover, the attachment heads 138*a*, 138*b*, 138*c* and 138*d* bring down the sucking nozzle 134 from the X-Y plane in a vertical direction (a Z direction) when the electronic component is to be sucked from the parts feeder 130 or the parts tray 132 through the sucking nozzle 134, when the electronic component is to be attached to the predetermined position of the circuit board 10 and when the solder cream is to be transferred from the transfer unit 210. Furthermore, the sucking nozzle is properly exchanged to carry out an attachment operation depending on the type of the electronic component.

The electronic component mounting apparatus 100 according to the invention comprises a solder cream transfer apparatus 200 for transferring the solder cream to the connecting terminal of the electronic component such as a BGA, and the solder cream transfer apparatus 200 is attached to a parts feeder fixing table 154 and the solder cream is put on the transfer unit 210.

In this specification, the solder cream implies a paste-shaped solder mixing a solder powder with a flux having a high viscosity.

Next, the schematic operation of the electronic component mounting apparatus 100 having the above-mentioned structure will be described.

As shown in FIG. 3, when the circuit board 10 delivered from the loader portion 116 of the guide rail 114 is delivered to the predetermined mounting position 118, the transfer head 128 is moved in the X-Y plane by the head moving portion so that a desirable electronic component is sucked from the parts feeder 130 or the parts tray 132 based on a mounting program. In the drawing, a state in which the electronic component is sucked from the parts feeder 130 is shown. Then, the transfer head 128 is moved over the attitude recognizing camera of the recognizing device 136. The recognizing device 136 recognizes the sucking attitude of the electronic component based on component recognition data to carry out an operation for correcting a sucking attitude.

The correcting operation is carried out by causing the head moving portion to have a shift in X and Y directions as an offset or rotating the sucking nozzle 134 with a shift for a rotation component through a motor 142. After the correcting operation is carried out, the sucked electronic component is attached to the predetermined position of the circuit board 10.

By repeating the suction of the electronic component and the operation for attachment to the circuit board 10, the electronic component is completely mounted on the circuit board 10. When the mounting is completed, the circuit board 10 is delivered from the mounting position 118 to the unloader portion 120, while a new circuit board is delivered into the loader portion 116 so that the operation described above is repeated.

Figure 4A:
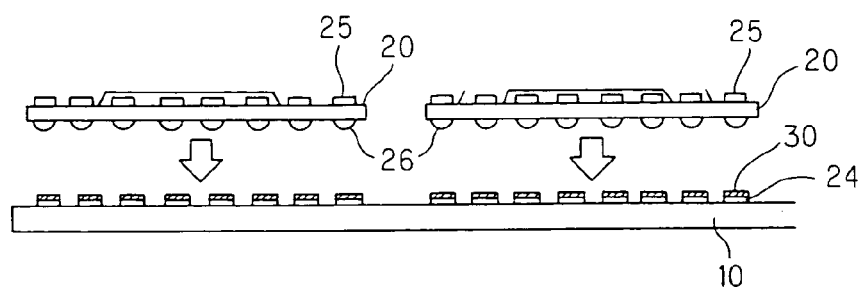
FIGS. 4(a), (b), and (c) are views showing a three-dimensional mounting method for mounting an electronic component in a multi-stage.
Figure 4B:
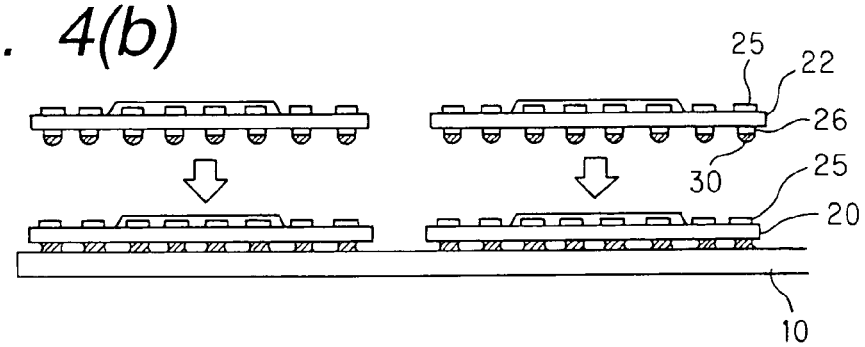
Figure 4C:
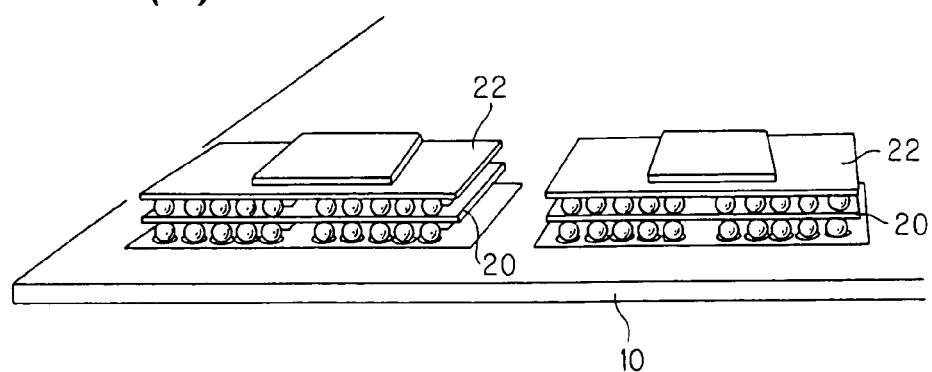

While the electronic component is thus mounted on the circuit board 10, the electronic component mounting apparatus according to the invention can carry out a three-dimensional mounting method of mounting a plurality of electronic components such as ICs (semiconductor devices) in a multi-stage as shown in FIGS. 4(*a*), (*b*), and (*c*) in order to further enhance a mounting density. In the three-dimensional mounting method, first of all, the solder cream 30 is mask printed on the land 24 formed in the circuit board 10. Then, the electronic component (a BGA as an example of the drawing) 20 having the land 25 formed on a rear face opposite to the mounting surface side is aligned and mounted on the solder cream 30 transferred onto each land 24 such that the terminal portion (solder ball 26) on the mounting surface side and the land 24 on the circuit board 10 are connected to each other (FIG. 4(a)). Furthermore, the electronic component 22 having the solder cream 30 in a predetermined amount transferred to the solder ball 26 is aligned and mounted such that the solder ball of the electronic component 22 is connected to the rear face side land 25 of the mounted electronic component 20 (FIG. 4(b)). Consequently, it is possible to obtain a three-dimensional stack structure in which the electronic components 20 and 22 are mounted onto the same space on the circuit board 10 (FIG. 4(c)). Thus, the mounting density can be enhanced.

The print of the solder cream 30 onto the land 24 on the circuit board 10 can also be omitted by transferring the solder cream 30 onto the solder ball 26 side of the electronic component 20 and then carrying out the mounting.

Next, the structure of each portion of the solder cream transfer apparatus 200 for implementing the three-dimensional mounting method will be sequentially described in detail.

Figure 5:
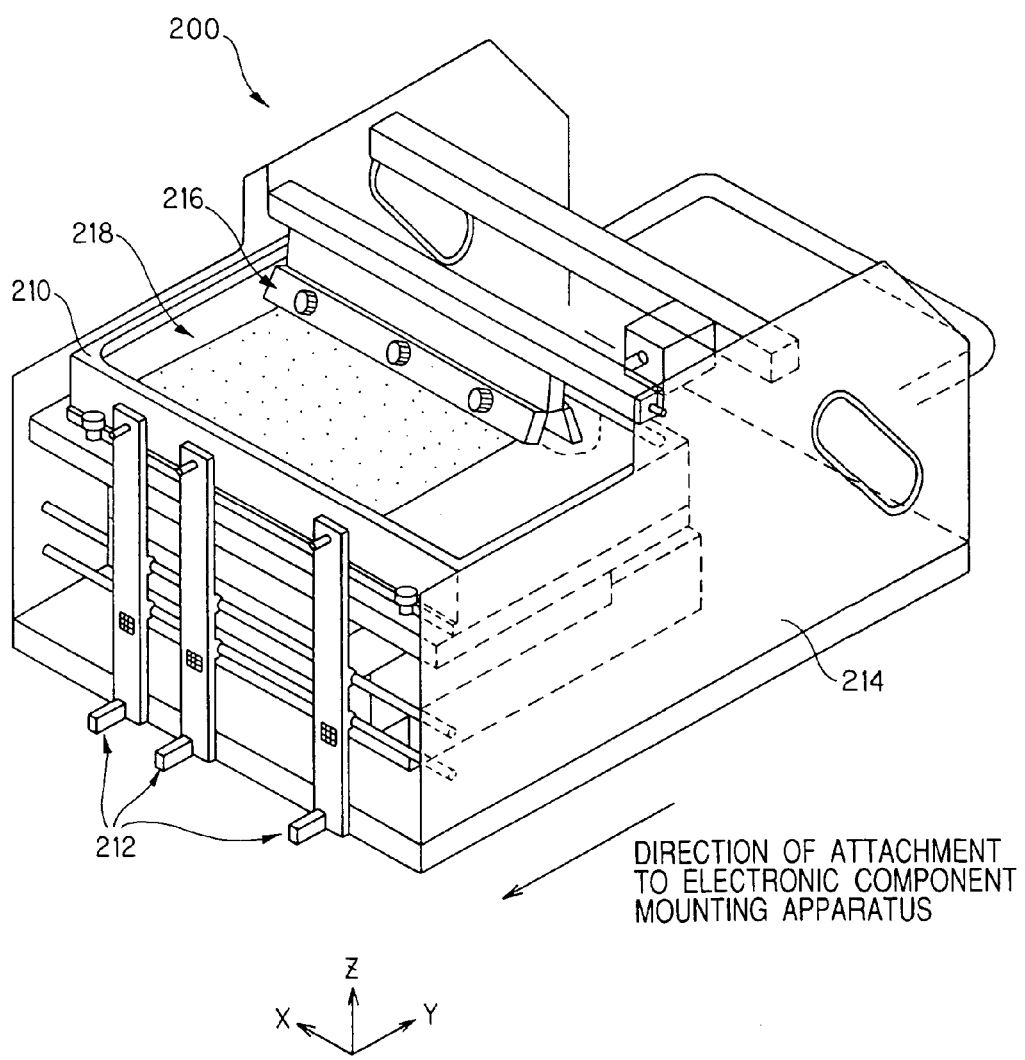
FIG. 5 is a perspective view showing the schematic structure of a solder cream transfer apparatus attached to the electronic component mounting apparatus and serving to transfer a solder cream to the electronic component.
Figure 6:
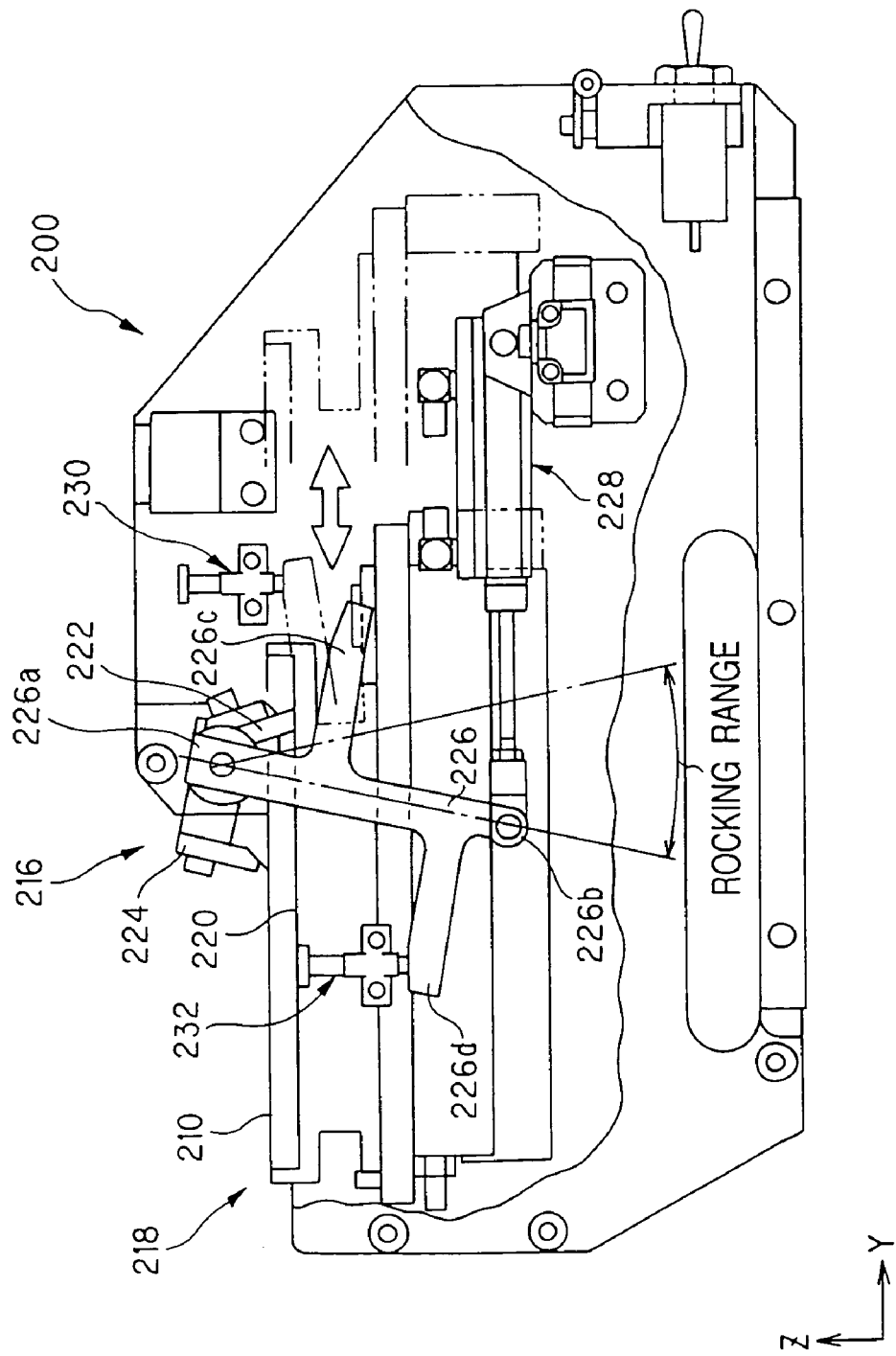
FIG. 6 is a side view showing the solder cream transfer apparatus, a part of which is taken away.

FIG. 5 is a perspective view showing the schematic structure of the solder cream transfer apparatus 200 attached to the electronic component mounting apparatus 100 and serving to transfer a solder cream to an electronic component and FIG. 6 is a side view showing the solder cream transfer apparatus 200, a part of which is taken away.

As shown in FIGS. 5 and 6, the solder cream transfer apparatus 200 includes a housing 214 and a transfer unit 218. In the housing 214, an engagement tool 212 is provided on the attachment direction side to an electronic component mounting apparatus 100. The engagement tool 212 is to be attached to a parts feeder fixing table 154 of the electronic component mounting apparatus 100. Moreover, a transfer transfer unit 210 is accommodated in the housing 214, The transfer unit 218 includes the transfer unit 210 and a squeegee unit 216.

The transfer unit 218 includes the transfer unit 210 exposed to the upper surface side of the solder cream transfer apparatus 200 and having a planar pan surface 220 forming the transfer surface of the solder cream, a squeegee unit 216 provided slidably in contact with the upper part of the pan surface 220 of the transfer unit 210 and serving to flatly put a solder cream on the transfer unit 210 by alternately using two squeegees of a stirring squeegee 222 and a leveling squeegee 224, and a transfer unit moving mechanism (not shown) for reciprocating the transfer unit 210 in the Y direction of the drawing such that each of the squeegees 222 and 224 is relatively moved over the pan surface 220, and furthermore, a rocking arm 226 having one end side 226a fixed to the attachment side of the stirring squeegee 222 and the leveling squeegee 224 and the other end side 226b slidably supported and having rocking control arms 226c and 226d for controlling a rocking angle, a horizontal driving mechanism 228 for rocking the rocking arm 226 by reciprocating the other end side 226b of the rocking arm 226 in the Y direction, and arm stoppers 230 and 232 contacting on the rocking control arms 226c and 226d of the rocking arm 226 to control the rocking angle of the rocking arm 226.

The squeegee unit forms a flat solder cream transfer surface and stirs a solder cream which can easily become dry and hard, thereby maintaining a uniform state in which the solder cream transfer surface always has a proper viscosity.

Figure 7:
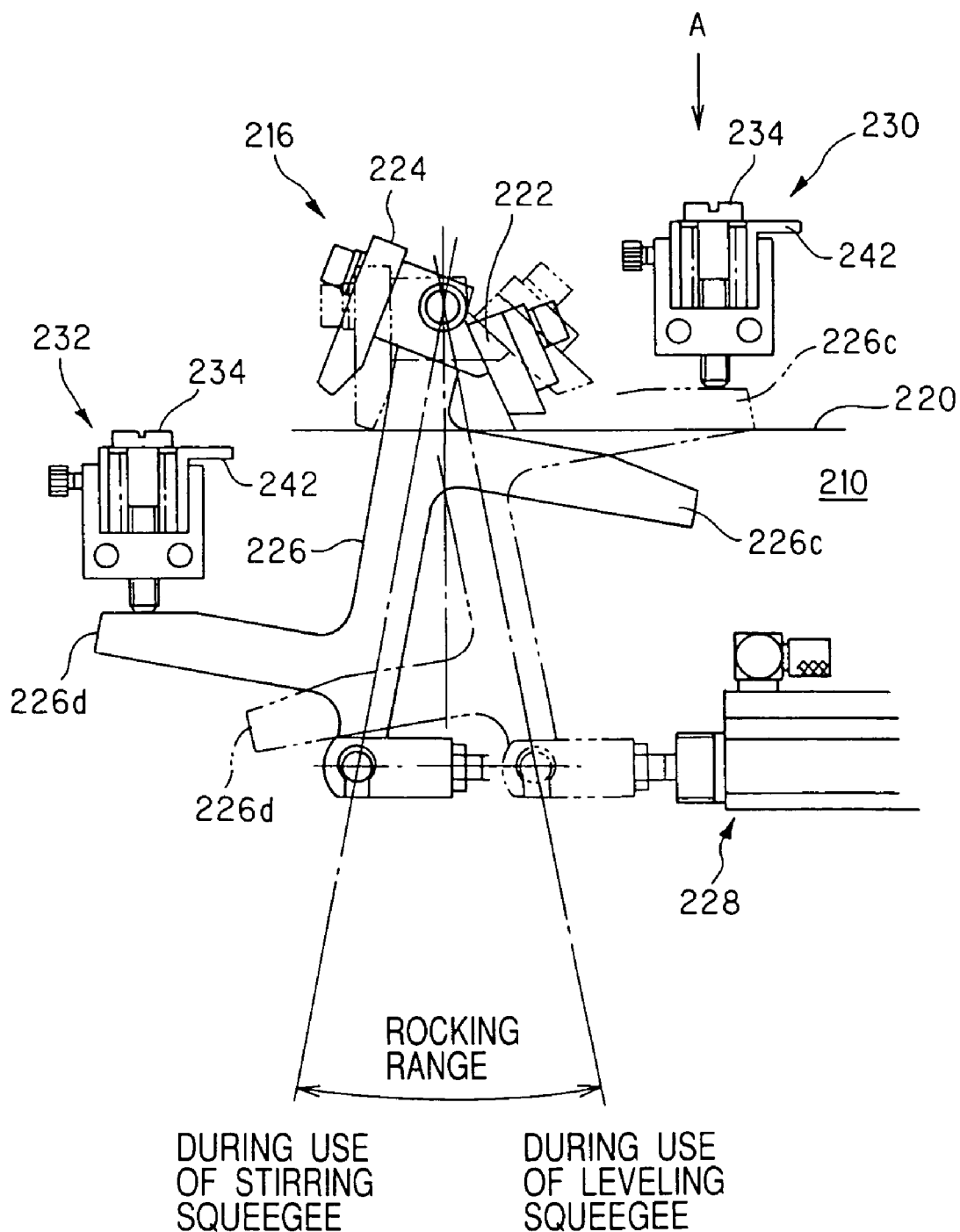
FIG. 7 is an enlarged view showing the positional relationship between an arm for controlling the rocking motion of a rocking arm, a stirring squeegee and a leveling squeegee, and an arm stopper.

FIG. 7 shows the enlarged positional relationship between the rocking control arms 226c and 226d of the rocking arm 226, the stirring squeegee 222 and the leveling squeegee 224, and the arm stoppers 230 and 232.

As shown in FIG. 7, in the rocking arm 226, two states of the use of the stirring squeegee 222 shown in a solid line of the drawing and the use of the leveling squeegee 224 shown in a two-dotted line are selectively set with the end 226a on the squeegee unit 216 side of the rocking arm 226 to be a rocking center. More specifically, the rocking control arm 226d of the rocking arm 226 contacts on the tip portion of a screw 234 of the arm stopper 232 in the state of the use of the stirring squeegee 222, and the rocking control arm 226c of the rocking arm 226 contacts on the tip portion of the screw 234 of the arm stopper 230 to control a rocking angle in the state of the use of the leveling squeegee 224. The rocking arm 226 is provided on either side of the transfer unit 210, and each of the squeegees 222 and 224 is rocked according to the movement of the rocking arm 226 on the other side.

Figure 8:
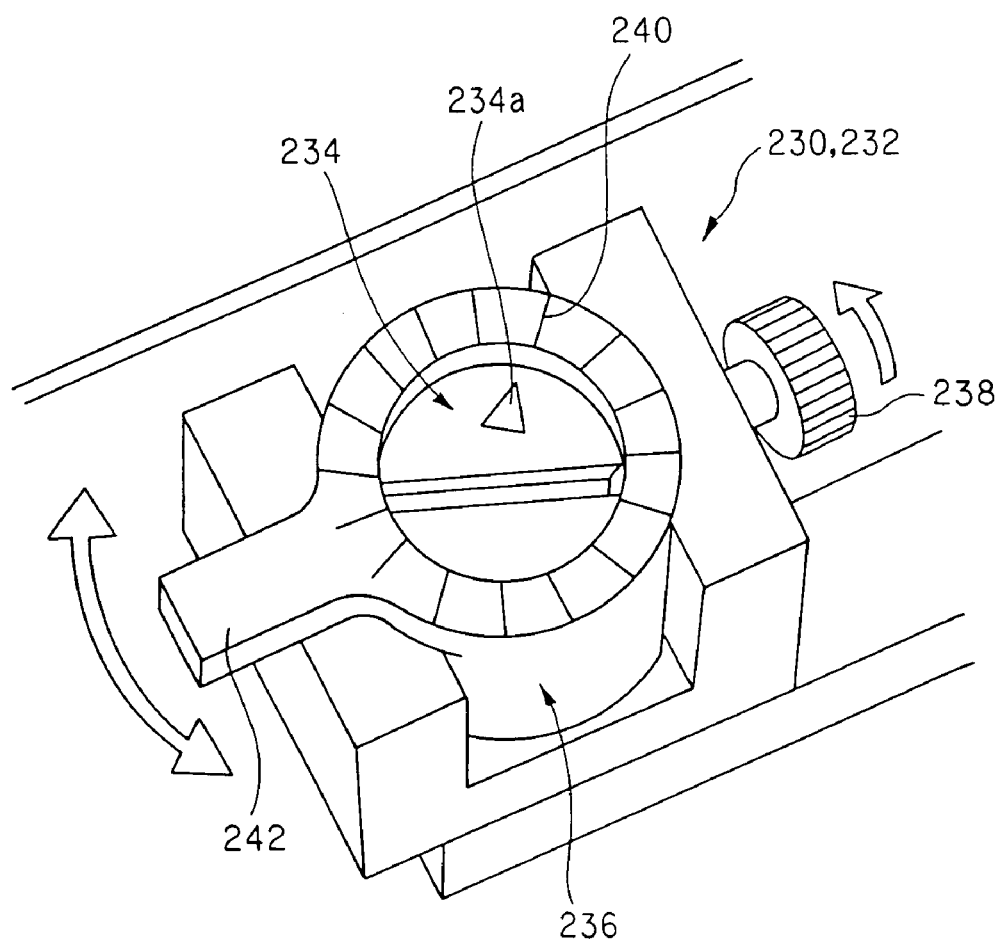
FIG. 8 is a view seen in the direction of an arrow A of FIG. 7.

The arm stoppers 230 and 232 have an arrow 234a provided on the pan portion of the screw 234 through marking as shown in a view of FIG. 8 seen in the direction of an arrow A of FIG. 7, while a cylindrical ring 236 is provided around the screw 234 to be fastened with a fixing screw 238. The upper end face of the cylindrical ring 236 is provided with a graduation 240 corresponding to the arrow 234a and a part of a side surface is provided with a rotation regulating lever 242. The height of the screw 234 is set such that the stirring squeegee 222 and the leveling squeegee 224 are fixed to the pan surface 220 of the transfer unit 210 with predetermined clearances respectively.

At this time, the height is regulated as follows. The rotation regulating lever 242 is rotated such that any graduation 240 of the cylindrical ring 23 is coincident with the arrow 234a of the screw 234 with the fixing screw 238 loosened, and the fixing screw 238 is loosened to fix the cylindrical ring 236 in a position where the coincidence is carried out. Then, the screw 234 is rotated by referring to the graduation 240 through a tool such as a screw driver so that the height can be controlled with high precision by a simple structure. In the embodiment, one graduation is set to 15 degrees. When the screw 234 is rotated clockwise by one graduation, the clearances between the squeegees 222 and 224 and the pan surface 220 are set to be enlarged by 0.005 mm.

Next, the squeegee unit 216 will be described.

In the solder cream transfer apparatus 200, a cleaning work is required for the squeegee unit 216 and portions to be cleaned are collectively constituted removably, thereby enhancing a maintenance property. Moreover, the reproducibility of a position where each member is to be provided for recombination can be implemented with very high precision.

Figure 9:
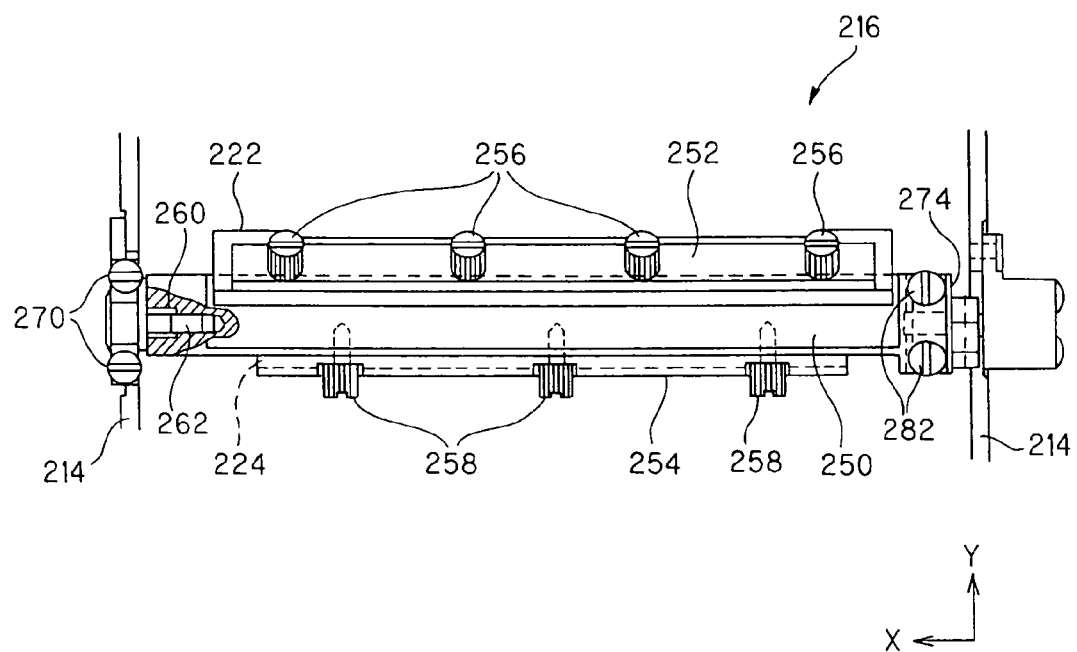
FIG. 9 is a top view showing a squeegee unit.
Figure 10:
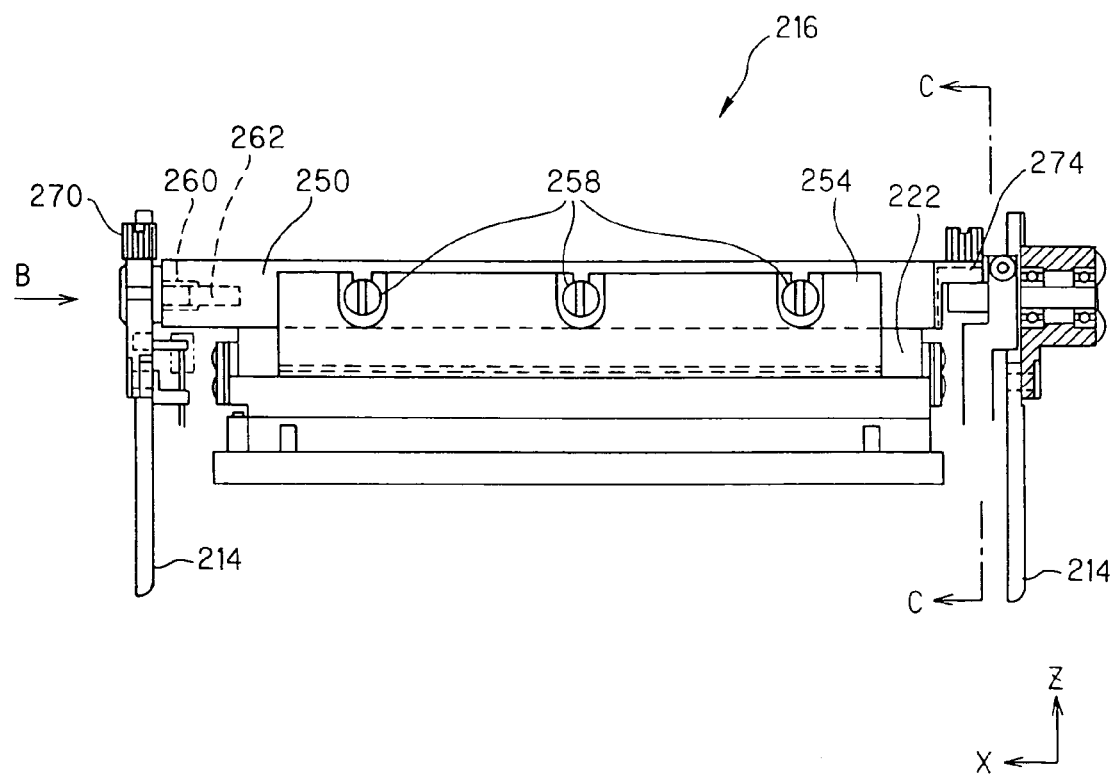
FIG. 10 is a side view showing the solder cream transfer apparatus seen from the side of attachment to the electronic component mounting apparatus.
Figure 11:
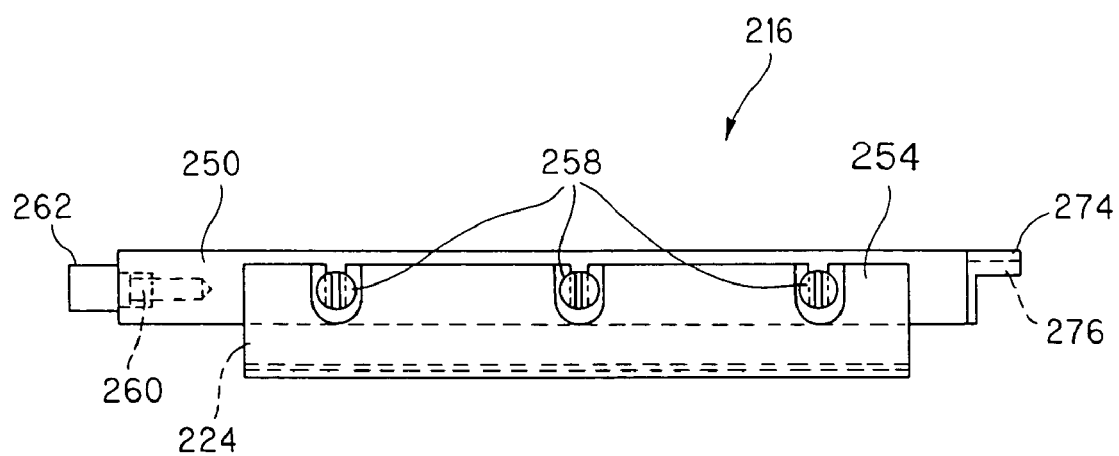
FIG. 11 is a side view showing the squeegee unit.

FIG. 9 is a top view showing the squeegee unit 216, FIG. 10 is a side view showing the solder cream transfer apparatus 200 seen from the attachment side to the electronic component mounting apparatus 100, and FIG. 11 is a side view showing the squeegee unit.

As shown in FIGS. 9, 10, and 11, the squeegee unit 216 is mainly constituted by the stirring squeegee 222, the leveling squeegee 224, and a rod-shaped squeegee fixing member 250 fixed in parallel with the squeegees 222 and 224 separated from each other and having both ends supported on the housing 214. The squeegees 222 and 224 are formed to have almost planar shapes and are interposed between the fixed plates 252 and 254 and the squeegee fixing member 250 and are fixed with screws 256 and 258, respectively. The squeegee fixing member 250 has a squeegee attachment surface previously cut to have a predetermined squeegee inclination angle when the squeegee is attached to the squeegee attachment surface.

Figure 12A:
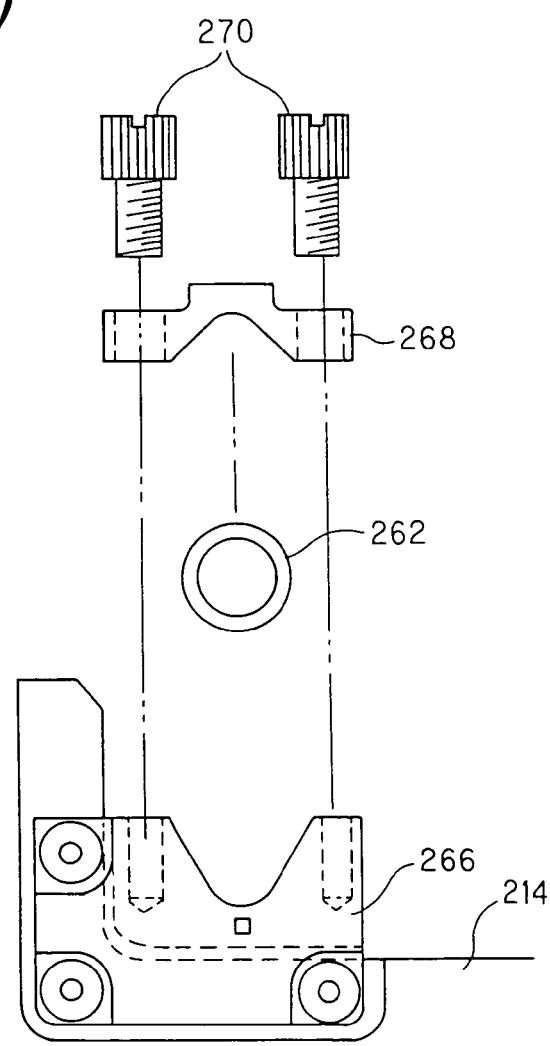
FIG. 12(a) is an exploded view showing the support structure of a buried pin seen in a direction of B in FIG. 10
Figure 12B:
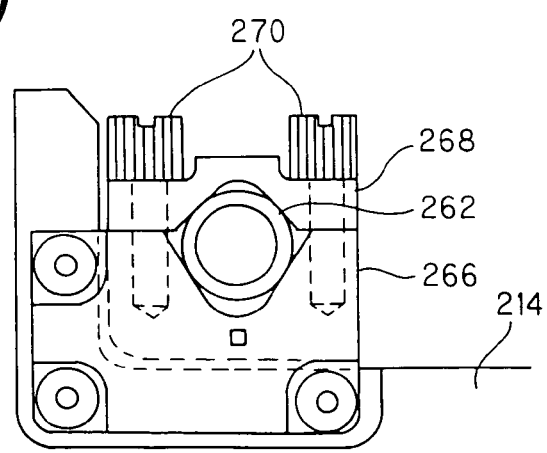
FIG. 12(b) is a view seen in the direction of B in an assembly state thereof.

Moreover, a fitting hole 260 is formed in an end face on one of the end sides of the squeegee fixing member 250 and an embedded pin 262 is inserted in the fitting hole 260. The head portion of the embedded pin 262 is cylindrically formed to have a larger diameter than the diameter of the fitting hole. As shown in an exploded view of FIG. 12(a) showing the support structure of the embedded pin 262 seen in a direction of B of FIG. 10 and a view of FIG. 12(b) showing an assembly state in the direction of B, the cylindrical head portion of the embedded pin 262 is interposed between a lower V block 266 fixed to the housing 214 and an upper V block 268. Moreover, a screw 270 is attached to the lower V block 266 through the upper V block 268 so that the head portion of the embedded pin 262 is positioned and fixed with high precision between the upper V block 268 and the lower V block 266.

Figure 13A:
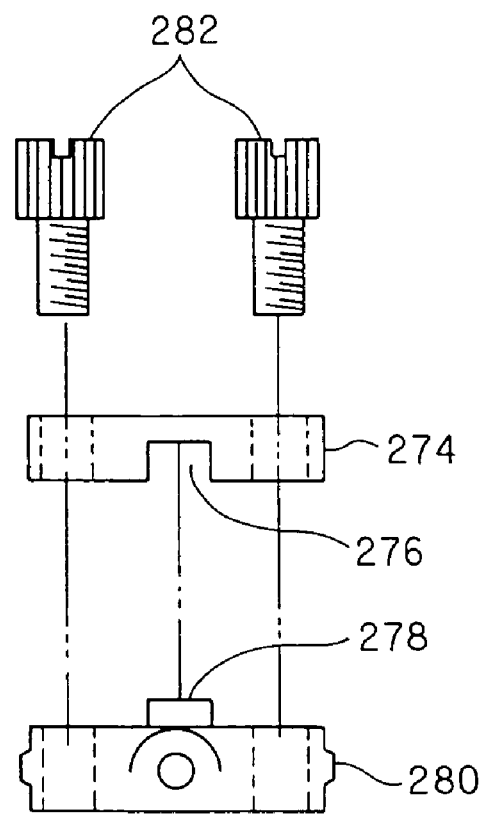
FIG. 13(a) is an exploded view showing the support structure of an engagement portion seen in a section taken along C—C in FIG. 10
Figure 13B:
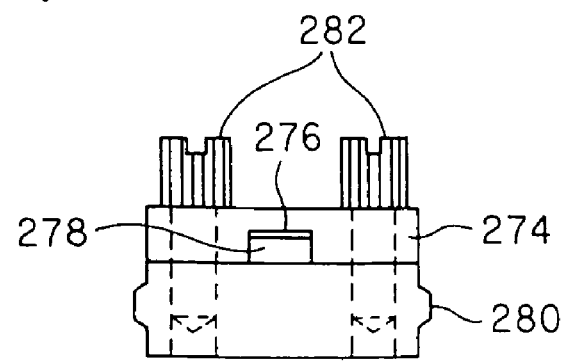
FIG. 13(b) is a sectional view taken along C—C in an assembly state thereof.

On the other hand, the other end side of the squeegee fixing member 250 is provided with an engagement portion 274 having an upper end side protruded like a plate in an axial direction, and a key groove 276 is formed in the axial direction on the lower surface side of the engagement portion 274. FIG. 13(a) is an exploded view showing the support structure of the engagement portion 274 seen in a C—C section of FIG. 10 and FIG. 13(b) is a sectional view taken along C—C in an assembly state thereof. The engagement portion 274 has a projection 278 to be engaged with the key groove 276 and is fixed with a screw 282 to a receiving table 280 fastened to the housing 214 side so that the key groove 276 of the engagement portion 274 and the projection 278 of the receiving table 280 are fitted and positioned with high precision.

According to the support structure of the squeegee fixing member 250, one of end sides is supported on the lower V block 266 and the upper V block 268 and the other end side is supported by the fitting of the key groove 276 and the projection 278. Consequently, the squeegee fixing member 216 itself can be prevented from being twisted and a removing method having high reproducibility of an attachment position and high precision can be implemented.

Next, description will be given to the stirring squeegee 222 and the leveling squeegee 224 which are to be attached to the squeegee unit 216.

Figure 14A:
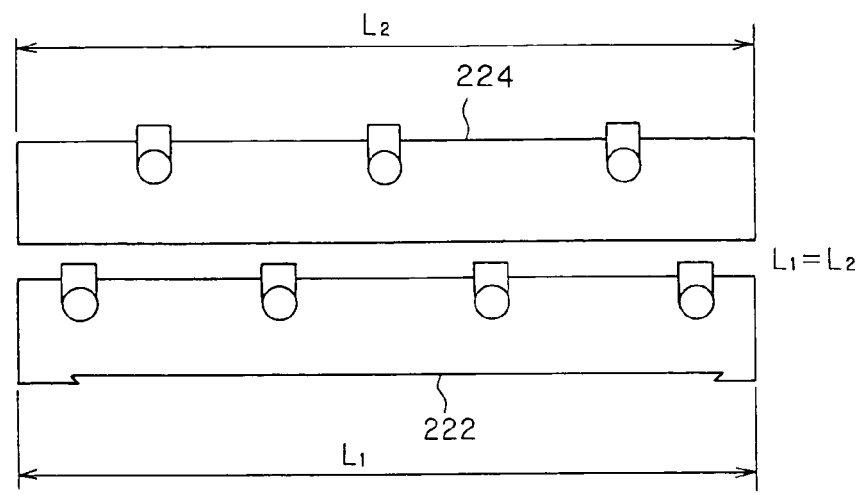
FIGS. 14(a) and (b) are views in which the lengths of the stirring squeegee and the leveling squeegee are compared with each other.
Figure 14B:
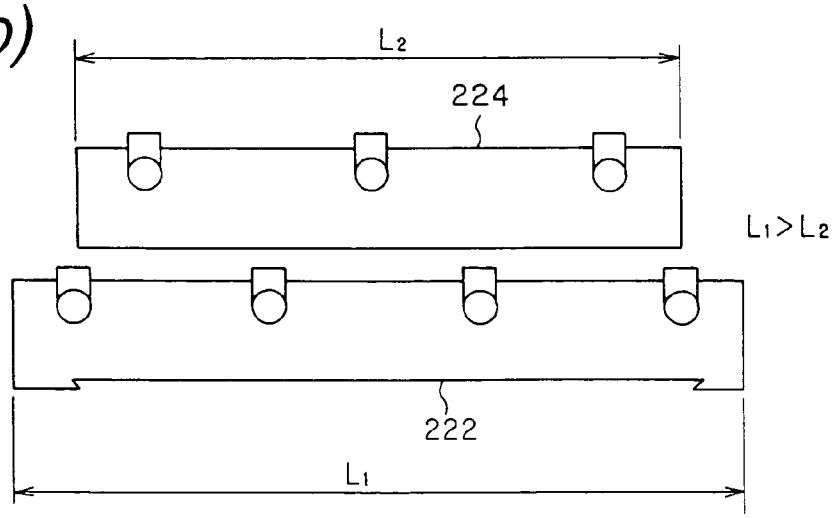

FIGS. 14(a) and (b) are views showing a comparison of the lengths of the stirring squeegee 222 and the leveling squeegee 224. A length $L_1$ of the stirring squeegee 222 may be equal to a length L2 of the leveling squeegee 224 as shown in FIG. 14(a). In order to reliably prevent the solder cream from overlapping, however, it is desirable that the length $L_1$ of the leveling squeegee 224 should be set to be greater than the length (a scrape-off width) L2 of the stirring squeegee as shown in FIG. 14(b). These squeegees 222 and 224 are formed like plates and a hard rubber such as an urethane rubber is used for a material thereof.

First of all, the leveling squeegee 224 will be described.

Figure 15A:
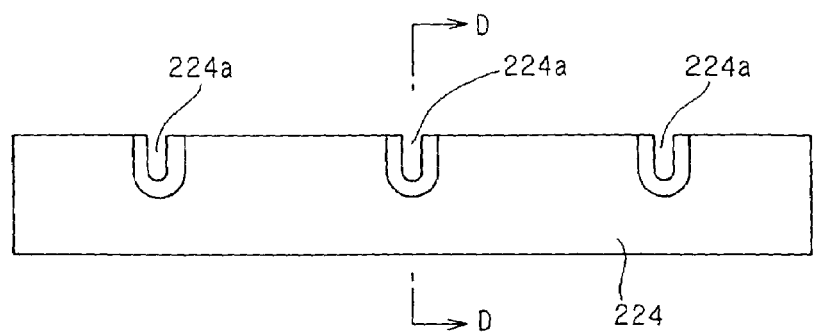
FIGS. 15(a) and (b) are views showing the shape of the leveling squeegee, FIG. 15(a) being a front view and FIG. 15(b) being a sectional view taken along D—D.
Figure 15B:
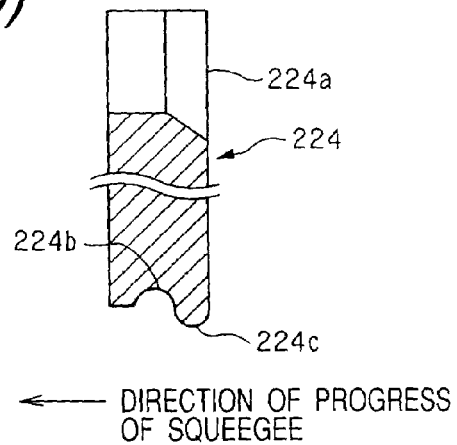

FIGS. 15(a) and (b) are views showing the shape of the leveling squeegee 224, FIG. 15(a) being a front view and FIG. 15(b) being a sectional view taken along D—D. The plate-shaped leveling squeegee 224 has a fixing hole 224a to the squeegee fixing member 250 provided on one of the sides of a long side thereof, and a concave sectional curved portion 224b and a convex sectional curved potion 224c are sequentially formed in the press portion of the solder cream on the lower end of the drawing from the front part in the direction of progress of the squeegee.

Figure 16:
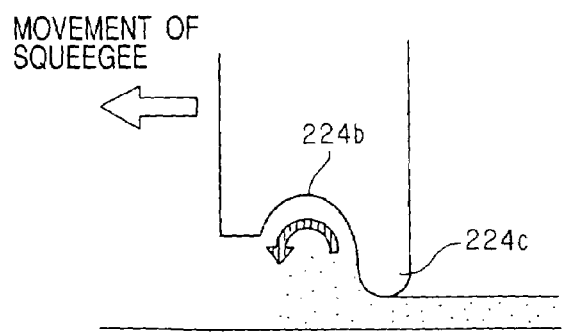
FIG. 16 is a view showing the state of scrape of the leveling squeegee.

In the leveling squeegee 224, as shown in the state of scrape-off in FIG. 16, the solder cream is pressurized and extended by the convex sectional curved portion 224c to form a layer having a uniform solder cream thickness, and an excessive solder cream is rolled along the curved surface of the concave sectional curved portion 224b in the direction of progress of the squeegee and is stirred and returned to the progress side of the squeegee. Consequently, the solder cream thus stirred is always put with a uniform thickness.

Next, the stirring squeegee 222 will be described.

Figure 17A:
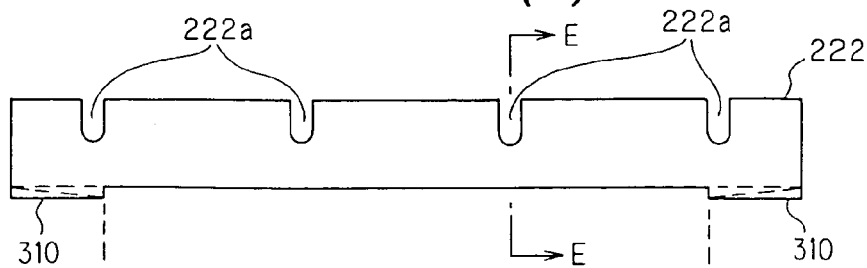
FIGS. 17(a) and (b) are views showing the shape of the stirring squeegee, FIG. 17(a) being a front view and FIG. 17(b) being a bottom view.
Figure 17B:
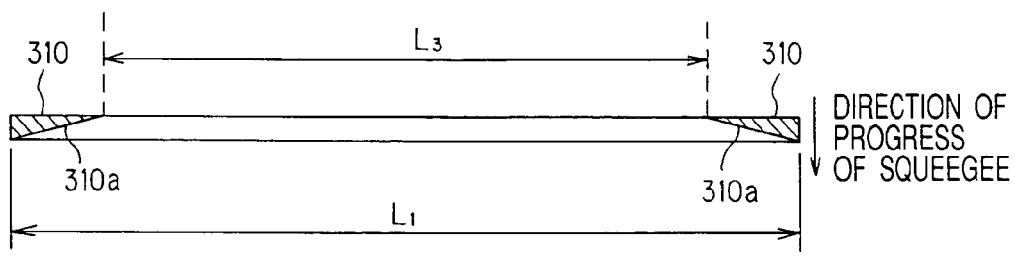
Figure 18:
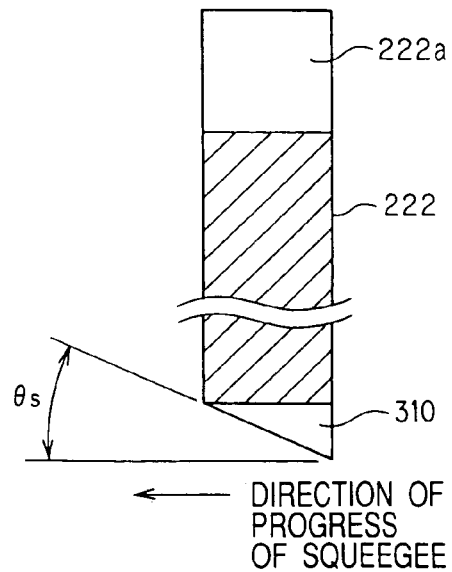
FIG. 18 is a sectional view taken along E—E in FIG. 17.
Figure 19:
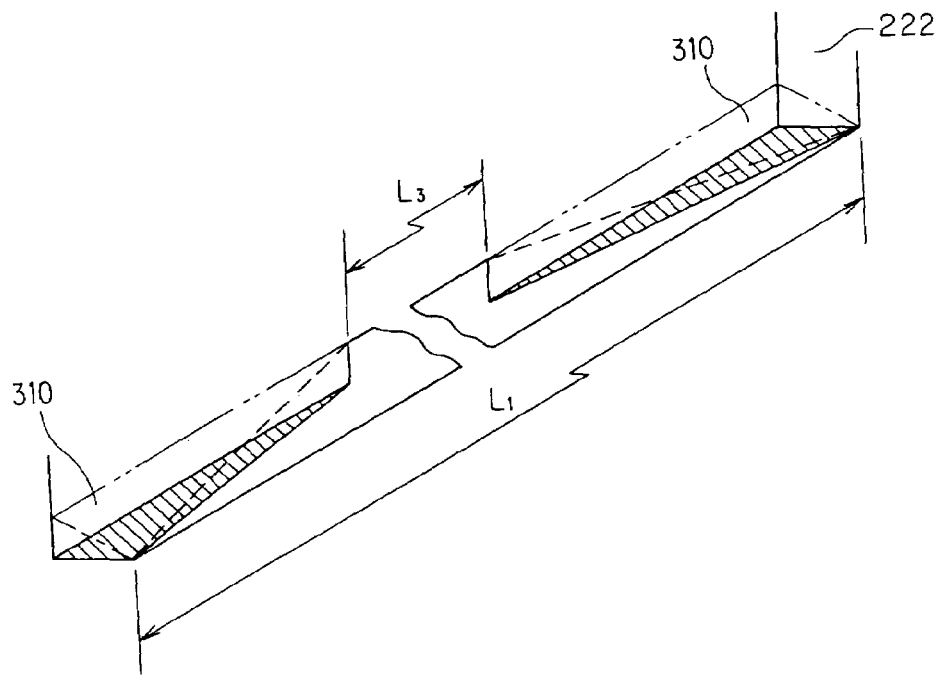
FIG. 19 is an enlarged perspective view showing both ends on the solder cream press side of the stirring squeegee.

FIGS. 17(a) and (b) are views showing the shape of the stirring squeegee 222, FIG. 17(a) being a front view and FIG. 17(b) being a bottom view. FIG. 18 is a sectional view taken along E—E in FIGS. 17(a), 17(b) and 19 is an enlarged perspective view showing both ends on the solder cream press side of the stirring squeegee 222. Portions shown in a slant line in FIGS. 17(b) and 19 show the lowermost surface of the stirring squeegee 222.

As shown in FIGS. 17(a), 17(b) and 18, the plate-shaped stirring squeegee 222 is provided with the fixing hole 222a to the squeegee fixing member 250 on one of the sides of a long side thereof, and a protrusion 310 having a taper face 310a for scraping the solder cream toward the central side in the longitudinal direction of the squeegee with the movement of the squeegee is formed on the pan surface side to be the press side of the solder cream on the lower end shown in FIG. 17(a) on both ends in the longitudinal direction. The taper face 310a of the protrusion 310 is inclined in such a direction that an opening length $L_3$ on the outlet side is set to be smaller than the squeegee length $L_1$ on the solder cream-inlet side of the stirring squeegee 222 to reduce the passage for the solder cream. Moreover, the stirring squeegee 222 is used in a forward inclination state in the direction of progress by a predetermined angle $\theta_s$. Therefore, the protrusion 310 of the squeegee 222 is cut at the angle of $\theta_s$ as shown in FIG. 18. Accordingly, the protrusion 310 of the stirring squeegee 222 has a longitudinal section taking a triangular shape and has such a shape that a triangle pole is obliquely cut at the angle of $\theta_s$ as in the enlarged protrusion 310 shown in FIG. 19.

Figure 20:
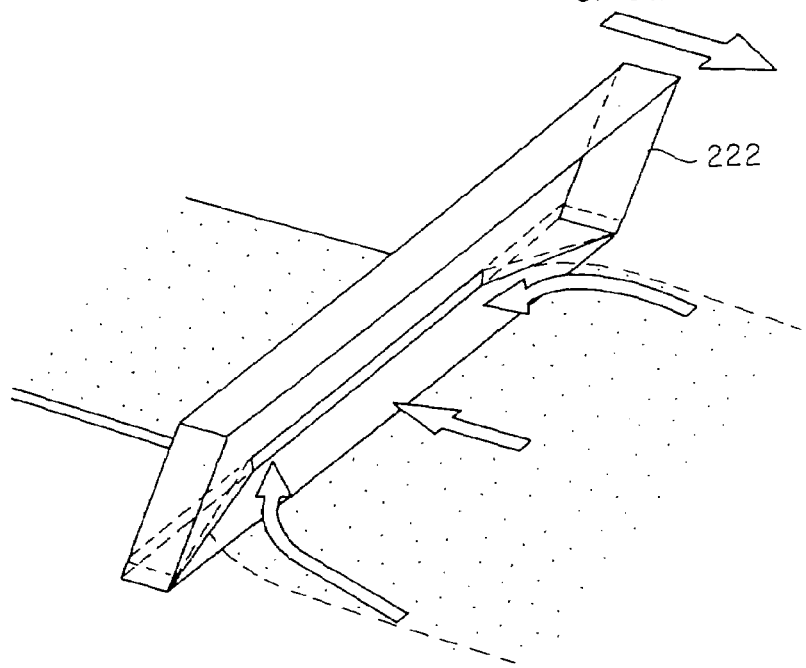
FIG. 20 is a view illustrating the flow of a solder cream with a squeegee movement.

By setting the stirring squeegee 222 to have the shape described above, the flow of the solder cream caused by the movement of the squeegee is stirred and scraped toward the central side in the longitudinal direction of the squeegee as shown in FIG. 20. More specifically, the solder cream introduced from an opening on the solder cream inlet side of the stirring squeegee 222 is scraped toward the inside along the taper face 310a of the protrusion 310 and is put without overflowing from ends in the lateral direction of the stirring squeegee 222. Consequently, it is possible to prevent the solder cream from overflowing from the pan surface of the transfer unit with a simple structure.

Figure 21A:
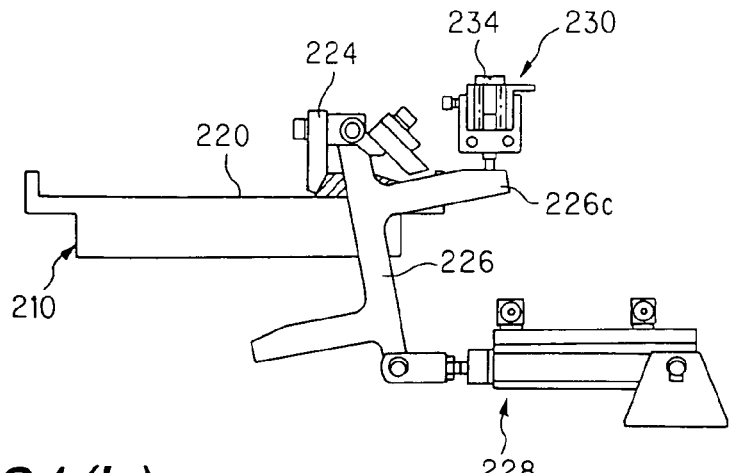
FIGS. 21(a), (b), and (c) are views illustrating the operation of the solder cream transfer apparatus on a stepwise basis.
Figure 21B:
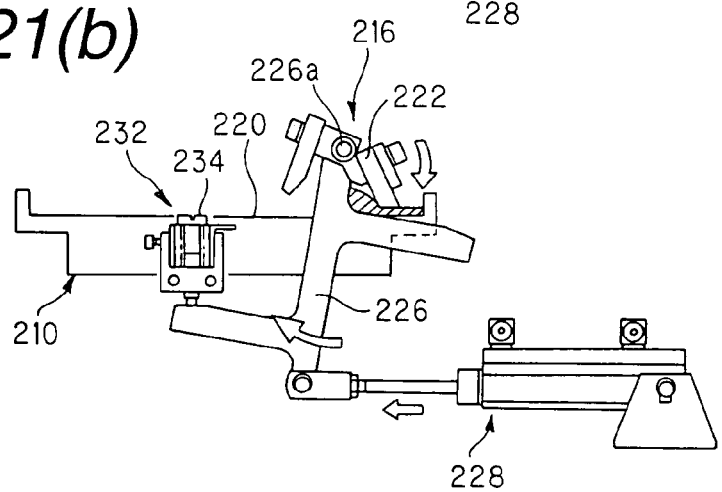

Description will be given to a procedure for forming a solder cream transfer surface by the solder cream transfer apparatus 200 having the structure of the main part described above. FIGS. 21(a), 21(b) and 22 show the operation of the solder cream transfer apparatus 200 on a stepwise basis.

First of all, in an initial state shown in FIG. 21(a), the rod of the horizontal driving mechanism 228 is contracted with a reduction in the protrusion of the tip portion of the screw 234 of the arm stopper 230 and the tip of the leveling squeegee 224 is pushed against the pan surface 220 of the transfer unit 210 over the whole width. By setting the push position to be a reference position, the degree of parallelism of the pan surface 220 and the leveling squeegee 224 is enhanced. In this state, the screw 234 of the arm stopper 230 is protruded downward until the tip portion of the screw contacts on the rocking control arm 226c of the rocking arm 226. After the graduation 240 of the cylindrical ring 236 shown in FIG. 8 is coincident with the arrow 234a of the screw 234 in a position where the screw 234 contacts on the rocking control arm 226c, the height of the leveling squeegee 224 is set by the rotation of the screw 234 such that the clearance between the leveling squeegee 224 and the pan surface 220 has a desirable solder cream thickness. At this time, the pitch of the screw 234 accurately determines the amount of change in the height of one graduation 240. By regulating the rotating position of the screw 234 (arrow 234a) using the graduation 240 of the cylindrical ring 236, the clearance can be set with high precision. Moreover, the tip of the squeegee can be prevented from being excessively pushed against the pan surface 220 through the arm stopper 230.

As shown in FIG. 21(b), next, the rod of the horizontal driving mechanism 228 is extended to rock the rocking arm 226 around the end side 226a on the squeegee unit 216 side. At this time, the degree of parallelism of the stirring squeegee 222 and the pan surface 220 is enhanced in the same manner as described above, thereby setting the clearance between the stirring squeegee 222 and the pan surface 220 with high precision through the arm stopper 232.

Figure 21C:
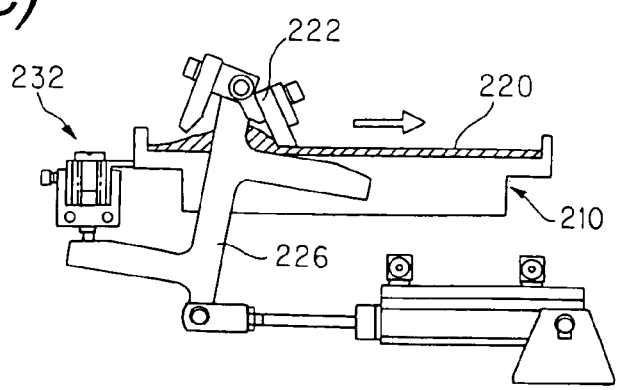

After the clearance between each squeegee and the pan surface 220 is regulated, the transfer unit 210 is moved from the state shown in FIG. 21(b) in the right direction of the drawing through a transfer unit moving mechanism which is not shown as illustrated in FIG. 21(c). Consequently, the solder cream having a thickness corresponding to the clearance set between the stirring squeegee 222 and the pan surface 220 is stirred and put on the pan surface 220.

Figure 22A:
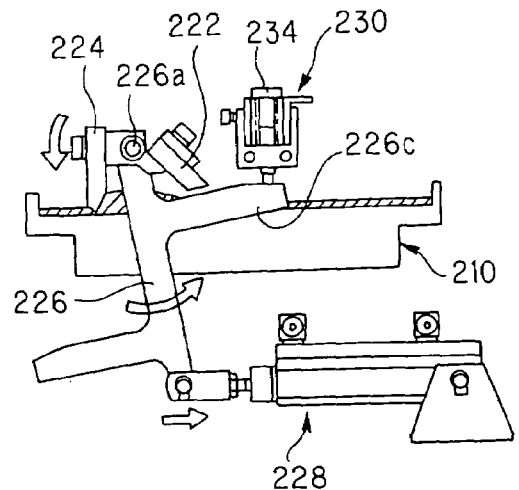
FIGS. 22(a), (b), and (c) are views illustrating the operation of the solder cream transfer apparatus on a stepwise basis.

As shown in FIG. 22(a), next, the rod of the horizontal driving mechanism 228 is contracted to rock the rocking arm 226 up to such a position that the rocking control arm 226c contacts on the tip portion of the screw 234 of the arm stopper 230 around the end 226a of the rocking arm 226. Consequently, the stirring squeegee 222 is separated from the pan surface 220 and the leveling squeegee 224 is set to a space formed together with the pan surface 220 regulated previously.

Figure 22B:
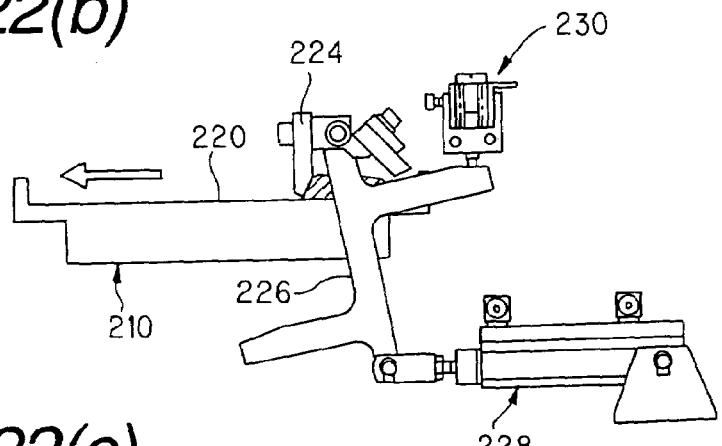
Figure 22C:
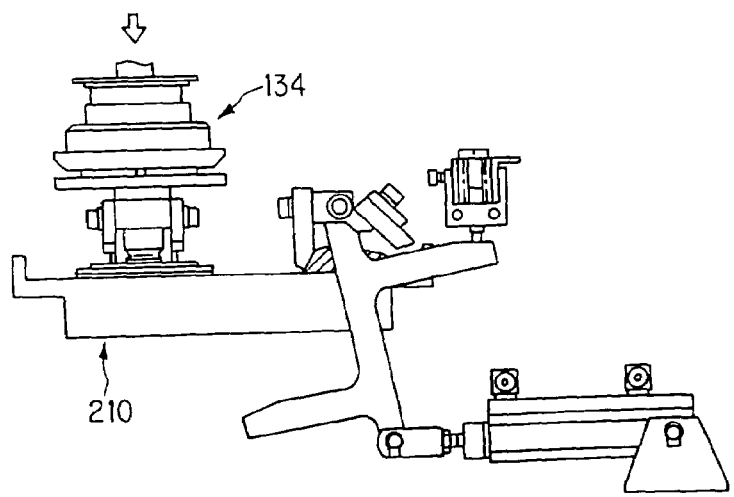

The transfer unit 210 is moved from the state shown in FIG. 22(a) in the left direction of the drawing through the transfer unit moving mechanism as shown in FIG. 22(b). Consequently, the solder cream is uniformly put with a predetermined thickness over the pan surface 220 of the transfer unit 210 and the solder cream transfer surface is completely formed. As shown in FIG. 22(c), the sucking nozzle 134 sucking a predetermined electronic component is pushed against the solder cream transfer surface so that the solder cream is transferred to the electronic component.

Figures 23A, 23B, 23C, 23D:
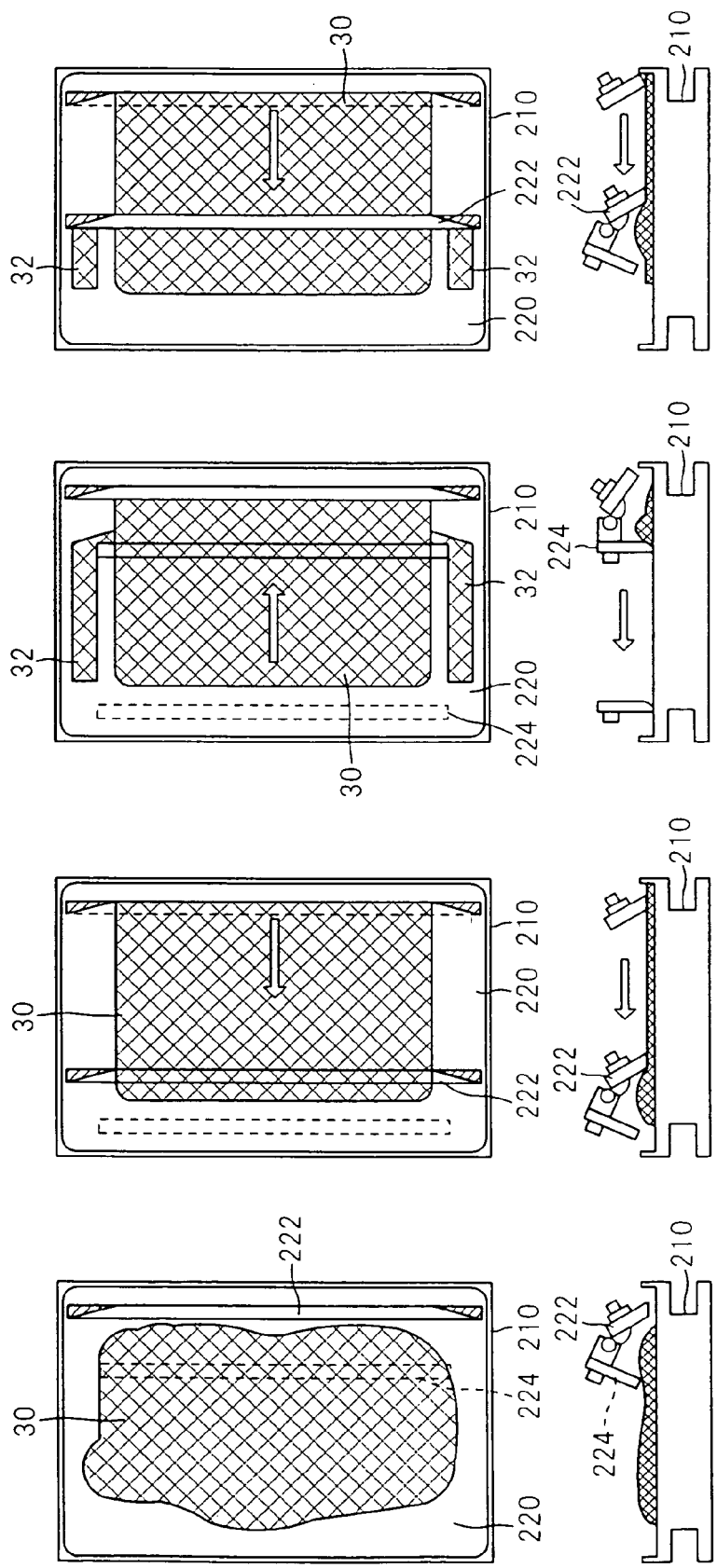
FIGS. 23(a), (b), (c) and (d) are views illustrating, on a stepwise basis, a state in which the transfer surface of the solder cream is formed by using the solder cream transfer apparatus.

According to the procedure for forming the solder cream transfer surface of the solder cream transfer apparatus 200, moreover, the solder cream on the transfer unit 210 of the solder cream transfer apparatus 200 is put in such a configuration as to be shown in FIGS. 23(a), (b), (c), and (d). FIGS. 23(a), (b), (c) and (d) illustrate, on a stepwise basis, a state in which the transfer surface of the solder cream is formed by using the solder cream transfer apparatus 200 according to the embodiment.

First of all, as shown in FIG. 23(a), the solder cream 30 is almost uniformly leveled and provided on the pan surface 220 of the transfer unit 210. As shown in FIG. 23(b), then, the stirring squeegee 222 is moved toward the left side in the drawing, thereby stirring and putting the solder cream 30 on the pan surface 220. As shown in FIG. 23(c), furthermore, when the leveling squeegee 224 is moved to the right side in the drawing, the solder cream transfer surface having a uniform predetermined thickness is obtained on the pan surface 220, while the excessive solder cream overflows from both end sides of the leveling squeegee 224 and is put as an excessive solder cream 32 on the end of the pan surface 220. As shown in FIG. 23(d), thereafter, the stirring squeegee 222 is moved again to the left side in the drawing so that the excessive solder cream 32 put on the end of the pan surface 220 is scraped toward the central side in the longitudinal direction of the stirring squeegee 222, and is sufficiently stirred in the vicinity of the central part of the pan surface 220 and is put again in the same manner as in FIG. 23(b).

Thus, even if the stirring squeegee 222 and the leveling squeegee 224 are repetitively reciprocated plural times, the solder cream transfer surface can be stably formed without causing the solder cream to overflow from the pan surface 220 of the transfer unit 210.

Even though the shape of the stirring squeegee 222 has a simple plate-shaped structure in which the protrusion 310 is not provided, the transfer operation can be carried out without causing the solder cream to overflow from the transfer unit 210 if the amount of the solder cream is proper.

Moreover, the stirring squeegee 222 and the leveling squeegee 224 are automatically controlled to be stirred by automatically carrying out the reciprocating operation for a predetermined time or with the transfer operation according to the degree of dryness of the solder cream transfer surface. Consequently, the excellent transfer surface can be always exposed continuously.

Next, description will be given to the structure of the sucking nozzle to be attached to the lower end of the attachment head.

Figure 24A:
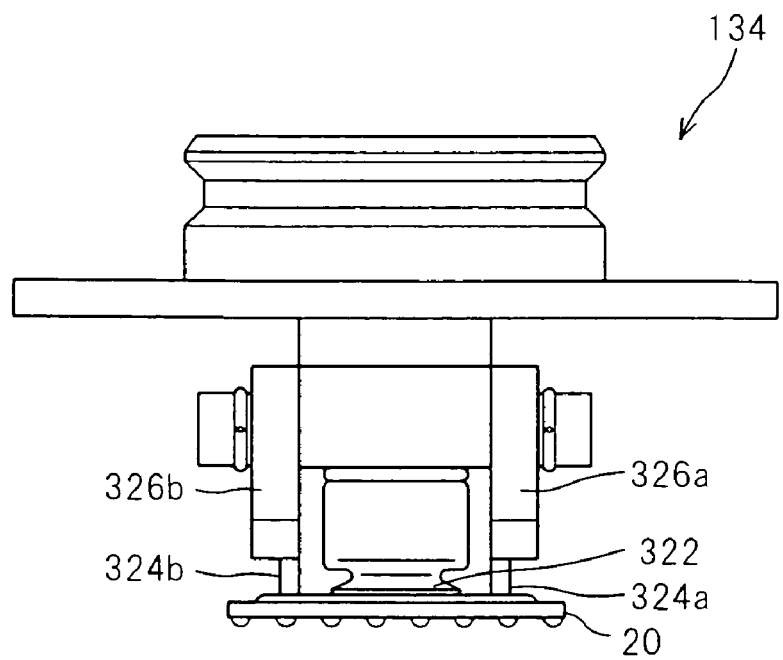
FIGS. 24(a) and (b) are views showing the structure of a sucking nozzle, FIG. 24(a) being a front view and FIG. 24(b) being a side view, a part of which is taken away.
Figure 24B:
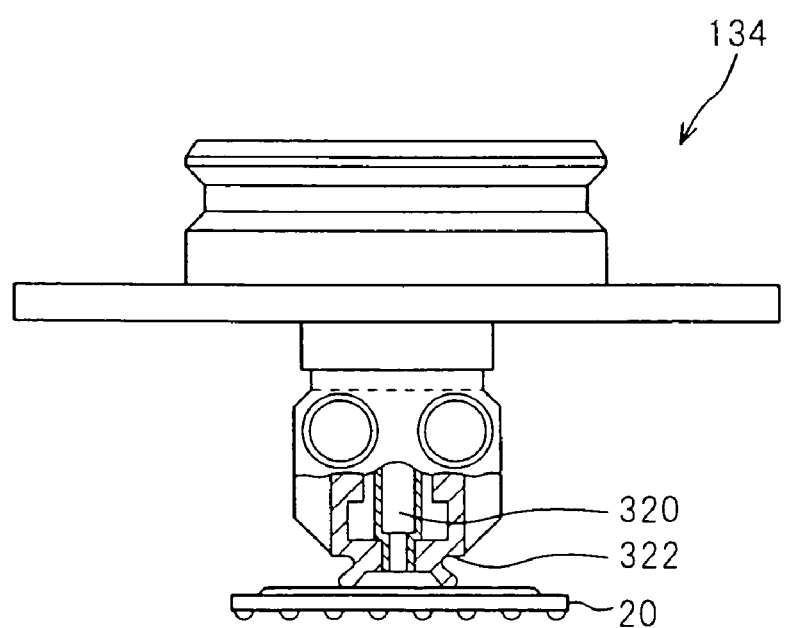

FIGS. 24(a) and (b) are views showing the structure of the sucking nozzle, FIG. 24(a) being a front view and FIG. 24(b) being a side view, a part of which is taken away.

The sucking nozzle 134 includes a rubber pad 322 which has an air sucking passage 320 formed therein, has the sucking surface of the tip portion capable of being inclined and is extendable in the direction of suction (a vertical direction in the drawing), and sucking component correcting members 326a and 326b to be rod members which are provided in pairs on both sides of the rubber pad 322 and serve to horizontally correct the sucking attitude of the electronic component 20 when the tip portions 324a and 324b contact on the rear face of the electronic component 20 during the suction of the electronic component 20.

Figure 25A:
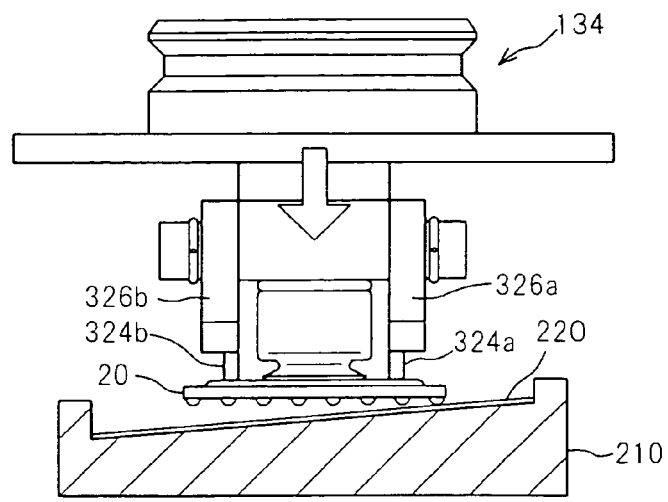
FIGS. 25(a), (b), and (c) are views showing a state in which the solder cream is transferred to the electronic component over the pan surface of a transfer unit inclined from a horizontal plane.
Figure 25B:
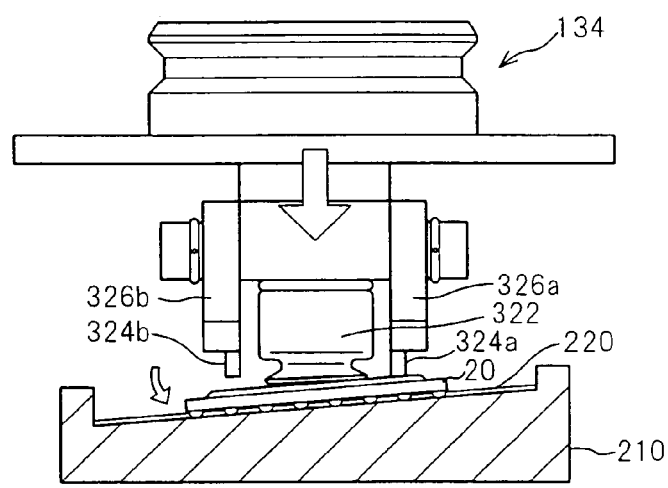
Figure 25C:
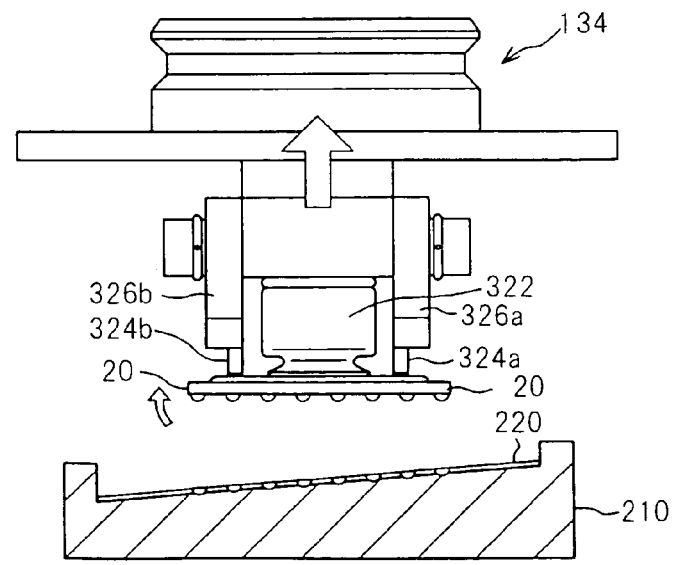

According to the structure of the sucking nozzle 134, when the solder cream is to be transferred to the electronic component 20 over the pan surface 220 of the transfer unit 210 inclined from a horizontal plane as shown in FIGS. 25(a), (b), and (c), it is possible to prevent the electronic component 20 from remaining in the transfer unit 210 due to the viscosity of the solder cream after the electronic component is immersed into the solder cream transfer surface of the pan surface 220. More specifically, when the sucking nozzle 134 is slightly brought down in the state in which the electronic component 20 shown in FIG. 25(a) contacts on the pan surface 220 of the transfer unit 210, the electronic component 20 is slanted along the inclination of the pan surface 220 by setting the tip portion 324a of the sucking component correcting member 326a to be the center of rotation as shown in FIG. 25(b). Consequently, pressing force is applied from the tip potion 324a of the sucking component correcting member 326 to the electronic component 20 so that the solder cream on the pan surface 220 is uniformly transferred to the lower surface of the electronic component 20. At this time, the rubber pad 322 is maintained to be sucked on the surface of the electronic component 20 and the sucking nozzle 134 maintains such a state that the electronic component 20 is reliably sucked and held also when the electronic component 20 shown in FIG. 25(*b*) is inclined. Also during pull-up shown in FIG. 25(*c*), the electronic component 20 is maintained to be sucked by the rubber pad 322. Therefore, it is possible to prevent the electronic component 20 from being left on the pan surface 220 due to the viscosity of the electronic component 20 and the solder cream. Consequently, it is possible to reliably pull up the electronic component 20 which is maintained to be sucked and held.

Figure 26A:
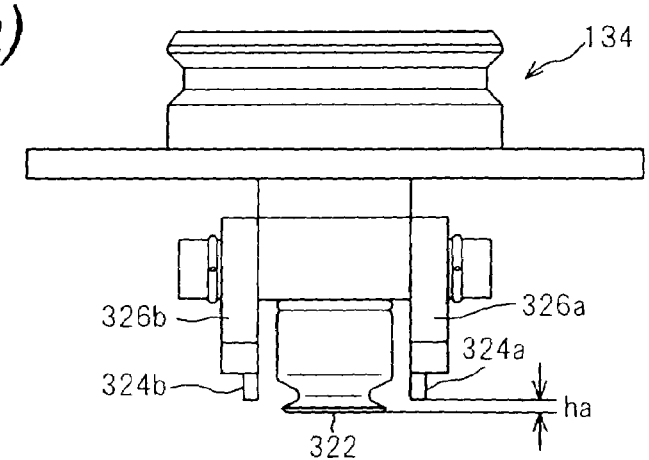
FIGS. 26(a), (b), and (c) are views showing a state in which the electronic component mounted on the surface inclined from the horizontal plane is sucked.
Figure 26B:
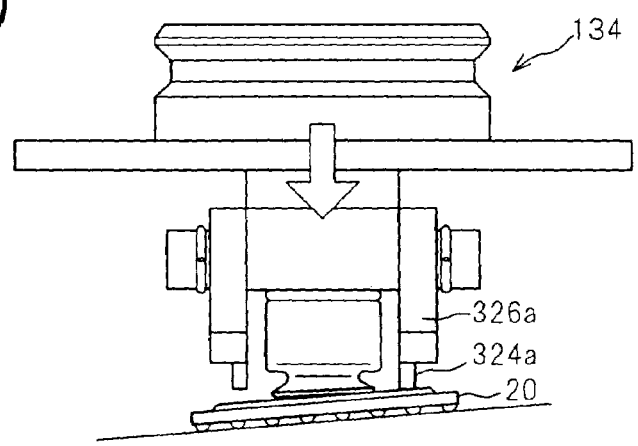
Figure 26C:
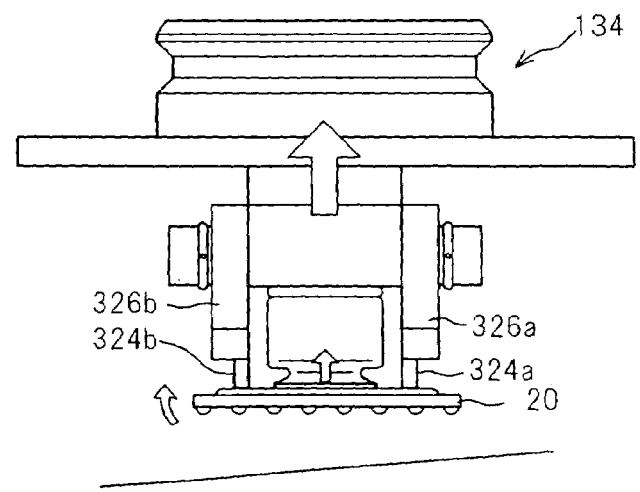

Similarly, the electronic component mounted on a surface inclined from the horizontal plane as shown in FIGS. 26(*a*), (*b*), and (*c*) can also reliably carry out the sucking operation without leaking air. More specifically, in the initial state brought before the suction of the electronic component as shown in FIG. 26(*a*), the height of the lower surface of the rubber pad 322 is set to be smaller than the height of the tip portion 324 of each of the sucking component correcting members 326*a* and 326*b* by $h_a$. Consequently, in the case in which the electronic component 20 inclined as shown in FIG. 26(*b*) is to be sucked, the lower surface of the rubber pad 322 first comes in point contact with the electronic component 20 with the fall of the sucking nozzle 134 and the rubber pad 322 is elastically deformed and is thereby sucked onto the surface of the inclined electronic component in face contact. At this time, the amount of elastic deformation in the direction of suction of the rubber pad 322 is controlled by the height of the tip portion 324*a* of the sucking component correcting member 326*a*.

When the sucking nozzle 134 is pulled up in this state, the electronic component 20 is lifted upward by the sucking force of the rubber pad 322 as shown in FIG. 26(*c*) and contacts on the tip portion 324*b* of the sucking component correcting member 326*b* so that the electronic component 20 is sucked and held horizontally.

Thus, since the sucking nozzle 134 includes the rubber pad, which is deformable in the direction of the suction, and the sucking component correcting member 326, the electronic component 20 can be sucked stably. Also during the transfer of the solder cream, the rubber pad 322 absorbs an inclination even if the pan surface 220 of the transfer unit 210 is inclined. Therefore, the solder cream can be transferred uniformly to the lower surface of the electronic component 20. Moreover, the electronic component 20 is not left on the transfer unit 210 also during the pull-up.

The contact face of the lower surfaces of the tip portions 324*a* and 324*b* of the sucking component correcting members 326*a* and 326*b* are inclined from the horizontal plane such that a desirable inclination angle can be obtained during the suction of the electronic component 20. Consequently, the electronic component can be sucked and held with an inclination having an optional angle and the solder cream can be transferred stably over the inclined pan surface 220 of the transfer unit 210. Moreover, the electronic component mounted on the inclined surface can also be sucked reliably.

Figure 27:
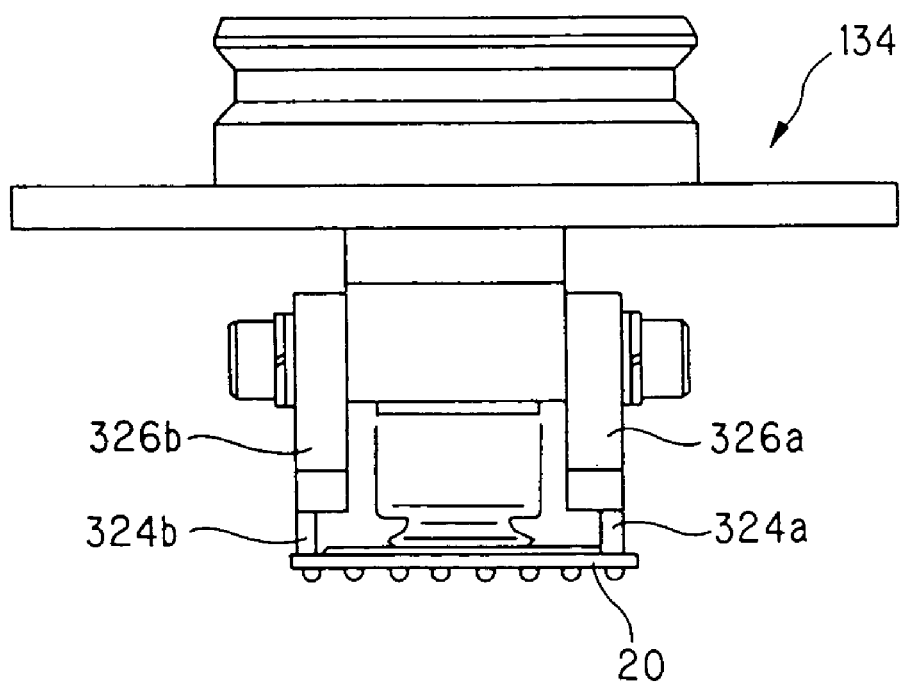
FIG. 27 is a view showing a state in which a space between the tip portions of a sucking component correcting member is enlarged.

The sucking component correcting members 326*a* and 326*b* can increase a space between the tip portions 324*a* and 324*b* as shown in FIG. 27 according to the type of the electronic component to be sucked, for example. More specifically, the sucking component correcting members 326*a* and 326*b* are turned over in the state shown in FIGS. 24(*a*) and (*b*) and are thus attached so that the space between the tip portions 324*a* and 324*b* can be regulated.

While the rod members have been illustrated as an example of the sucking component correcting members 326*a* and 326*b*, a toroidal or prism shape may be taken.

Figure 28A:
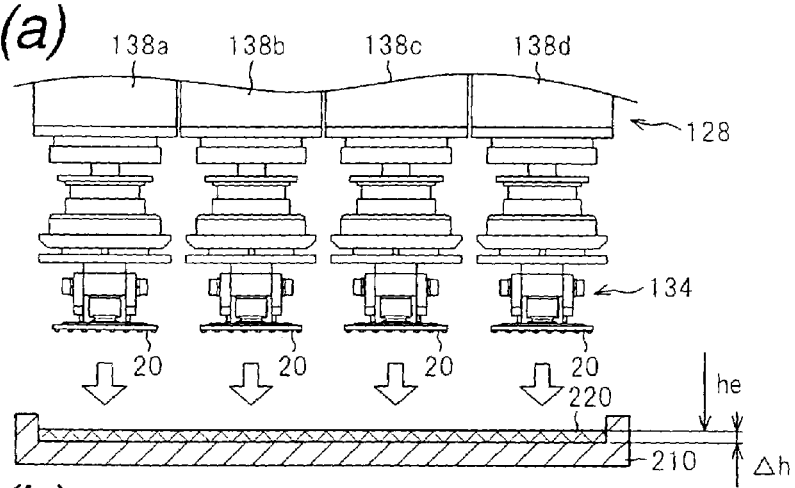
FIGS. 28(a), (b), and (c) are views showing a state in which the solder cream on the pan surface of the transfer unit of the solder cream transfer apparatus is transferred to the electronic component by using the sucking nozzle.
Figure 28B:
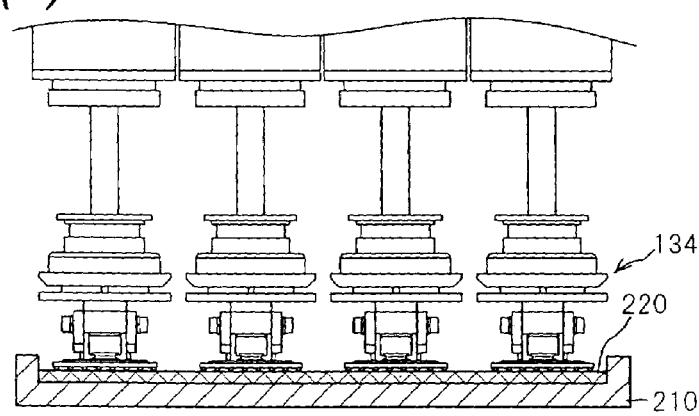
Figure 28C:
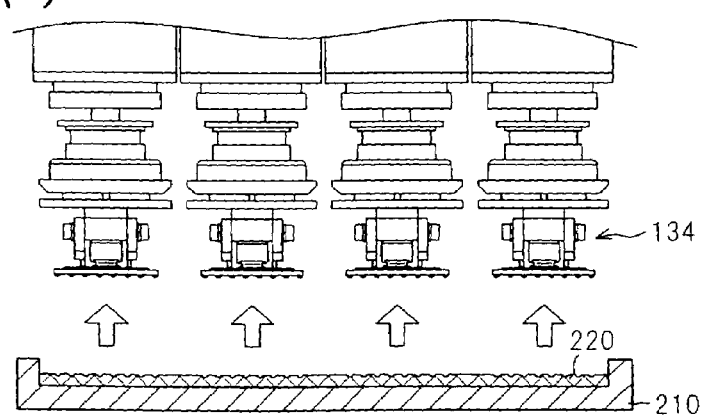

Next, FIGS. 28(*a*), (*b*), and (*c*) show a state in which the solder cream on the pan surface 220 of the transfer unit 210 is transferred to the electronic component by using the sucking nozzle 134. FIG. 28(*a*) shows a state in which the electronic component 20 is sucked into each sucking nozzle 134 of the attachment heads 138*a* to 138*d* and the transfer head is moved above the transfer unit 210, and FIG. 28(*b*) shows a state in which each sucking nozzle 134 is simultaneously brought down to such a height as to be immersed in the solder cream transfer surface of the transfer unit 210. At this time, the amount of fall of the sucking nozzle 134 is accurately set by adding a difference Δh in a height between a well-known edge portion and the solder cream transfer surface to a height $h_e$ of the edge portion of the transfer unit 210 which is measured by a length measuring sensor such as a laser displacement sensor which is not shown, thereby calculating a distance ($h_e$+Δh) to the solder cream transfer surface. As shown in FIG. 28(*c*), thus, the sucking nozzle 134 is pulled up to completely transfer the solder cream.

Figure 29:
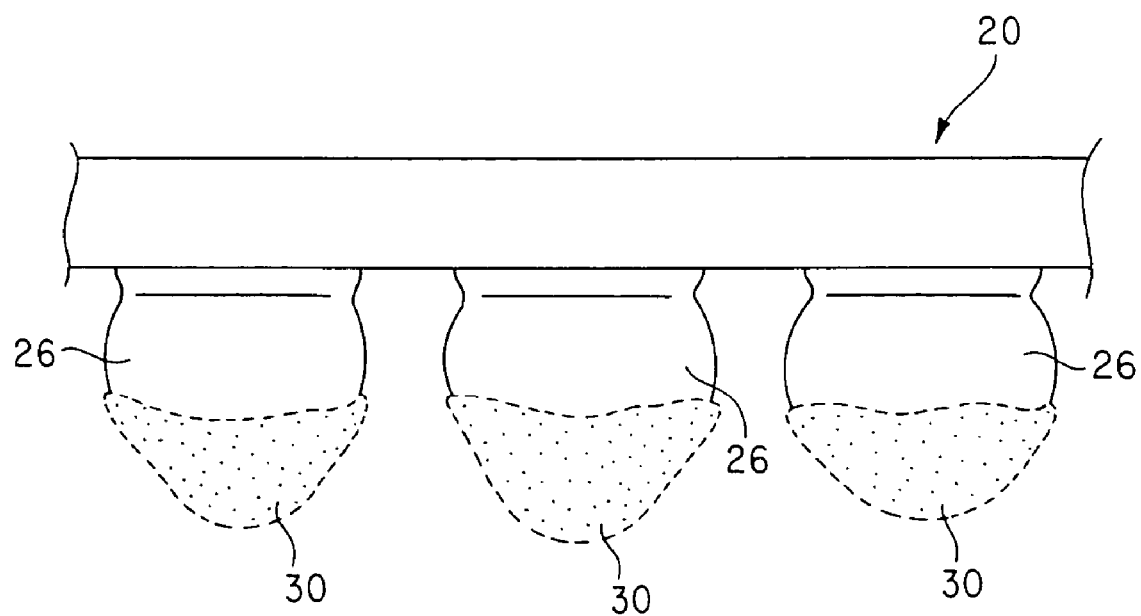
FIG. 29 is an enlarged view showing a solder ball obtained after the transfer of the solder cream.

By the transfer of the solder cream, the solder cream 30 is given in a predetermined amount to the lower surface side of the solder ball 26 as shown in an enlarged view of FIG. 29 showing the solder ball obtained after the solder cream is transferred if the electronic component is a BGA, for example. At this time, if a depth at which the solder ball 26 is pushed in from the solder cream transfer surface is to small, the height of the solder ball is not equal. Therefore, the solder cream is not given to all the solder balls or is not given in a sufficient amount so that conduction failures might be caused. If the same depth is too great, the solder cream is excessively given so that the solder balls 26 might be short-circuited. For this reason, it is preferable that the push-in depth of the solder ball should be set to the following dimension.

Figure 30:
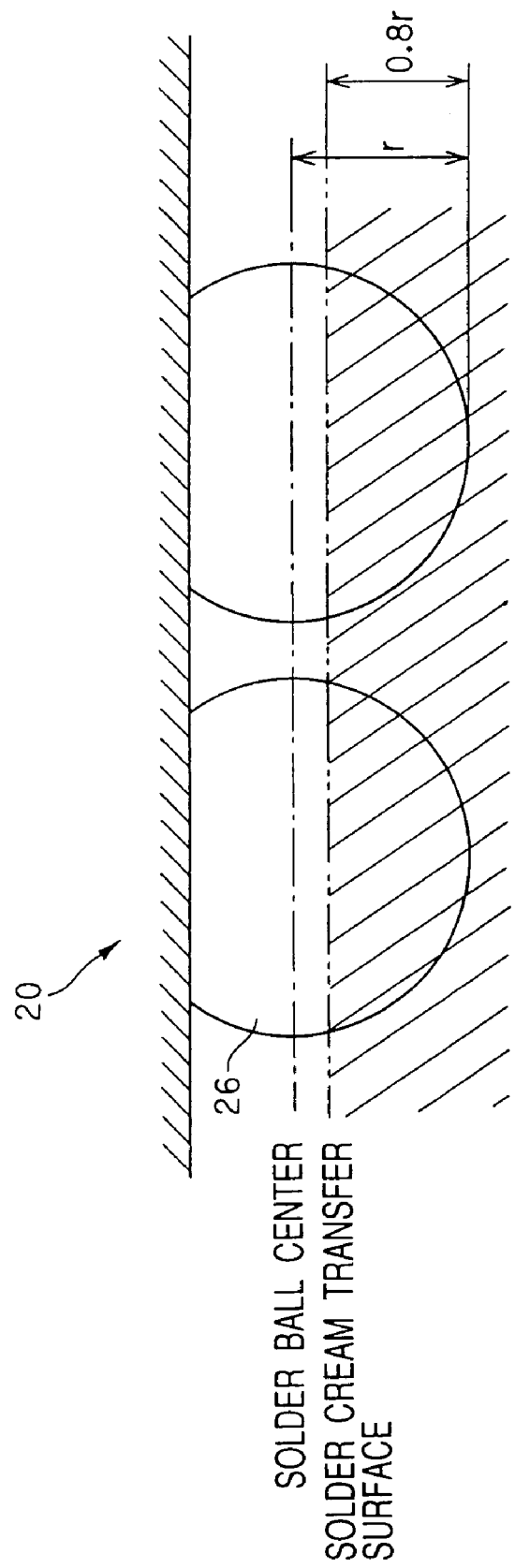
FIG. 30 is a view showing the push-in depth of the solder ball.

More specifically, FIG. 30 shows the push-in depth of the solder ball. If the radius of the solder ball 26 is represented by r, the height of the solder cream transfer surface is preferably set to a height ranging from the lowermost point of the solder ball 26 to the radius r, and more preferably, a height of 0.8 r. Consequently, a proper amount of the solder cream can be given to the solder ball 26.

Next, a transfer position on the transfer unit 210 will be described.

Referring to the solder cream transfer surface formed on the pan surface 220 of the transfer unit 210, basically, when a one-time transfer operation is completed, the squeegee unit 216 is reciprocated again to form a new solder cream transfer surface. However, when an interval required till the next transfer operation is short, the transfer operation can be carried out in a position different from the last transfer position without forming the solder cream transfer surface again. Consequently, a tact for the mounting operation is shortened.

Figure 31A:
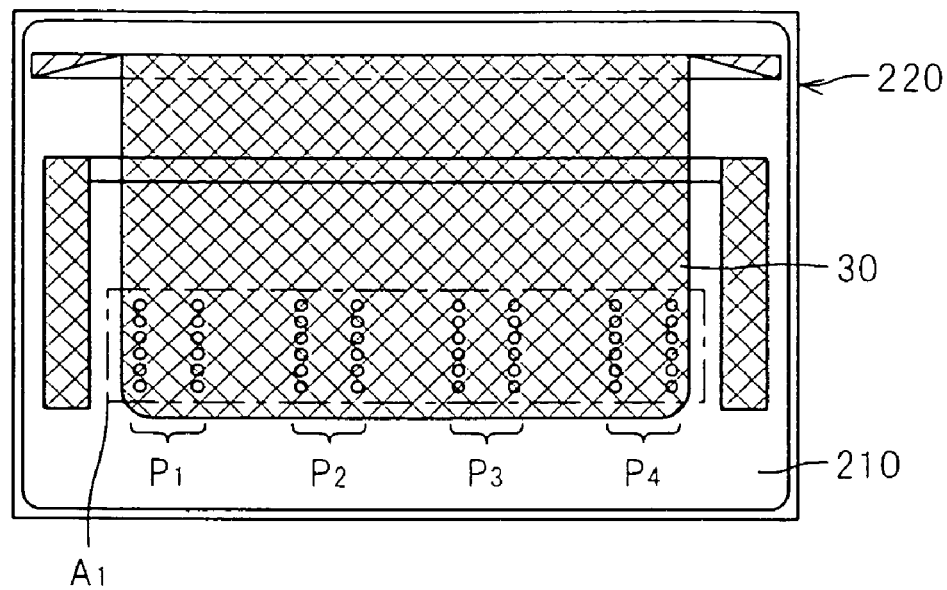
FIGS. 31(a) and (b) are views showing a state in which a transfer operation is carried out over the same solder cream transfer surface plural times.
Figure 31B:
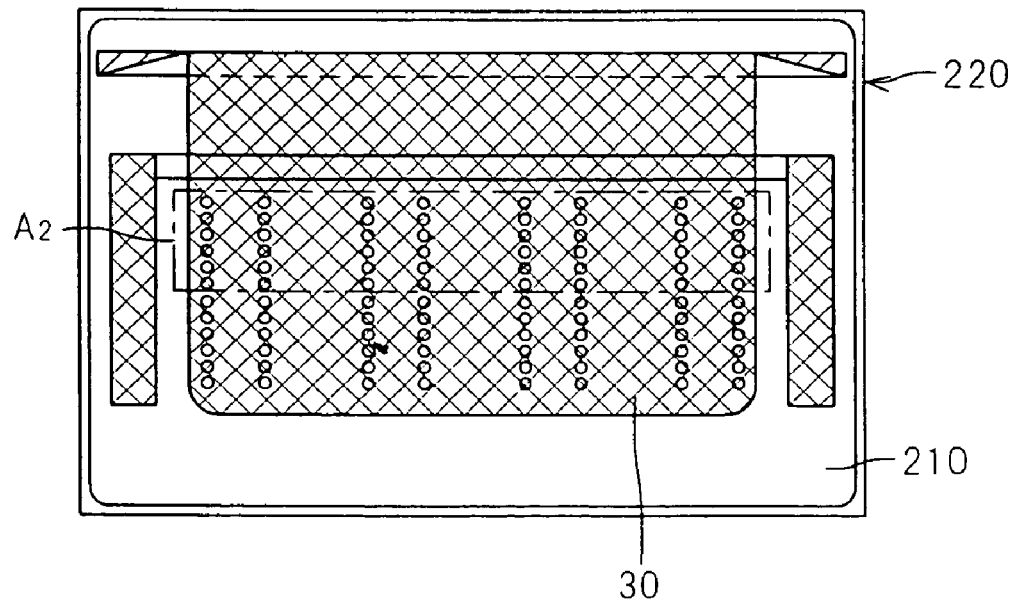

FIGS. 31(*a*) and (*b*) are views showing a state in which the transfer operation is carried out over the same solder cream transfer surface plural times. A first transfer operation is carried out in a region $A_1$ on this side of the solder cream transfer surface as shown in FIG. 31(*a*) and a second transfer operation is carried out in a region $A_2$ on the inner side of the solder cream transfer surface as shown in FIG. 31(*b*). $P_1$ to $P_4$ shown in the region $A_1$ represent transfer tracks obtained by the attachment heads 138*a*, 138*b*, 138*c* and 138*d* shown in FIG. 28(a). Herein, the four attachment heads 138a, 138b, 138c and 138d are moved vertically at the same time, thereby carrying out the transfer operation.

Figure 32A:
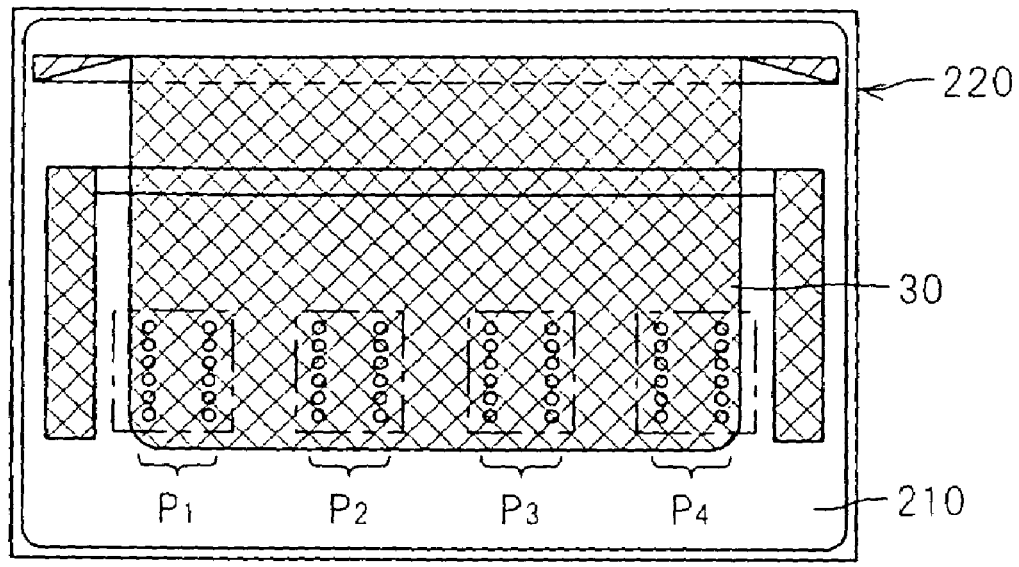
FIGS. 32(a) and (b) is a view showing another state in which a transfer operation is carried out over the same solder cream transfer surface plural times.
Figure 32B:
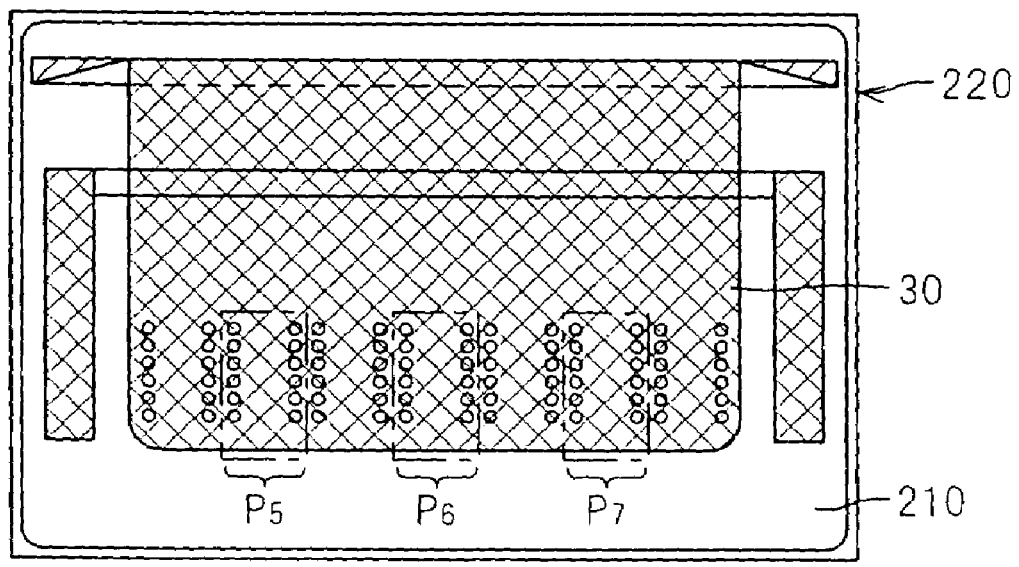

Moreover, FIGS. 32(a) and (b) also show a state in which the transfer operation is carried out over the same solder cream transfer surface plural times. In this case, as shown in FIG. 32(a), the transfer operation is carried out by the attachment heads 138a, 138b, 138c and 138d in the positions of $P_1$ to $P_4$ as shown in FIG. 32(a) and the transfer operation is then carried out by any of the attachment heads in positions $P_5$, $P_6$ and $P_7$ adjacent to the positions $P_1$ to $P_4$ as shown in FIG. 32(b). In the drawing, the transfer track in each position is shown. According to each transfer method, the solder cream transfer surface can be utilized effectively.

Figure 33:
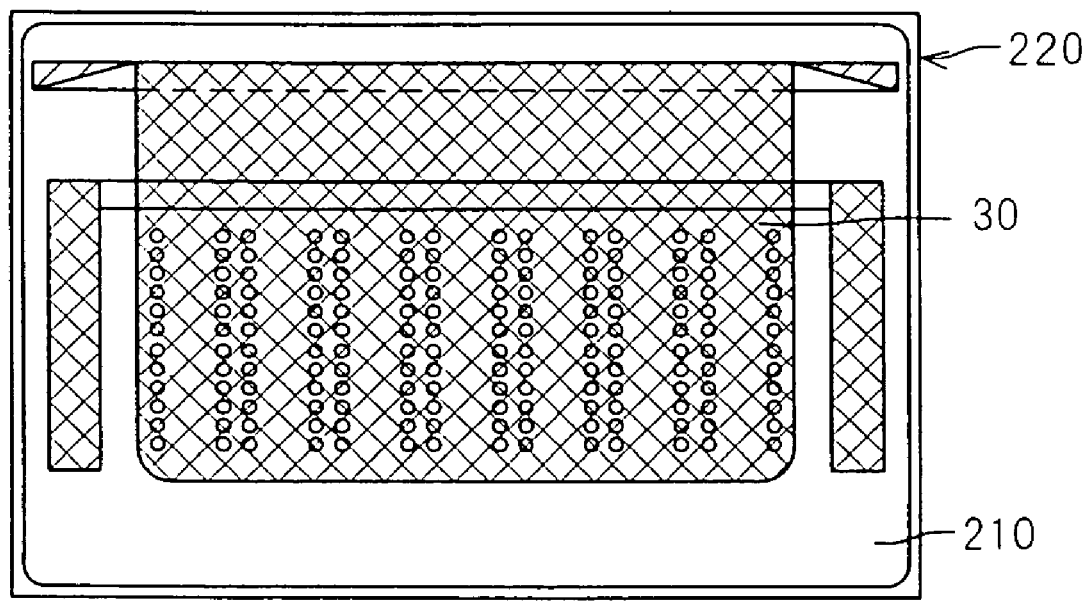
FIG. 33 is a view showing a state in which the transfer operation shown in FIG. 31 and the transfer operation shown in FIG. 32 are combined to carry out a transfer operation.

Furthermore, FIG. 33 shows a state in which the transfer operation shown in FIGS. 31(a) and (b) and the transfer operation shown in FIGS. 32(a) and (b) are combined to carry out a transfer operation. More specifically, the transfer operation is carried out for this side and inner side of the solder cream transfer surface and the position adjacent to each transfer position. Consequently, almost the whole solder cream transfer surface is used for the transfer operation so that the area efficiency of the transfer unit 210 can be enhanced at a maximum.

Next, description will be given to a three-dimensional mounting method of attaching the solder cream transfer apparatus 200 to the electronic component mounting apparatus 100, thereby mounting an electronic component on a circuit board in multi-stages.

Figure 34A:
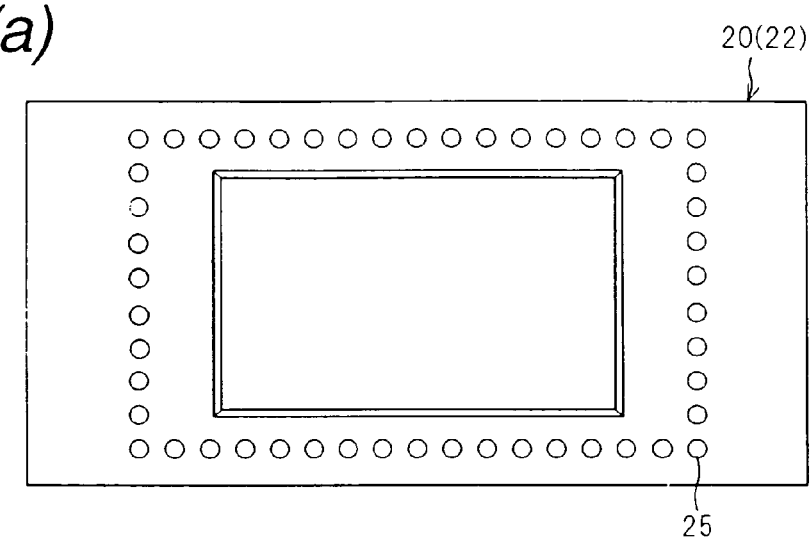
FIGS. 34(a), (b), and (c) are views showing the appearance of the electronic component to be mounted three-dimensionally, FIG. 34(a) being a plan view, FIG. 34(b) being a side view and FIG. 34(c) being a bottom view.
Figure 34B:
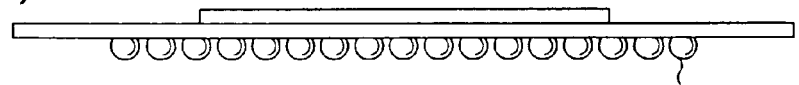
Figure 34C:
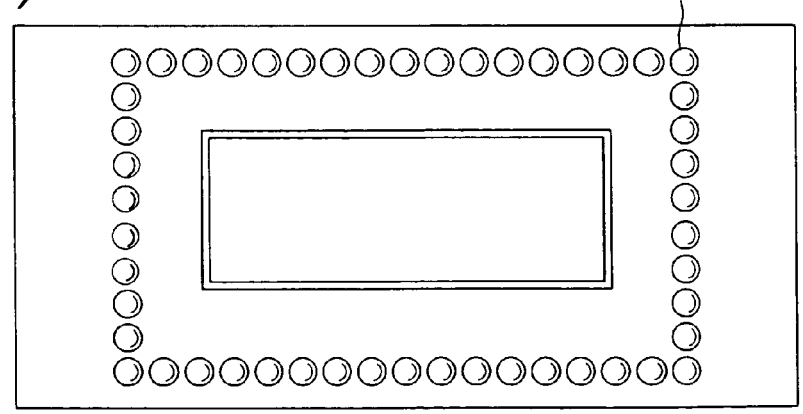

FIGS. 34(a), (b) and (c) are views showing the appearance of the electronic component 20(22) to be three-dimensionally mounted, (a) being a plan view, (b) being a side view and (c) being a bottom view. In the three-dimensional mounting method, the electronic component 20 is mounted on the circuit board 10 and is then mounted on the rear face of the electronic component 20 which has already been mounted. Thus, space saving can be attained by polymerizing a mounting space on the circuit board 10 for the electronic component 22 with the mounting space of the electronic component 20.

A detailed procedure for the three-dimensional mounting method will be sequentially described below with reference to FIGS. 35(a), (b), (c), (d), (e), (f), (g), and (h).

Figure 35A:
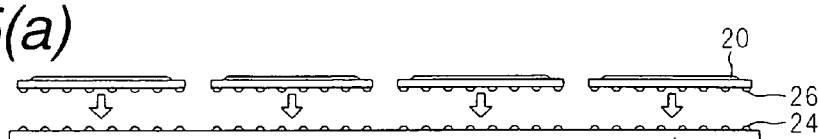
FIGS. 35(a), (b), (c), (d), (e), (f), (g), and (h) are views illustrating a procedure for a three-dimensional mounting method.

First of all, in FIG. 35(a), the electronic component 20 is mounted on the circuit board 10 such that the land position is coincident with the position of the solder ball (a first mounting step). The circuit board 10 has the land 24 formed in a position corresponding to each solder ball 26 of the electronic component 20. In this case, a board mark for position recognition on the circuit board 10 which is not shown is detected by the recognizing camera 135, thereby grasping an accurate land position and aligning the electronic component 20 with high precision.

Figure 35B:
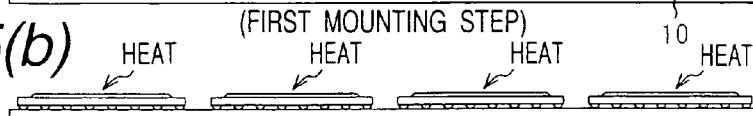

In FIG. 35(b), next, the electronic component 20 is mounted on one of the surfaces of the circuit board 10 and is then subjected to a reflow process. Thus, the solder cream is molten to connect the land 24 to the solder ball 26 electrically and mechanically and to fix the electronic component 20 onto the circuit board 10 (a first reflow step).

Figure 35C:
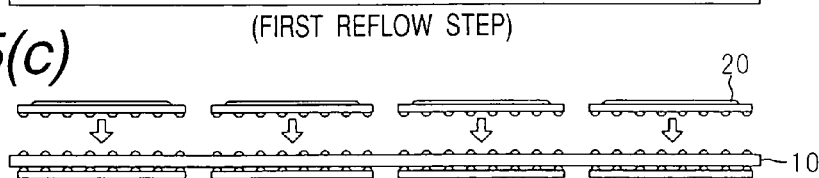
Figure 35D:
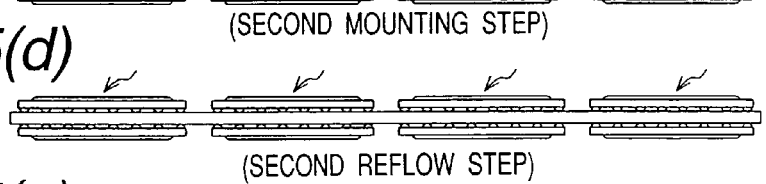

As shown in FIG. 35(c), subsequently, the circuit board 10 is turned over and the electronic component 20 is mounted on the reverse surface of the circuit board 10 (a second mounting step). As shown in FIG. 35(d), then, the circuit board 10 having the electronic component 20 mounted on a right side surface and the electronic component 20 fixed to a reverse side surface is subjected to the reflow process, thereby fixing the electronic component 20 on the right side surface onto the circuit board 10 in the same manner (a second reflow step).

Figure 35E:
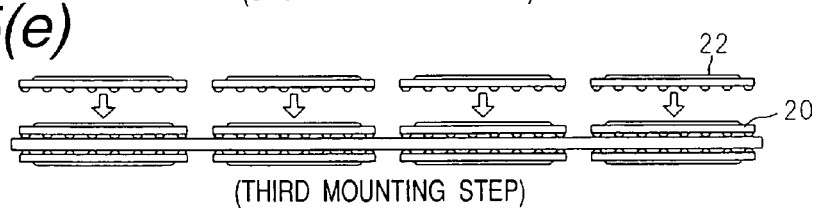

By these steps, a double-sided mounting board is obtained. In the two-dimensional mounting method, the following step is added. More specifically, as shown in FIG. 35(e), the electronic component 22 having a solder cream transferred to a solder ball is stacked and mounted on the upper surface of the electronic component 20 of the circuit board 10 which has been subjected to the second reflow step (a third mounting step).

Figure 35F:
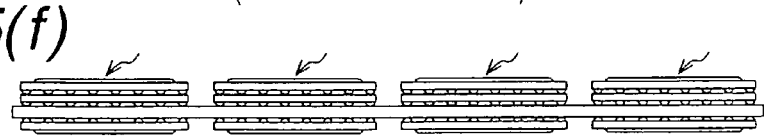
Figure 35G:
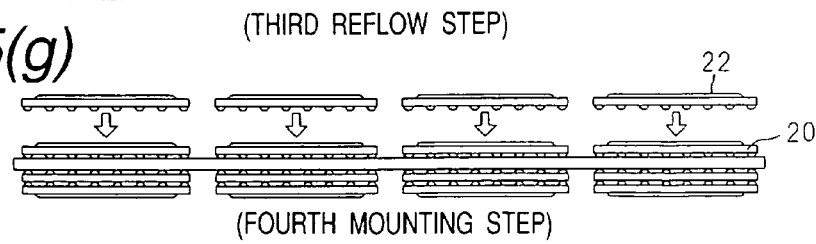
Figure 35H:
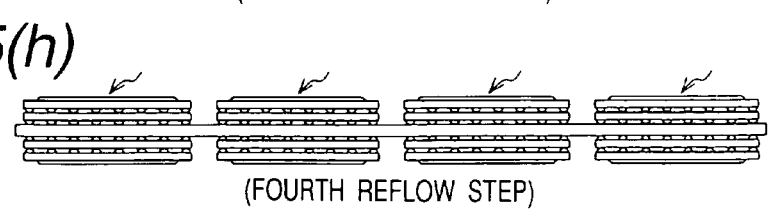

As shown in FIG. 35(f), next, the circuit board 10 thus stacked and mounted is subjected to a reflow process (a third reflow step). As shown in FIG. 35(g), furthermore, the circuit board 10 is turned over and the electronic component 22 is mounted on the upper surface of the mounted electronic component 20 in the same manner as in the third mounting step (a fourth mounting step). As shown in FIG. 35(h), the circuit board 10 is subjected to the reflow process (a fourth reflow step).

By repeating the steps subsequent to the third mounting step, the electronic component 20 (22) can be provided on the circuit board 10 in multi-stages. In order to carry out the reflow process over only a portion to be a reflow object on the circuit board 10, for example, a hot blast is blown against the right side surface of the circuit board 10 and a cold blast is blown against the back side surface, or the size of the solder ball 26 of the electronic component 20 provided on the upper layer of an electronic component to be stacked is reduced (a heat capacity is reduced). Thus, well-known means is preferably used together.

Moreover, while the BGA has been taken as an example of the electronic component 20 (22), it is not restricted but such a structure as to stack a QFP, an SOP and an SOJ (Small Out-line J-Leaded Package) on the BGA in addition to the CSP may be employed.

Figure 36:
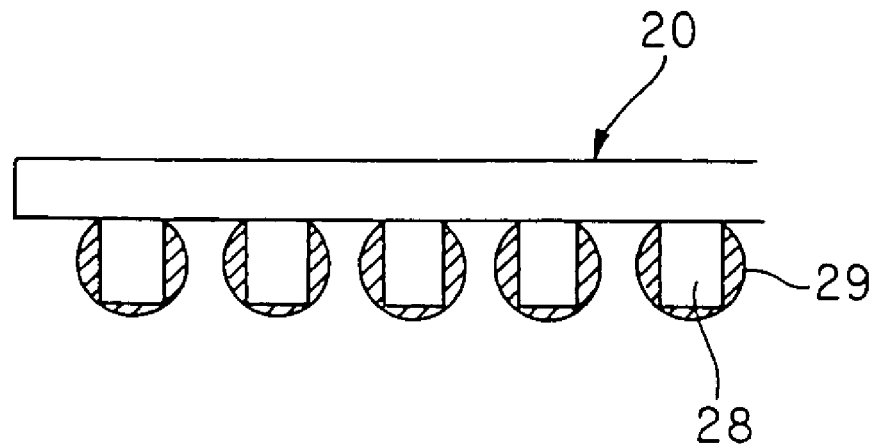
FIG. 36 is a view showing an example in which the solder ball of the electronic component is constituted by a combination of a pin and the solder ball.
Figure 37:
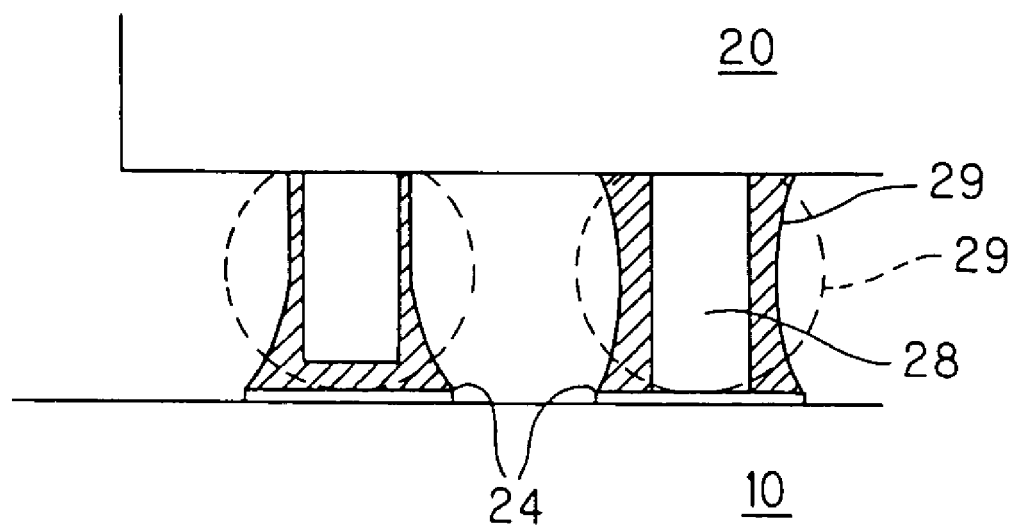
FIG. 37 is a view showing the state of a connecting terminal portion which is obtained after a reflow process.

In order to prevent melting when carrying out the reflow process plural times, the solder ball 26 of the electronic component 20 may be constituted by a combination of a cylindrical pin and a solder ball. More specifically, as shown in an example of FIG. 36, it is preferable that a heat-resistant pin 28 as in a general PGA (Pin Grid Array) should be provided as a terminal and the solder 29 should be fixed to the pin 28. According to such a structure, the solder 29 is molten and is solidified around the pin 28 to have a wettability in the state of a connecting terminal portion which is obtained after the reflow process in FIG. 37, and a shortage of the length of the solder 29 is absorbed so that the solder 29 is reliably connected to the land 24 even if the length of the pin 28 is not equal. More specifically, in the case in which a clearance between the circuit board 10 and the pin 28 is great, the fixed solder is molten and filled in the clearance. If the clearance is small, a large amount of the solder sticks to the peripheral surface of the pin 28. Moreover, the lower end of the pin 28 is caused to be flat so that the electronic component 20 can be stably fixed without inclining an attitude thereof from the circuit board surface. Furthermore, even if the solder 29 is exposed to a high heat by the reflow process again, it maintains to stick to the periphery of the pin 28 by a surface tension. Therefore, the electrodes can be prevented from being short-circuited.

Figures 38A, 38B, 38C, 38D:
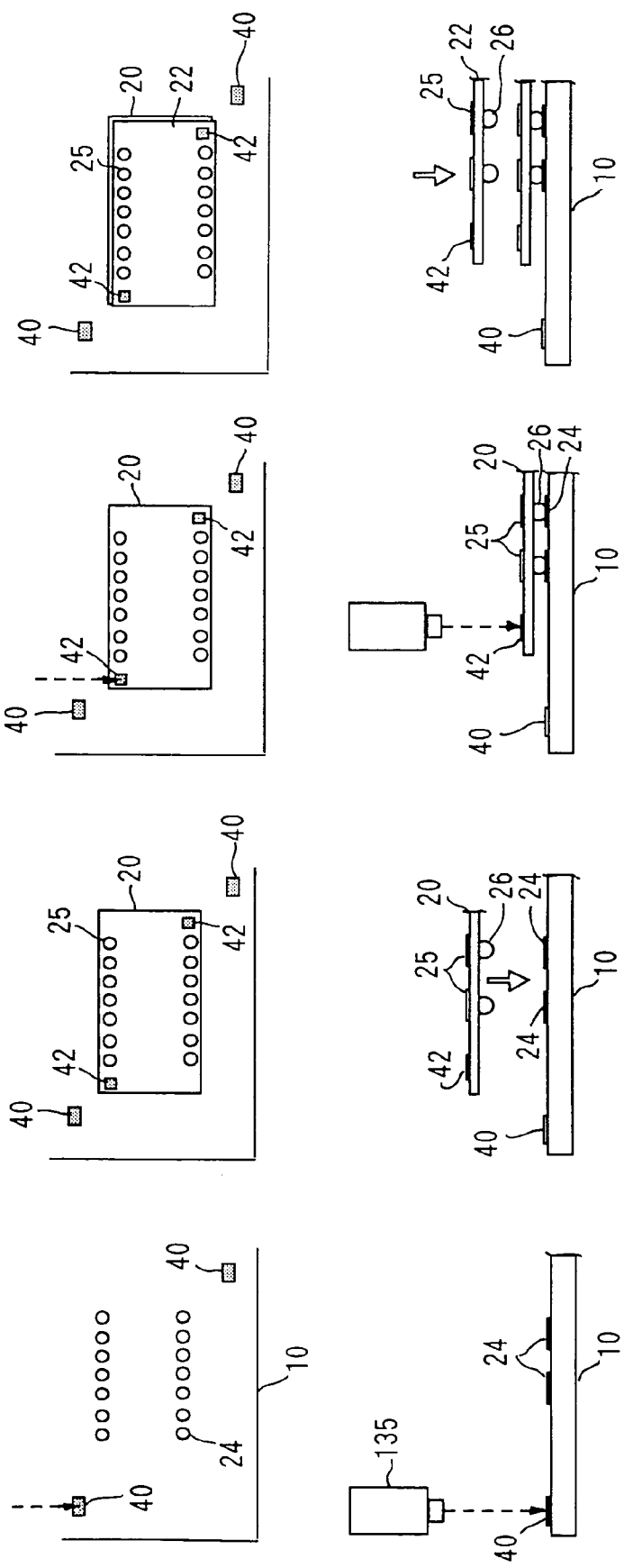
FIGS. 38(a), (b), (c), and (d) are views illustrating a method of aligning the electronic component in the three-dimensional mounting method.

Furthermore, it is preferable that the alignment of the electronic components in the three-dimensional mounting method should be carried out as shown in FIGS. 38(a), (b), (c), and (d). FIGS. 38(a), (b), (c), and (d) are views showing a procedure for aligning the electronic component on a stepwise basis, a plan view and a side view being illustrated together.

As shown in FIG. 38(a), first of all, the recognizing camera 135 detects board marks 40 and 40 for alignment provided on the circuit board 10. The board mark 40 is provided in a diagonal line position of an opposite side of the circuit board 10, for example, and the respective board marks 40 and 40 are detected to recognize the inclination and rotation component of the circuit board 10. As shown in FIG. 38(b), the amount of movement of the attachment head and the amount of rotation of the sucking nozzle are controlled corresponding to the result of the recognition, thereby correcting the position and mounting the electronic component 20 on the circuit board 10. Next, the electronic component 20 is mounted on the upper surface of the mounted electronic component 20. In that case, reference marks 42 and 42 for alignment are provided on the rear face of the electronic component 20 to be mounted, and the reference marks 42 and 42 are detected, thereby correcting the position. More specifically, by detecting the reference marks 42 and 42 on the rear face of the electronic component 20 by the recognizing camera 135 after mounting the electronic component 20 as shown in FIG. 38(c), the mounting positional shift of the mounted electronic component 20 is detected, and the electronic component 22 in a second stage is aligned and mounted on the rear face of the electronic component 20 as shown in FIG. 38(d) to cancel the mounting positional shift of the electronic component 20 thus detected.

Thus, the reference mark 42 for alignment is provided on the rear face of the electronic component 20. Consequently, the solder ball 26 of the electronic component 22 in the second stage can be stacked with high alignment precision in the position of a land 25 provided on the rear face of the electronic component 20 which has been mounted on the circuit board 10, and can be thus mounted on the rear face of the component having high precision.

At this time, while the board mark 40 on the circuit board 10 and the reference mark 42 on the electronic component 20 may be picked up by the same recognizing camera 135, the marks 40 and 42 having different heights may be picked up by switching a plurality of recognizing cameras having different focusing positions. Consequently, it is not necessary to regulate the height of the recognizing camera 135 and the focusing distance of the lens. Thus, the mark detection can be carried out rapidly.

Next, description will be given to a solder cream cleaning work for the solder cream transfer apparatus 200.

The squeegee unit 216 of the solder cream transfer apparatus 200 is to be cleaned for removing a solder cream when there is a possibility that the solder cream used at a last time and sticking to each squeegee might be solidified at the time of the start of the operation of the solder cream transfer apparatus 200. It is advantageous that the squeegee unit 216 is removed from the transfer unit 210 to carry out the cleaning work in respect of an enhancement in workability. However, it is necessary to carry out the cleaning work with high reproducibility precision in the attachment position of each component during an assembly. Therefore, it has conventionally been hard to obtain such a structure as to be cleaned rapidly.

In the structure of the solder cream transfer apparatus 200 according to the embodiment, the squeegee unit 216 is set to be of a removal type having a high cleaning work efficiency and to have a structure with high reproducibility of assembly precision in order to easily carry out the cleaning work for the solder cream. The procedure for the cleaning work of the solder cream transfer apparatus 200 will be sequentially described below.

First of all, two screws 270 of the squeegee unit 216 shown in FIGS. 12(a) and (b) are loosened and an upper V block 268 supporting one of ends is removed. Next, a screw 282 fixing an engagement portion 274 of the squeegee fixing member 250 on the other end shown in FIGS. 13(a) and (b) is loosened to remove the squeegee fixing member 250 shown in FIG. 9 from the housing 214. Consequently, the squeegee unit 216 is taken out in the state of a single body shown in FIG. 11. Then, the solder cream sticking to the squeegee surface of the squeegee unit 216 is removed to carry out cleaning such that the solidified solder cream is not left.

Then, the cleaned squeegee unit 126 from which the solder cream is removed is attached such that a key groove 276 of the engagement portion 274 is fitted in a projection 278 of the receiving table 280 reversely to the removal and the screw 282 is temporarily fixed. Next, an embedded pin 262 provided in the squeegee fixing member 250 is held to attach the upper V block 268 to a lower V block 266 with a screw 270 and each of the screws 282 and 270 is fastened.

Thus, one of the ends of the squeegee fixing member 250 is constrained by the fitting of the key groove 276 of the engagement portion 274 and the other end is supported on the V block so that the fixation can be carried out without twisting the squeegee fixing member 250. For this reason, the squeegee tips of the stirring squeegee 222 and the leveling squeegee 224 can be provided on the pan surface 220 of the transfer unit 210 with high parallelism and high positional precision.

As described above, according to the solder cream transfer apparatus 200 in accordance with the embodiment, the stirring squeegee stirs the solder cream over the transfer unit on the going path of the transfer unit and the leveling squeegee sets the solder cream stirred on the going path to have a predetermined thickness on the returning path of the transfer unit. As a result, a flat solder cream transfer surface is formed on the transfer unit. At this time, a protrusion for scraping the solder cream on the pan surface toward the central side in the longitudinal direction of the stirring squeegee is formed on the pan surface side of both ends in the longitudinal direction of the stirring squeegee. When the stirring squeegee is to be relatively moved again after the relative movement of the leveling squeegee, consequently, the solder cream overflowing from both ends in the longitudinal direction of the leveling squeegee during the relative movement of the leveling squeegee at the last time can be scraped toward the central side in the longitudinal direction of the squeegee by a formed discharge portion. Therefore, it is possible to prevent the solder cream from overflowing from the pan surface of the transfer unit.

According to the electronic component mounting apparatus 100 in accordance with the embodiment, moreover, a desirable electronic component is sucked and held through the sucking nozzle from an electronic component supply member having a plurality of electronic components mounted thereon and is positioned on the transfer unit of the solder cream transfer apparatus by moving the attachment head through the head moving portion. Then, the attachment head is brought up and down to immerse the terminal portion of the electronic component in the solder cream transfer surface on the transfer unit and to transfer the solder cream to the electronic component. Consequently, the solder cream can be uniformly transferred to the electronic component so that the electronic component can be mounted into a predetermined position.

Furthermore, the electronic component (semiconductor device) to be used for the electronic component mounting apparatus according to the embodiment is provided with the land for terminal connection in a position corresponding to the connecting terminal of the electronic component on the rear face side of the electronic component. Consequently, the land of the electronic component on the lower stage side and the connecting terminal of the electronic component on the upper stage side are aligned to stack the electronic components so that the stack structure of the electronic components can be obtained. Thus, the mounting efficiency of the electronic component can be enhanced so that the mounting can be carried out at a higher density.

While the electronic component mounting apparatus 100 for moving the transfer head 128 in an X-Y plane has been described as an example in the embodiment, it is not restricted but an electronic component mounting apparatus of a rotary type may be used. The electronic component mounting apparatus of the rotary type has a head constituted by a cylindrical cam and serves to position and move ten stations, for example, and to move and position the circuit board into a predetermined position over the X-Y table, thereby mounting the electronic component.

Moreover, the solder cream transfer apparatus 200 can transfer a viscous fluid such as a flux, a silver paste or a conductive paste in addition to the transfer of the solder cream.

Next, description will be given to a second embodiment of the viscous fluid transfer apparatus according to the invention.

The viscous fluid (solder cream) transfer apparatus according to the embodiment has the feature of the tip shape of the leveling squeegee of the squeegee unit 216.

Figure 39:
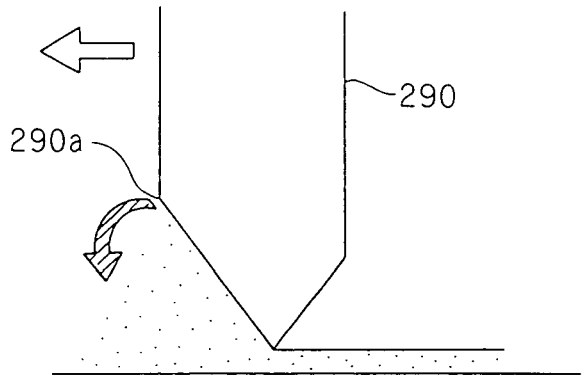
FIG. 39 is an enlarged view showing the tip potion of a leveling squeegee according to a second embodiment.

More specifically, a leveling squeegee 290 according the embodiment has a flat and elongated shape in the same manner as that in the first embodiment and a tip portion is formed to have a simple V-shaped cut in FIG. 39 showing the enlarged tip portion. According to the leveling squeegee, an excessive solder cream is dropped downward and returned at a corner portion 290a. Consequently, the solder cream can be prevented from being transmitted to the upper part of the squeegee 290. Moreover, the simple V-shape can reduce the manufacturing cost of the squeegee.

Figure 40A:
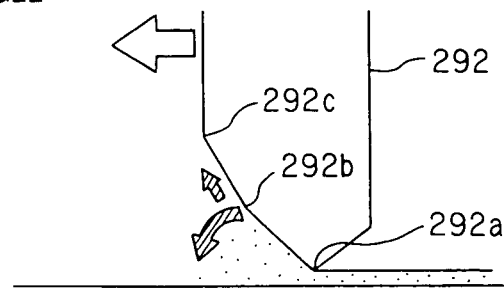
FIGS. 40(a) and (b) are views showing the shape of the leveling squeegee and the state of squeegee movement according to a variant of the second embodiment.

According to a variant of the embodiment, furthermore, the shape of a leveling squeegee shown in FIGS. 40(a) and (b) may be employed. The tip potion of the leveling squeegee 292 is provided with a corner portion 292a having a V-shaped cut, and furthermore, a corner portion 292b having an obtuse section and protruded outward is formed in the longitudinal direction of the squeegee in the middle of an inclined surface in the forward part in the direction of progress of the squeegee. Accordingly, the corner portions 292a, 292b and 292c are formed in the direction of progress of the squeegee from the tip portion of the squeegee.

Figure 40B:
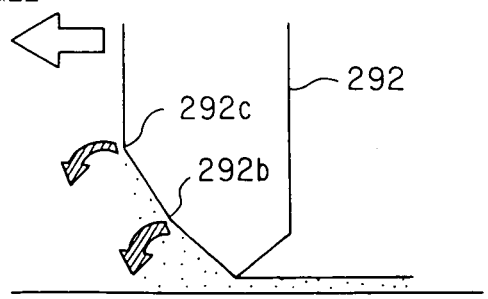

According to the leveling squeegee 292, as shown in FIG. 40(a) illustrating the state of the movement of the squeegee, the solder cream is pressurized and extended by the corner portion 292a to form a layer having a uniform solder cream thickness, and the excessive solder cream is stirred along the inclined surface between the corner portion 292a and the corner portion 292b and is dropped downward and returned at the corner portion 292b. Even if the excessive solder cream is transmitted upward from the corner portion 292b, the solder cream is dropped downward and returned by the corner portion 292c as shown in FIG. 40(b). Thus, it is possible to reliably prevent the solder cream from being transmitted to the upper part of the squeegee 292. Thus, the stirred solder cream is always put in a uniform thickness.

Next, description will be given to a third embodiment of the viscous fluid transfer apparatus according to the invention.

Figure 41:
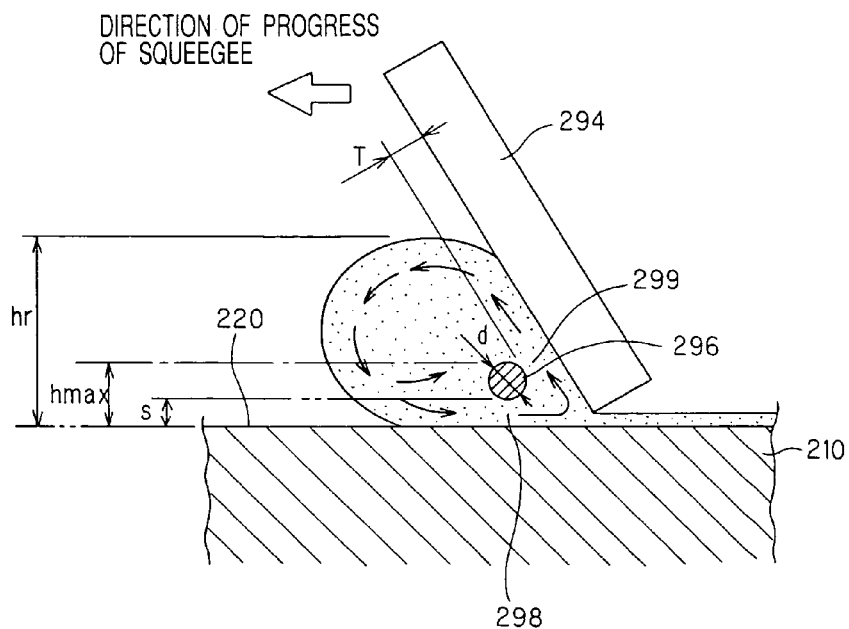
FIG. 41 is a side view showing the structure of attachment of a pressure generating member according to a third embodiment.

The viscous fluid (solder cream) transfer apparatus according to the embodiment is provided with a pressure generating member 296 for stably putting a solder cream in the vicinity of the tip of a leveling squeegee 294 of the squeegee unit 216. FIG. 41 is a side view showing the structure of the attachment of the pressure generating member 296. The leveling squeegee 294 and the pressure generating member 296 are supported independently so that relative attachment positions thereof can be regulated.

The pressure generating member 296 has a rod body taking a circular section and is attached to a bracket which is not shown, and is supported in parallel with the leveling squeegee 294 in the longitudinal direction of the leveling squeegee 294 in the vicinity of the tip of the leveling squeegee 294. Moreover, the pressure generating member 296 is formed of a high rigid material such as a metal, ceramics or hard plastics and reduces the generation of a flex.

The squeegee 294 forms a narrow path 298 having a small clearance S between the pressure generating member 296 and the pan surface 220 of the transfer unit 210, and a passage 299 having a clearance T to be a passage for the solder cream to be rolled is also formed between the pressure generating member 296 and the squeegee 294. The clearances S and T of the narrow passage 298 and the passage 299 are set to range from approximately 1 mm to 3 mm, for example.

By providing the pressure generating member 296 forming the clearances S and T, the solder cream to be rolled with the movement of the squeegee 294 which passes through the narrow passage 298 and the passage 299 is brought in a higher pressure state than in other regions. As a result, the solder cream is pushed uniformly and stably to the clearance between the squeegee 294 and the pan surface 220 of the transfer unit 210 so that a solder cream transfer surface having a more uniform thickness can be formed. Moreover, even if a squeegee speed is high, the solder cream can be put on the pan surface 220 stably in a predetermined thickness.

The shape of the pressure generating member 296 is not restricted to a rod but various shapes such as a semispherical sectional shape or a wedge sectional shape may be utilized. Moreover, the pressure generating member 296 is provided such that it has a maximum height $h_{max}$ from the pan surface 220 of the transfer unit 210 than a rolling height $h_r$ of the solder cream during the formation of the solder cream transfer surface and it is embedded in the solder cream during the rolling.

Furthermore, the pressure generating member 296 according to the embodiment may be provided in the stirring squeegee 222 so that the stirring effect can be enhanced still more.

Next, description will be given to a fourth embodiment of the viscous fluid transfer apparatus according to the invention.

The viscous fluid (solder cream) transfer apparatus according to the embodiment has such a structure that a protrusion to be formed in the stirring squeegee of the squeegee unit 216 is provided in plural portions between both ends of the squeegee and the apparatus.

Figure 42A:
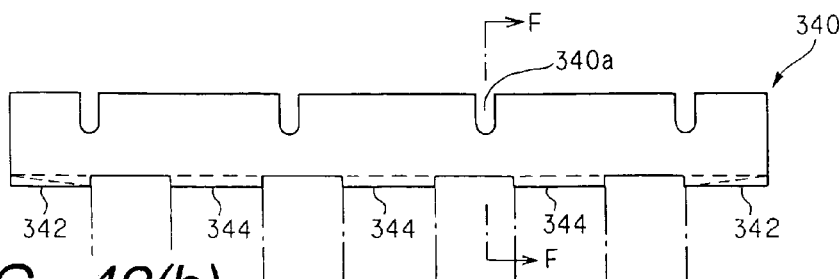
FIGS. 42(a) and (b) are views showing the shape of a stirring squeegee according to a fourth embodiment.
Figure 42B:
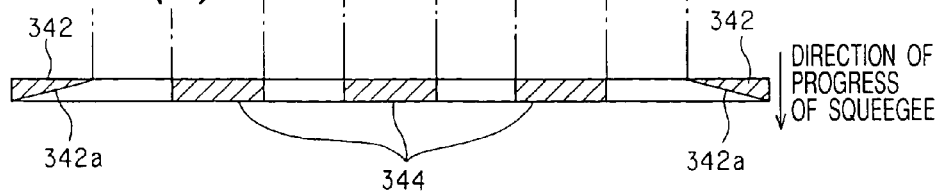
Figure 43:
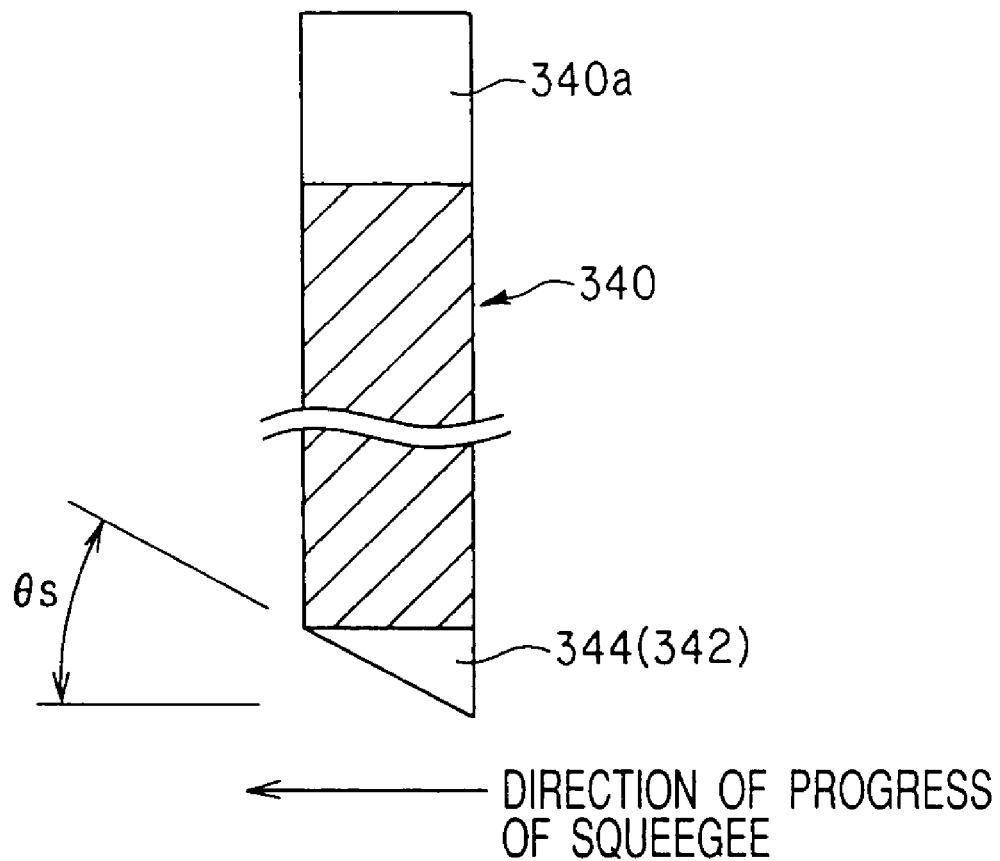
FIG. 43 is a sectional view taken along F—F in FIGS. 42(a) and (b).

FIGS. 42(a) and (b) shows the shape of a stirring squeegee 340 according to the embodiment, FIG. 42(a) being a front view and FIG. 42(b) being a side view. Moreover, FIG. 43 is a sectional view taken along F—F in FIGS. 42(a) and (b). A portion shown in a slant line of FIG. 42(b) indicates the lowermost surface of the stirring squeegee 340.

As shown in FIGS. 42(a), 42(b), and 43, the plate-shaped stirring squeegee 340 has a fixing hole 340a to the squeegee fixing member 250 provided on one of the sides of a long side, and a protrusion 342 having a triangular longitudinal section provided with a taper face 342a for scraping the solder cream toward the central side in the longitudinal direction of the squeegee with the movement of the squeegee is formed on the pan surface side to be the push side of the solder cream at a lower end shown in FIG. 42(a) on both ends in the longitudinal direction. Furthermore, a plurality of intermediate protrusions 344 having a triangular longitudinal section is provided between both protrusions 342 so that the shape of a comb tooth is taken. The stirring squeegee 340 is used in a forward inclination state in the direction of progress of the squeegee by a predetermined angle $\theta_s$. Therefore, the protrusion 342 and the intermediate protrusion 344 in the squeegee 340 are cut at the angle $\theta_s$ as shown in FIG. 43.

It is preferable that a proper number of intermediate protrusions 344 should be provided corresponding to the number of attachment heads 138 provided in the transfer head 128. In the embodiment, the four attachment heads 138a, 138b, 138c and 138d (see FIGS. 28(a), (b), and (c)) are used. Therefore, three intermediate protrusions 344 are provided such that solder cream outlets are formed in four lines in total.

FIGS. 44(a), (b), (c), and (d) are views illustrating a state in which the solder cream transfer surface is formed on the transfer unit 210 by using the stirring squeegee 340 according to the embodiment. The function of the stirring squeegee 340 according to the embodiment will be described with reference to FIGS. 44(a), (b), (c), and (d).

First of all, as shown in FIG. 44(a), the solder cream 30 is mounted almost uniformly on the pan surface 220 of the transfer unit 210. As shown in FIG. 44(b), next, the stirring squeegee 340 according to the embodiment is moved toward the left side in the drawing, thereby stirring the solder cream 30 and putting the solder cream 30 on the pan surface 220. At this time, a position where the solder cream 30 is to be put is divided by the intermediate protrusion 344 and the solder cream 30 is put like a band in four lines in the drawing. In other words, the solder cream is partially scraped from the pan surface of the transfer unit so that the stirring effect can be enhanced still more.

As shown in FIG. 44(c), furthermore, when the leveling squeegee 224 is moved toward the right side in the drawing, the solder cream transfer surface having a uniform thickness is obtained on the pan surface 220, while the excessive solder cream overflows from both end sides of the leveling squeegee 224 and is put as the excessive solder cream 32 on the end of the pan surface 220. The excessive solder cream 32 is scraped toward the central side in the longitudinal direction of the stirring squeegee 340 by moving the stirring squeegee 340 again toward the left side in the drawing in the same manner as that in the first embodiment shown in FIGS. 23(a), (b), (c), and (d), and is put again in such a state as to be sufficiently stirred in the vicinity of the central part of the pan surface 220 in the same manner as in FIG. 44(b).

Next, description will be given to a fifth embodiment of the viscous fluid transfer apparatus according to the invention.

In the viscous fluid (solder cream) transfer apparatus according to the embodiment, a plurality of intermediate protrusions 344 provided in the stirring squeegee 340 according to the fourth embodiment has such a shape that a passage for a solder cream is tapered in the direction of progress of the squeegee.

Figure 45A:
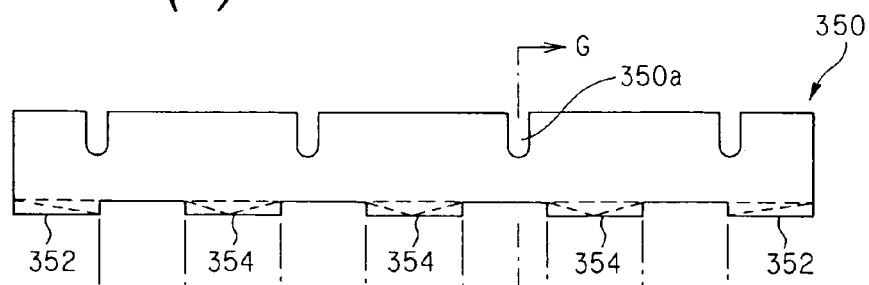
Figure 45B:
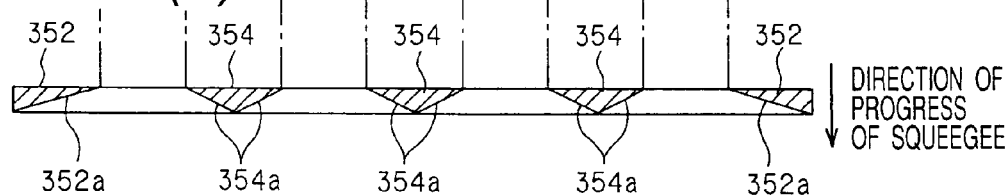

FIGS. 45(a) and (b) show the shape of a stirring squeegee 350 according to the embodiment, FIG. 45(a) is a front view and FIG. 45(b) is a side view. Moreover, FIG. 46 is a sectional view taken along G—G in FIGS. 45(a) and (b).

Figure 46:
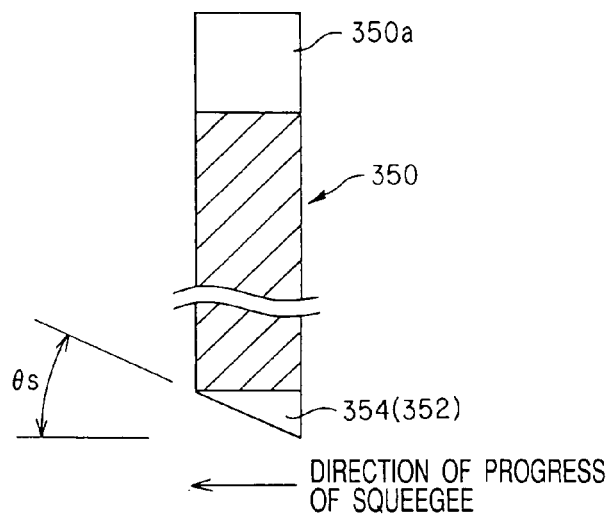
FIG. 46 is a sectional view taken along G—G in FIGS. 45(a) and (b).

As shown in FIGS. 45(a), 45(b), and 46, the stirring squeegee 350 is formed to have the shape of a comb tooth in the same manner as in the fourth embodiment and is provided with a fixing hole 350a to the squeegee fixing member 250, a protrusion 352 taking a triangular longitudinal section which has a taper face 352a formed therein and a plurality of intermediate protrusions 354 having a triangular longitudinal section. Moreover, the protrusion 352 and the intermediate protrusion 354 in the squeegee 350 are cut at an angle $\theta_s$ as shown in FIG. 46. The intermediate protrusion 354 is formed with a taper face 354a for scraping a solder cream toward the central side of each clearance with the movement of the squeegee between the protrusion 352 and the intermediate protrusion 354 and between the intermediate protrusions 354 as shown in FIG. 45(b). As shown in FIG. 45(b) illustrating the end of the stirring squeegee 350 in a slant line portion, a lowermost surface is formed to have a triangular shape and the taper face 354 is inclined to be tapered for narrowing the passage for the solder cream in the direction of progress of the squeegee.

According to the shape of the stirring squeegee 350 in accordance with the embodiment, the protrusion 352 and the intermediate protrusion 354 which are provided on this side in the direction of progress of the stirring squeegee 350 act as the taper faces 352a and 354a inclined with respect to the squeegee surface. Therefore, the solder cream smoothly flows into each clearance. Consequently, it is possible to more reliably prevent the solder cream from overflowing from both ends in the lateral direction of the stirring squeegee 350. Moreover, the passage for the solder cream flowing in each clearance is narrowed with the movement of the stirring squeegee 350 and the stirring function of the solder cream becomes much greater.

Next, description will be given to a sixth embodiment of the viscous fluid transfer apparatus according to the invention.

In the viscous fluid (solder cream) transfer apparatus according to the embodiment, the height of the solder cream transfer surface of the solder cream put on the pan surface 220 of the transfer unit 210 is preset to be a predetermined height from the pan surface 220.

Figure 47:
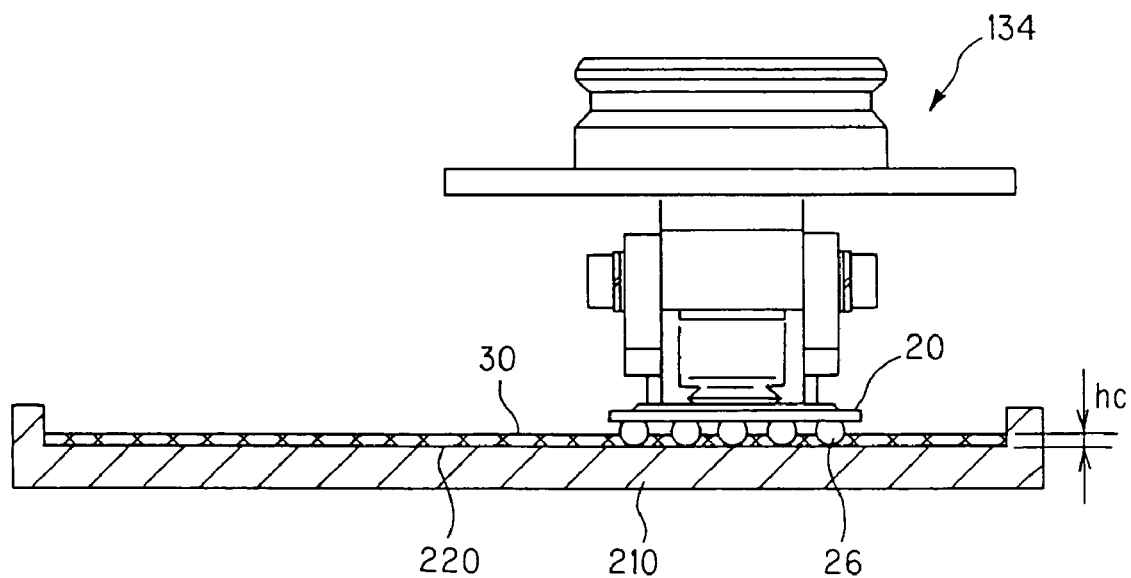
FIG. 47 is a view showing the state of solder cream transfer according to a sixth embodiment.

FIG. 47 is a view showing a state in which the solder cream is transferred according to the embodiment, illustrating the relationship between the solder cream 30 put on the pan surface 220 of the transfer unit 210 and the solder ball 26 of the electronic component 20 sucked into the sucking nozzle 134. More specifically, a height $h_c$ of the transfer surface of the solder cream put on the pan surface 220 of the transfer unit 210 according to the embodiment is set to be such a height that the solder ball 26 of the electronic component 20 is immersed at a height which is equal to or smaller than a radius r, preferably, a height of 0.8 r or less when the sucking nozzle 134 sucking the electronic component 20 is pushed against the pan surface 220.

In this case, the height hc of the transfer surface of the solder cream is determined by the clearance between the tip portion of the leveling squeegee 224 and the pan surface 220 of the transfer unit 210 and the height hc is controlled by regulating the height of the leveling squeegee 224. More specifically, during initial regulation, the screw 234 of the arm stopper 232 shown in FIG. 7 is protruded downward such that the leveling squeegee 224 is caused to rise by the height hc from the pan surface 220 of the transfer unit 210. Consequently, the rocking control arm 226d contacts on the tip of the screw 234 during the rocking operation of the rocking arm 226 so that a height from the pan surface 220 of the leveling squeegee 224 is held by hc.

By such a simple operation as to set the height hc of the transfer surface of the solder cream to be a defined height and to push the sucking nozzle 134 against the pan surface 220 until the terminal portion of the electronic component 20 contacts on the pan surface 220 of the transfer unit 210, thus, the solder cream can be given in a proper amount to the electronic component 20.

Next, description will be given to a seventh embodiment of the viscous fluid transfer apparatus according to the invention.

The viscous fluid (solder cream) transfer apparatus according to the embodiment is provided with a stepped portion for suspending the leveling squeegee 224 and causing the same to rise upward such that the height of the solder cream transfer surface can be always constant when the solder cream is to be put on the pan surface of the transfer unit.

Figure 48:
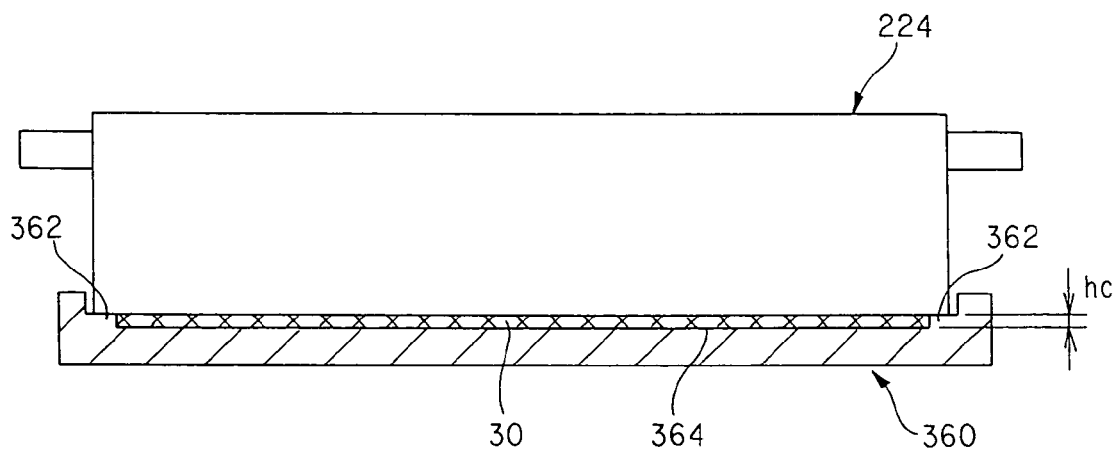
FIG. 48 is a view showing the section of a transfer unit and a leveling squeegee to slidably come in contact with the transfer unit according to a seventh embodiment.

FIG. 48 shows the section of a transfer unit 360 and the leveling squeegee 224 to slidably come in contact with the transfer unit 360 according to the embodiment. A stepped portion 362 for raising the leveling squeegee 224 by the height ha is protruded from the pan surface 364 and is provided in the direction of the movement of the squeegee on both ends in the direction of squeegee delivery of the transfer unit 360 according to the embodiment. The lower tip portion of the leveling squeegee 224 slidably comes in contact with the stepped portion 362 so that the solder cream is extended by the clearance having the height hc which is formed between the leveling squeegee 224 and the pan surface 364 of the transfer unit 360. Accordingly, the solder cream is formed in a uniform thickness (height hc) and the solder cream transfer surface parallel with the pan surface 364 is stably formed.

Figure 49:
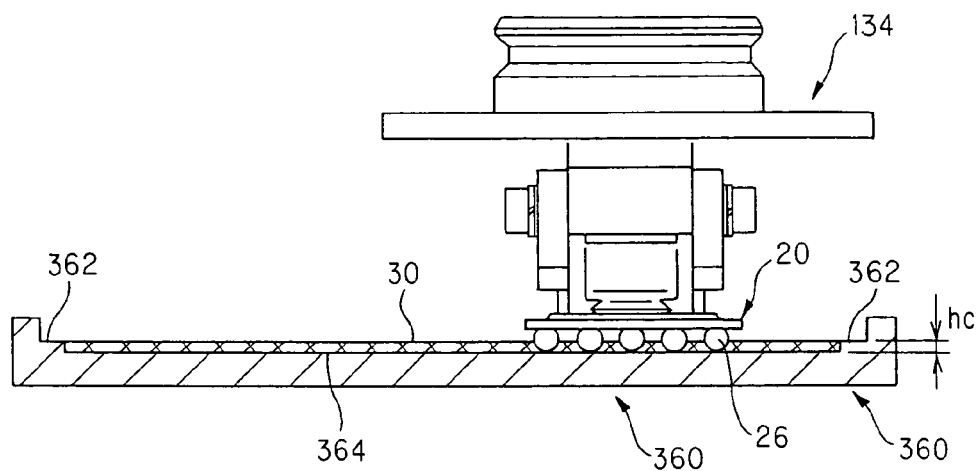
FIG. 49 is a view showing a state in which a solder cream is transferred to an electronic component sucked by a sucking nozzle over a formed solder cream transfer surface.

FIG. 49 shows a state in which the solder cream is transferred to the electronic component 20 sucked by the sucking nozzle 134 over the formed solder cream transfer surface. As shown in FIG. 49, the sucking nozzle 134 is pushed against the pan surface 364 until the terminal portion (solder ball 26) of the electronic component 20 contacts on the pan surface 364 of the transfer unit 360 so that the solder cream is given in a proper amount to the electronic component 20. The height hc is set to the radius r of the solder ball 26 or less, preferably a height of 0.8 r from the lower end of the solder ball 26. While the leveling squeegee 224 according to the first embodiment can be used, it is not restricted but a structure may be simplified by using a simple plate-shaped squeegee.

Figure 50:
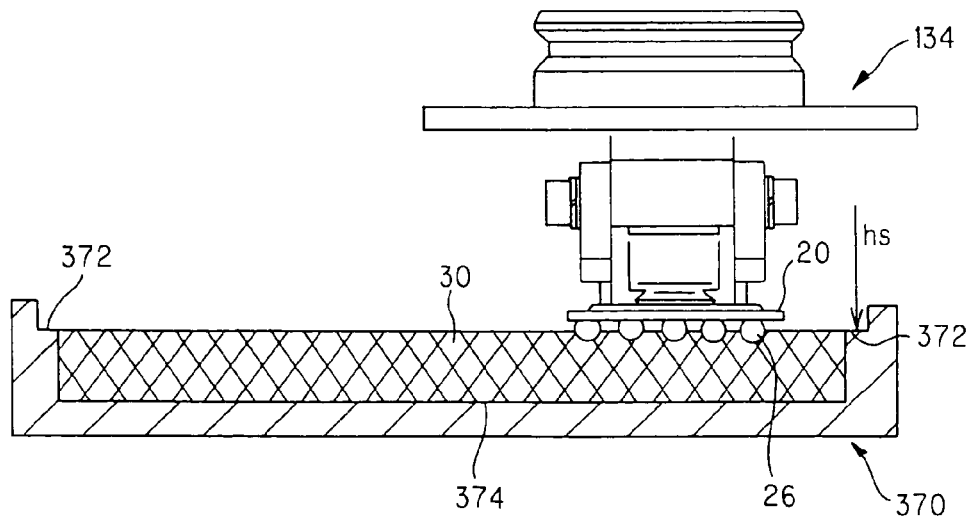
FIG. 50 is a view showing a structure in which a stepped portion is provided in a higher position than the radius of a solder ball from the pan surface of the transfer unit.

Moreover, the transfer unit 360 according to the embodiment may be constituted to have a deep bottom. In this case, a stepped portion is used for simply flattening the solder cream transfer surface. More specifically, as shown in FIG. 50, a stepped portion 372 is provided in a higher position than the radius r of the solder ball 26 from a pan surface 374 of a transfer unit 370 and the lower tip portion of the leveling squeegee is caused to contact on the stepped portion 372 and is moved so that a flat solder cream transfer surface which is face aligned with the stepped portion 372 is obtained. The sucking nozzle 134 is brought down toward the obtained solder cream transfer surface such that the solder ball 26 of the electronic component 20 is immersed in the solder cream by the predetermined height hc, in more detail, up to a height which is equal to or smaller than the radius r of the solder ball, preferably up to the height of 0.8 r or less from the lower end of the solder ball 26. Consequently, the solder cream is given in a proper amount to the electronic component 20. At this time, the amount of the fall of the sucking nozzle 134 is accurately set by previously detecting a height hs of the stepped portion 372 through a length measuring sensor, for example.

According to such a structure, the solder cream is put in a sufficient amount over the transfer unit 370. Therefore, the solder cream is dried more slowly than that in the case in which the solder cream is extended thinly, and a cycle of automatic stirring control can be set to be longer so that the solder cream transfer surface can be held easily.

Figure 51:
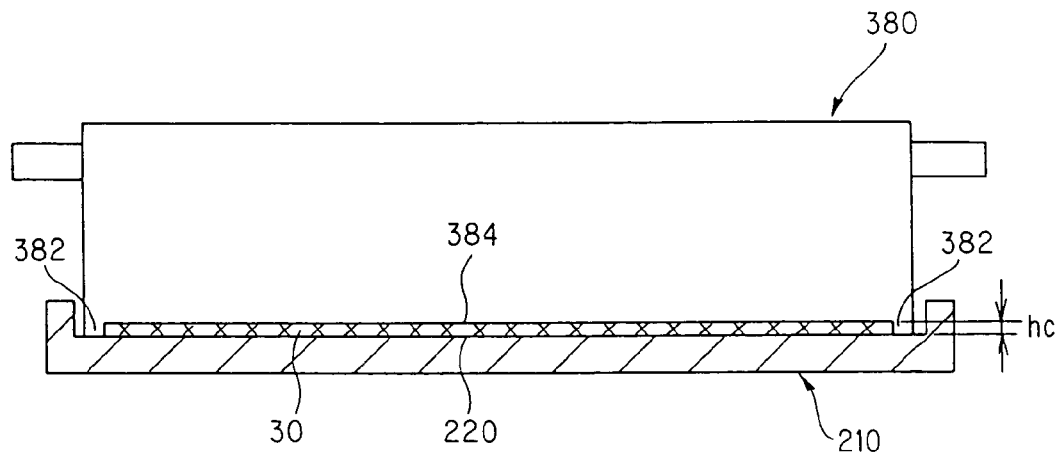
FIG. 51 is a view showing a structure in which a stepped portion is provided in a leveling squeegee according to a variant of the seventh embodiment.

Moreover, FIG. 51 shows a structure in which a stepped portion is provided in the leveling squeegee as a variant of the embodiment. As shown in FIG. 51, a stepped portion 382 protruded by the height of hc is formed on both ends of the leveling squeegee 380 according to the variant. Consequently, when the stepped portion 382 is caused to contact on the pan surface 220 of the transfer unit 210, a clearance having the height of hc is formed between the pan surface 220 and a lower tip portion 384 of the leveling squeegee 380. In this case, the same structure of the transfer unit 210 as that in the first embodiment can be used.

Figure 52:
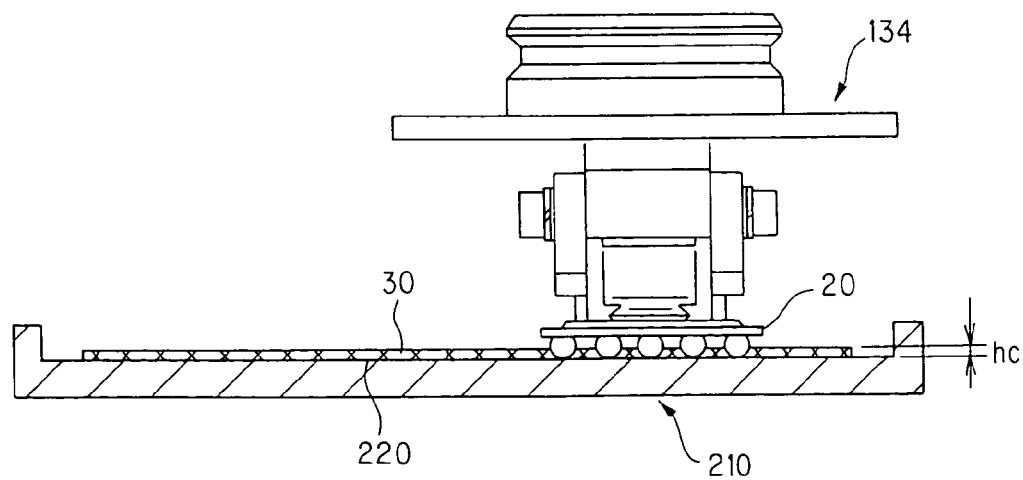
FIG. 52 is a view showing a state obtained during the transfer of a solder cream.

By using the leveling squeegee 380, the solder cream 30 can easily be put on the pan surface 220 of the transfer unit 210 at the desirable height hc from the clearance. As shown in FIG. 52 illustrating the state of the transfer of the solder cream, the electronic component 20 is pushed against the formed solder cream transfer surface so that the solder cream can be given in a proper amount to the electronic component 20.

According to the structures in accordance with the embodiment and the variant thereof, it is not necessary to finely control the heights of the leveling squeegees 224 and 380 through the arm stopper 232 shown in FIG. 7. Consequently, the control work can be simplified considerably. In other words, by pushing the leveling squeegee 224 against the stepped portions 362 and 372 of the transfer units 360 and 370, and furthermore, by pushing the stepped portion 382 of the leveling squeegee 380 against the pan surface 220 of the transfer unit 210, it is possible to easily obtain the structure without requiring the fine control of the clearance having a predetermined height between the leveling squeegee and the pan surface of the transfer unit. In order to change the thickness of the solder cream transfer surface, it is preferable that the height of the stepped portion should be varied. It is preferable that a plurality of leveling squeegees and a plurality of transfer units formed by somewhat changing the height of the stepped portion should be prepared and selectively combined to have a properly desirable height according to the type of the electronic component.

Next, description will be given to an eighth embodiment of the viscous fluid transfer apparatus according to the invention.

The viscous fluid (solder cream) transfer apparatus according to the embodiment has such a structure that the pan surface of the transfer unit is extended in the direction of the squeegee delivery so that the number of times at which a plurality of attachment heads can be transferred at the same time over the same solder cream transfer surface can be increased.

Figure 53:
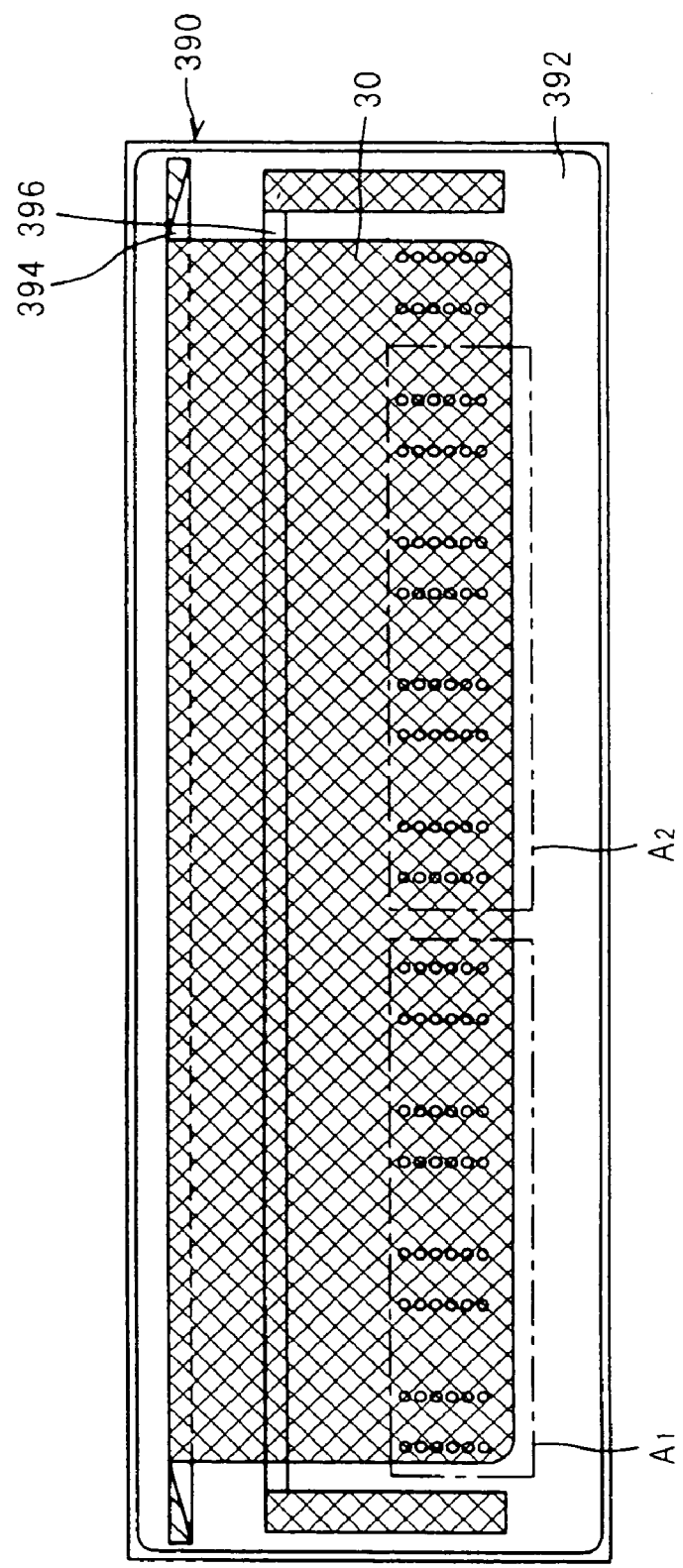
FIG. 53 is a plan view showing the transfer unit of a solder cream transfer apparatus according to an eighth embodiment.

FIG. 53 is a plan view showing a transfer unit 390 of the solder cream transfer apparatus according to the embodiment. In the transfer unit 390, a pan surface 392 is formed to have a greater width than a double of the attachment head arrangement width of a multi-head including a plurality of attachment heads such that a simultaneous transfer operation can be carried out plural times through the multi-head. FIG. 53 shows a structure as an example. In this example structure, the four attachment heads can operate to transfer simultaneously as shown in regions $A_1$ and $A_2$ of the solder cream transfer surface.

Moreover, while the transfer unit 390 is formed widely and a stirring squeegee 394 and a leveling squeegee 396 are also elongated. They are not restricted, but a plurality of squeegees is allowable in such situation that the plurality of squeegees are combined to be substantially elongated.

According to the solder cream transfer apparatus according to the embodiment, thus, the pan surface 392 of the transfer unit 390 is widely formed so that the simultaneous transfer operation can be carried out through the multi-head plural times and the operation for mounting the electronic component can be executed smoothly to shorten a mounting tact.

Next, description will be given to a ninth embodiment of the viscous fluid transfer apparatus according to the invention.

A viscous fluid (solder cream) transfer apparatus 400 according to the embodiment has such a structure that a solder cream is stirred and put on the belt surface of a belt conveyer and a new solder cream transfer surface can be formed continuously.

First of all, the structure of the solder cream transfer apparatus 400 will be described.

Figure 54:
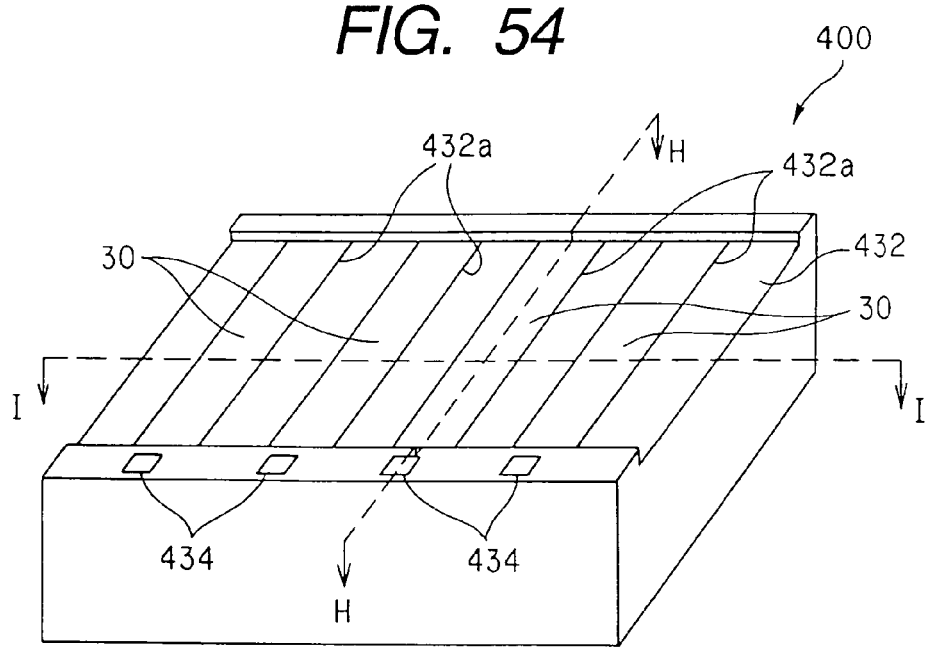
FIG. 54 is a view showing the schematic structure of a solder cream transfer apparatus according to a ninth embodiment.
Figure 55:
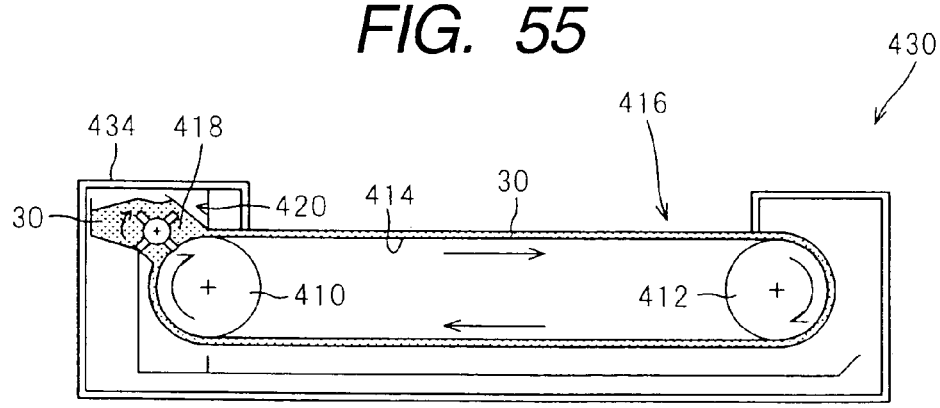
FIG. 55 is a sectional view taken along H—H in FIG. 54.
Figure 56:
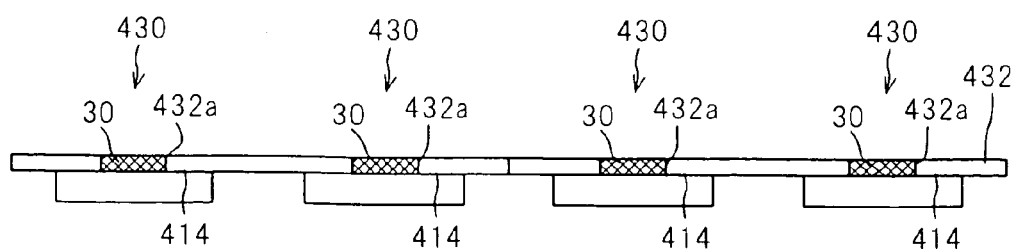
FIG. 56 is a partial sectional view taken along I—I in FIG. 54.

FIG. 54 shows the schematic structure of the solder cream transfer apparatus 400 according to the embodiment, FIG. 55 is a sectional view taken along H—H in FIG. 54, and FIG. 56 is a partial sectional view showing a section taken along I—I in FIG. 54.

As shown in FIGS. 54 to 56, the solder cream transfer apparatus 400 according to the embodiment has a belt type transfer surface forming mechanism 430 arranged in a plurality of lines (four lines in the drawings). The belt type transfer surface forming mechanism 430 comprises a belt conveyer 416 including a flat belt surface 414 having both ends provided between pulleys 410 and 412, a motor for rotating the pulley 410 in one direction which is not shown, a stirring mechanism 418 for stirring the solder cream 30 by the operation of the belt conveyer 416, and a squeegee 420 for putting the solder cream 30 stirred by the stirring mechanism 418 with a uniform thickness over the belt surface 414 of the belt conveyer 416.

The upper surface of the solder cream transfer apparatus 400 is provided with a top plate 432 which has the same height as that of the solder cream transfer surface formed on the belt surface 414 of the belt conveyer 416 and has opening windows 432a, 432a, . . . formed on the belt type transfer surface forming mechanisms 430, 430 . . . . Moreover, the upper surface of the end of the solder cream transfer apparatus 400 is provided with a solder cream supply port 434 and the apparatus is filled with the solder cream in a proper amount.

The motor may collectively rotate the pulley 410 of the belt type transfer surface forming mechanism 430.

Next, description will be given to the formation of a solder cream transfer surface and an operation for transferring a solder cream to an electronic component in the solder cream transfer apparatus 400 having the structure described above.

First of all, as shown in FIG. 55, a predetermined amount of the solder cream is filled in the apparatus through the solder cream supply port 434 and the motor rotates the pulley 410. Consequently, the belt surface 414 of the belt conveyer 416 is moved between the pulleys 410 and 412 in the direction of an arrow in the drawing. The solder cream 30 thus supplied is stirred by the stirring mechanism 418 rotated by the pulley 410 and provided with a plurality of stirring plates in a radial direction, for example, and is put on the belt surface 414 wound upon the pulley 410. Then, the solder cream is flatly put in a predetermined thickness over the belt surface 414 through the squeegee 420 with the rotation of the pulley 410.

A part of the belt surface 414 in a transverse direction is opened by an opening window 434a of the top plate 432 as shown in FIGS. 54 and 56 and the solder cream is flatly put on the belt surface 414 provided just below the opening. Moreover, the solder cream is put to have almost the same height as the thickness of the top plate 432. When the pulley 410 is continuously rotated, the belt surface 414 is moved so that a solder cream transfer surface having a predetermined thickness is continuously formed.

Figure 57A:
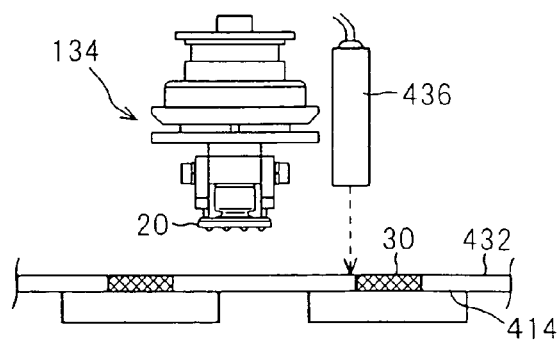
FIGS. 57(a), (b), and (c) are views showing a procedure for transferring a solder cream to an electronic component by the solder cream transfer apparatus on a stepwise basis.
Figure 57B:
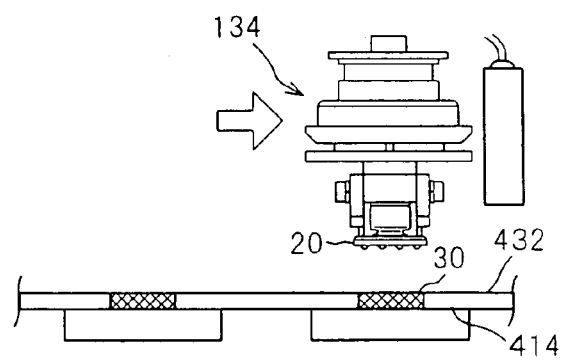
Figure 57C:
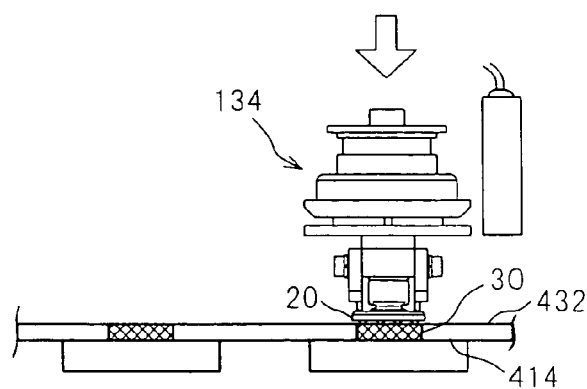
Figure 58A:
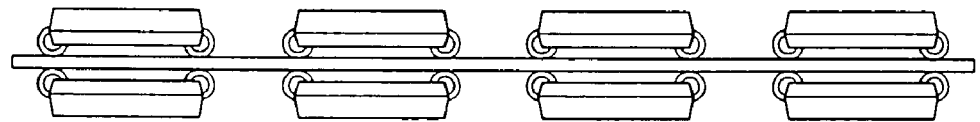
FIGS. 58(a) and (b) are views showing a double-sided mounting state in the package technique of a conventional electronic component.
Figure 58B:
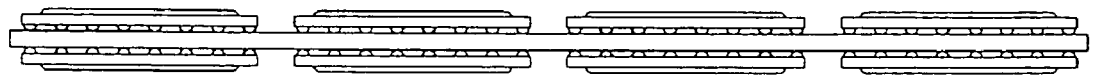
Figure 59A:
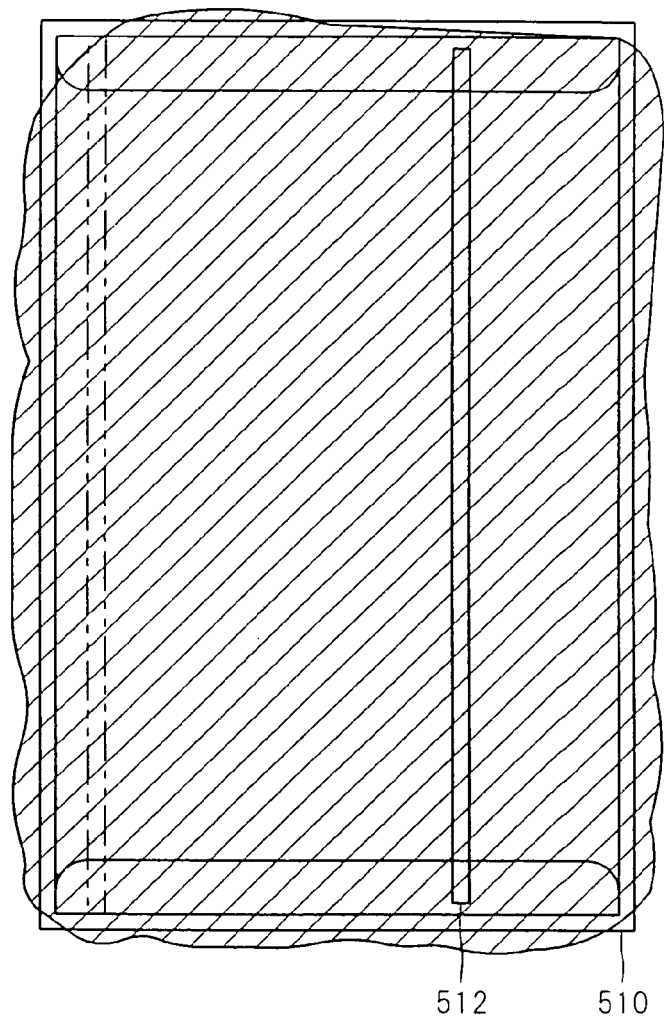
FIGS. 59(a) and (b) are views showing a device for forming the transfer surface of a conventional flux.
Figure 59B:
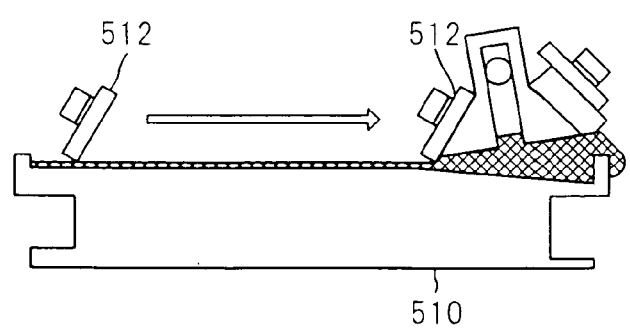
Figure 60A:
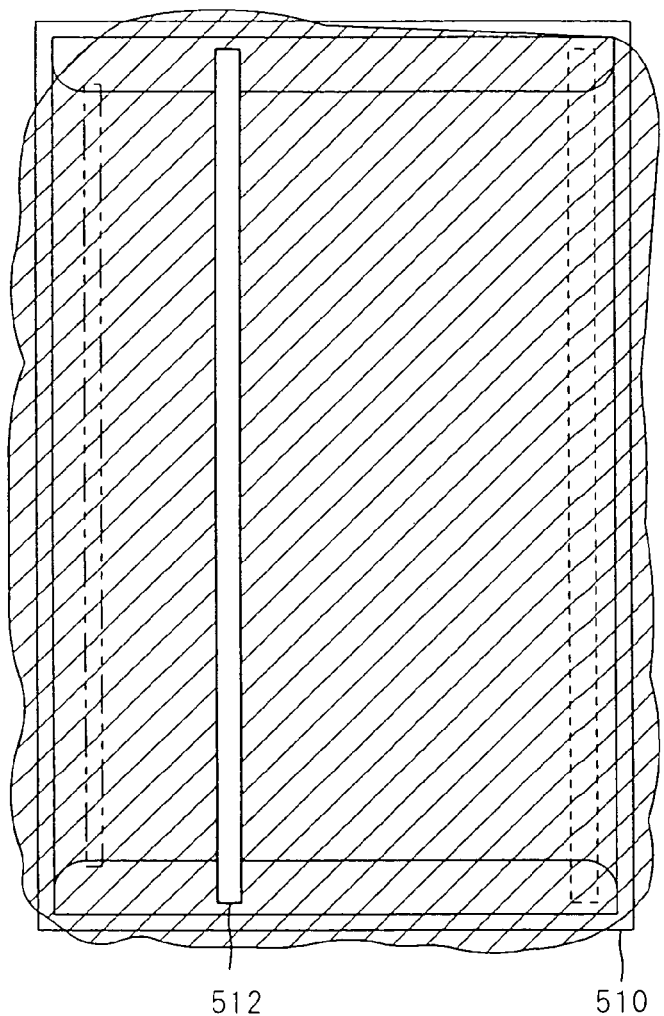
FIGS. 60(a) and (b) is a view showing the device for forming the transfer surface of the conventional flux.
Figure 60B:
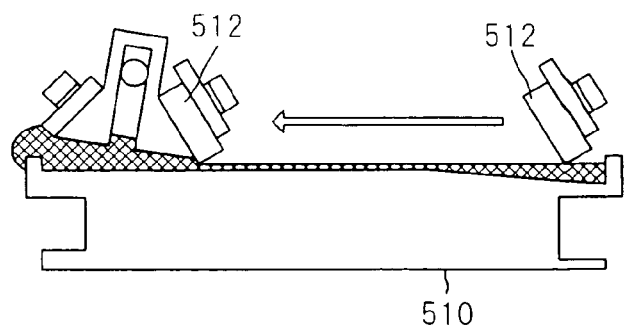
Figure 61:
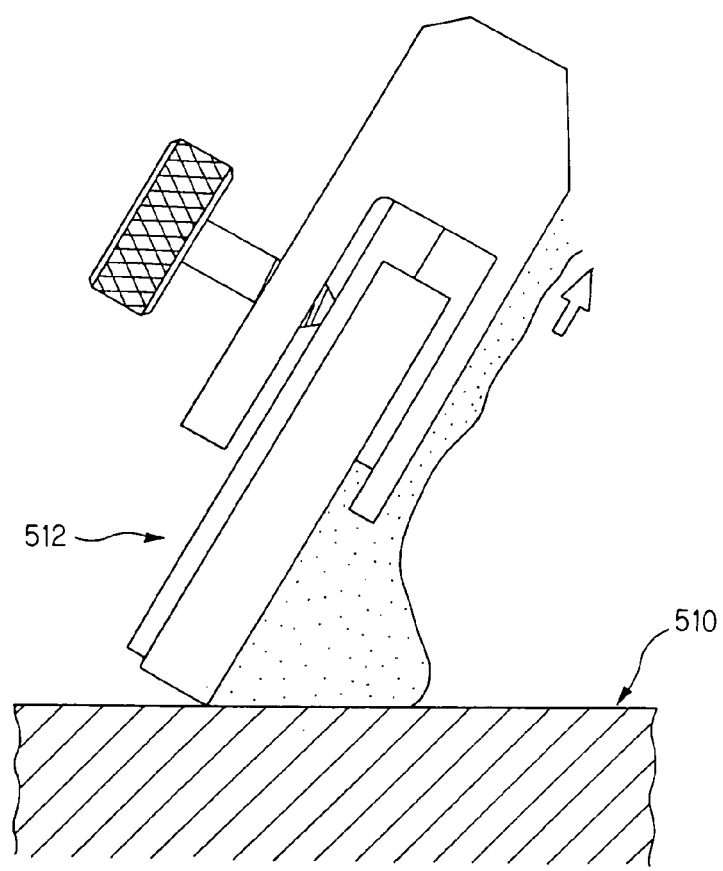
FIG. 61 is a view showing a state in which a solder cream is transmitted toward the upper part of a squeegee with a viscosity thereof.
Figure 62:
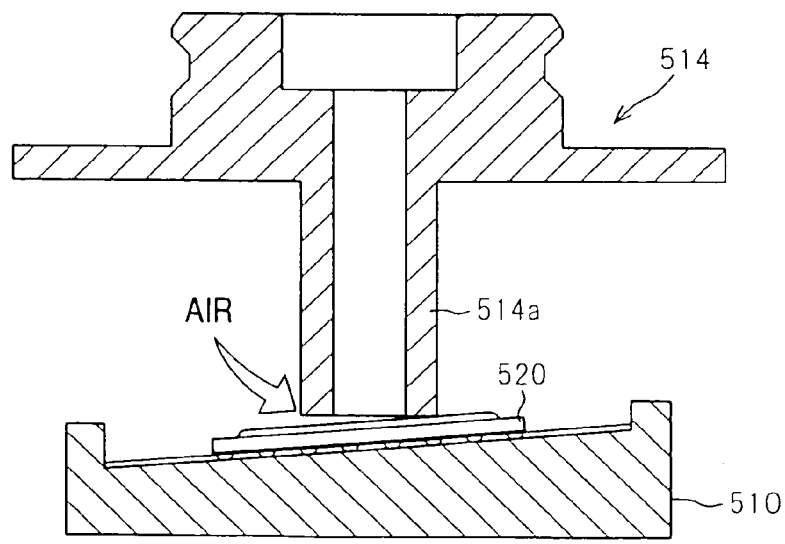
FIG. 62 is a view showing a state in which the solder cream is transferred to an electronic component by using a transfer unit having an inclined pan surface.
Figure 63A:
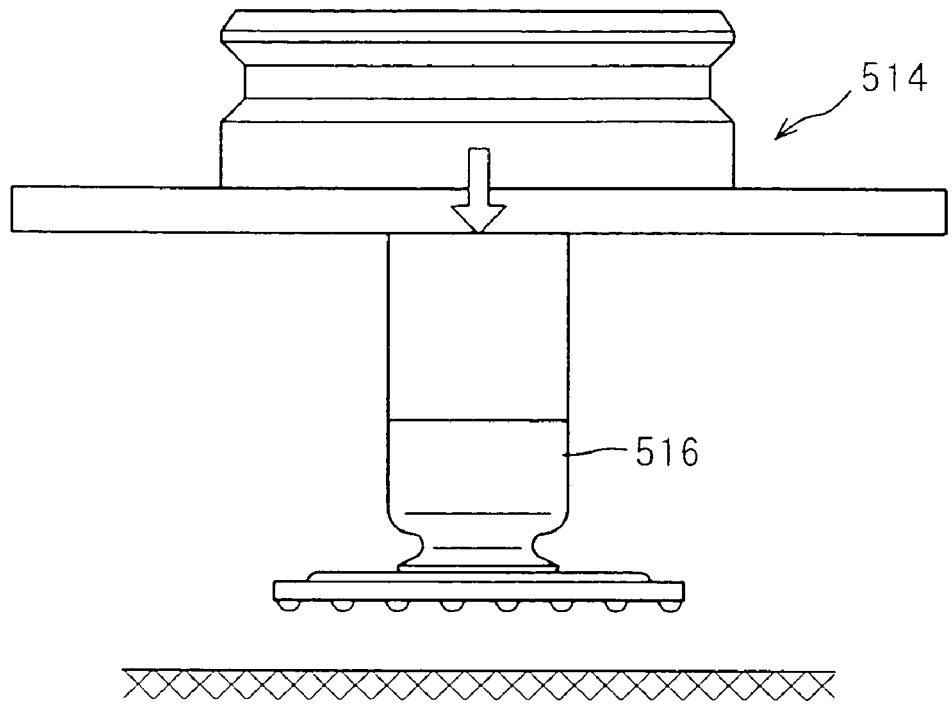
FIGS. 63(a) and (b) are views showing a state in which a push-in depth cannot be controlled when a rubber pad is to be attached to the tip portion of a sucking nozzle and the electronic component is to be pushed into the surface of the solder cream.
Figure 63B:
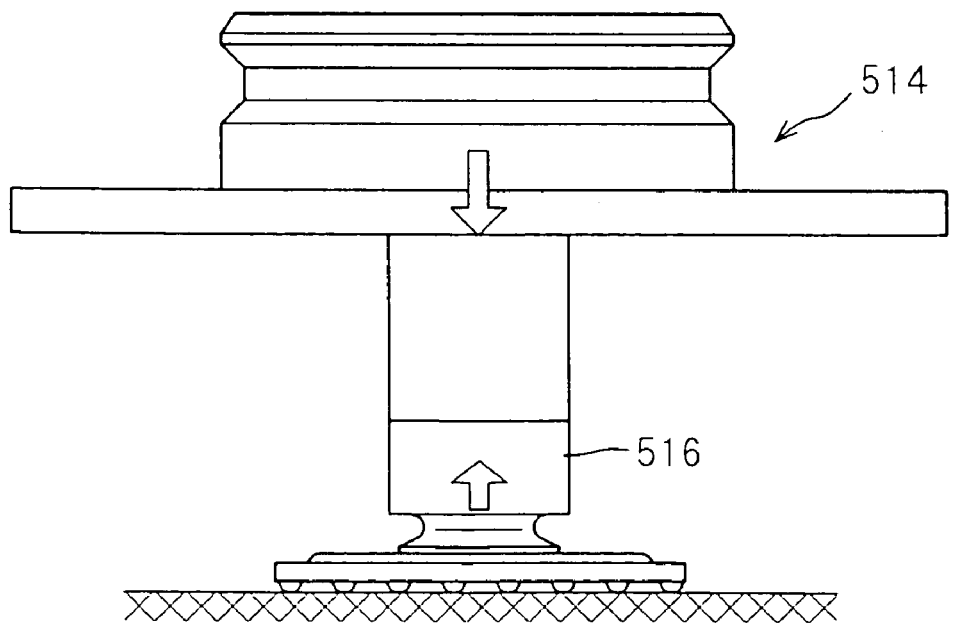

Next, the electronic component 20 sucked into the sucking nozzle 134 of the attachment head is pushed against the formed solder cream transfer surface to carry out the operation for transferring the solder cream. FIGS. 57($a$), ($b$), and ($c$) show, on a stepwise basis, the procedure for transferring the solder cream to the electronic component through the solder cream transfer apparatus 400 according to the embodiment.

In the transfer of the solder cream, first of all, information about a height to the top plate 432 in the vicinity of the solder cream transfer surface is detected by a length measuring sensor 436 such as a laser displacement sensor provided on the side of the sucking nozzle 134 as shown in FIG. 57($a$) and the sucking nozzle 134 is moved just above the solder cream transfer surface as shown in FIG. 57($b$), and the sucking nozzle 134 is then brought down to transfer the solder cream 30 to the electronic component 20 based on the height information obtained from the length measuring sensor 436 as shown in FIG. 57($c$).

According to the solder cream transfer apparatus 400 in accordance with the embodiment, the solder cream transfer surface is formed continuously in a predetermined position. Therefore, the transfer position where the electronic component is pushed is not changed for each transfer operation but a new solder cream transfer surface is always exposed continuously. Consequently, it is possible to simplify the operation for transferring the solder cream and to shorten a mounting tact.

According to the viscous fluid transfer apparatus in accordance with the invention, there are provided a transfer unit having a planar pan surface for putting a viscous fluid thereon, a squeegee unit having a planar stirring squeegee for stirring the viscous fluid put on the pan surface, a planar leveling squeegee for uniformly flattening the viscous fluid thus stirred, and a squeegee fixing member serving to separate the squeegees from each other and to fix them in parallel and having both ends rockably supported pivotally above the transfer unit, a transfer unit moving mechanism for reciprocating the transfer unit such that the squeegee is relatively moved along the pan surface of the transfer unit, and a squeegee driving mechanism for rocking the squeegee unit such that the stirring squeegee and the leveling squeegee approach the pan surface on going and returning paths, respectively. Consequently, the stirring squeegee stirs the viscous fluid put on the transfer unit on the going path of the transfer unit and the leveling squeegee uniformly flattens the viscous fluid stirred on the going path to have a predetermined thickness on the returning path of the transfer unit. Thus, it is possible to form a flat viscous fluid transfer surface on the transfer unit.

According to the viscous fluid transfer method in accordance with the invention, the viscous fluid put on the transfer unit is stirred by relatively moving the stirring squeegee over the pan surface in a forward direction and the viscous fluid thus stirred is then flattened uniformly by relatively moving the leveling squeegee over the pan surface in a reverse direction, thereby forming a flat viscous fluid transfer surface, and the terminal portion of the electronic component is immersed in the viscous fluid transfer surface to transfer the viscous fluid to the electronic component. By relatively moving the two squeegees alternately, thus, the flat viscous fluid transfer surface can be formed stably and the viscous fluid can be uniformly transferred to the terminal portion of the electronic component.

According to the electronic component mounting apparatus in accordance with the invention, there are provided an electronic component supply member for mounting a plurality of electronic components to supply a desirable one of the electronic components, a sucking nozzle for removably sucking and holding the electronic component, an attachment head for holding the sucking nozzle to rise and fall freely, a head moving portion for moving the attachment head in a horizontal plane, and a viscous fluid transfer apparatus for uniformly flattening a viscous fluid on a transfer unit to form a flat viscous fluid transfer surface, wherein the electronic component sucked by the electronic component supply member is moved onto the transfer unit of the viscous fluid transfer apparatus and a terminal portion of the electronic component is immersed in the viscous fluid transfer surface by the up-down operation of the attachment head, thereby uniformly transferring the electronic component to the viscous fluid. Thus, the electronic component to which the viscous fluid is transferred can be mounted in a predetermined position.

According to the electronic component mounting method in accordance with the invention, the electronic component is sucked into the sucking nozzle of the attachment head, while the viscous fluid is uniformly flattened over the transfer unit to form the viscous fluid transfer surface, thereby moving the sucked attachment head of the electronic component to the upper position of the viscous fluid transfer surface. Consequently, the transfer of the viscous fluid is completely prepared. Next, the sucking nozzle is brought down until the terminal portion of the electronic component is immersed in the viscous fluid transfer surface so that the viscous fluid is transferred to the terminal portion, and the sucking nozzle is then raised and the attachment head is moved to the predetermined mounting position. Consequently, the electronic component to which the viscous fluid is transferred is positioned in the upper part of the mounting position. The sucking nozzle is brought down, thereby mounting the electronic component having the terminal portion to which the viscous fluid is transferred.

According to the semiconductor device of the invention having a plurality of solder balls arranged as connecting terminals on a mounting surface side, wherein a land for terminal connection is provided in a position corresponding to the connecting terminal of the semiconductor device on a rear face opposite to the mounting surface side. Consequently, the land of the semiconductor device on the lower stage side and the connecting terminal of the semiconductor device on the upper stage side are connected to each other when the semiconductor device is stacked. Thus, the semiconductor device can be simplified and can be constituted as a stacked structure. Thus, the mounting can be carried out at a higher density.

What is claimed is:

1. A viscous fluid transfer method of forming a flat viscous fluid transfer surface by a squeegee and immersing a terminal portion of an electronic component in the viscous fluid transfer surface, thereby transferring a viscous fluid to the electronic component, said method comprising the steps of:

putting said viscous fluid on a transfer unit having a flat pan surface;

stirring said viscous fluid by a plate-shaped stirring squeegee after said viscous fluid is put on said transfer unit;

forming a viscous fluid transfer surface by flattening said viscous fluid uniformly after said viscous fluid is stirred by a plate-shaped leveling squeegee, wherein said stirring squeegee is relatively moved with respect to the pan surface in a forward direction during stirring said viscous fluid, and wherein a plate-shaped leveling squeegee is moved relatively with respect to the pan surface in a reverse direction during flattening said viscous fluid; and scraping said viscous fluid toward to a central side in the longitudinal direction of said leveling squeegee by said stirring squeegee when said stirring squeegee is relatively moved with respect to the pan surface in a forward direction again after forming a viscous fluid transfer surface, wherein said viscous fluid overflows from both ends in a longitudinal direction of said leveling squeegee when said leveling squeegee is relatively moved with respect to the pan surface in a reverse direction.

2. The viscous fluid transfer method according to claim 1, wherein a thickness of said viscous fluid transfer surface formed on said transfer unit is set by regulating a height of a rise of said leveling squeegee from said pan surface of said transfer unit.

3. The viscous fluid transfer method according to claim 2, wherein said height of the rise from said pan surface is regulated by causing said leveling squeegee to contact on said pan surface of said transfer unit over a whole width and setting a position of contacting said pan surface to be a reference height.

4. A viscous fluid transfer method of forming a flat viscous fluid transfer surface by a squeegee and immersing a terminal portion of an electronic component in the viscous fluid transfer surface, thereby transferring a viscous fluid to the electronic component, said method comprising the steps of:

putting said viscous fluid on a transfer unit having a flat pan surface;

stirring said viscous fluid by a plate-shaped stirring squeegee after said viscous fluid is put on said transfer unit; and forming a viscous fluid transfer surface by flattening said viscous fluid uniformly after said viscous fluid is stirred by a plate-shaped leveling squeegee, wherein said stirring squeegee is relatively moved with respect to the pan surface in a forward direction during stirring said viscous fluid, wherein a plate-shaped leveling squeegee is moved relatively with respect to the pan surface in a reverse direction during flattening said viscous fluid, and wherein said thickness of said viscous fluid transfer surface is set by a height of protrusion of stepped portions provided on said pan surface side on both ends of said leveling squeegee in the longitudinal direction of said leveling squeegee.

5. A viscous fluid transfer method of forming a flat viscous fluid transfer surface by a squeegee and immersing a terminal portion of an electronic component in the viscous fluid transfer surface, thereby transferring a viscous fluid to the electronic component, said method comprising the steps of:

putting said viscous fluid on a belt surface of a belt conveyor while said viscous fluid is stirred, and forming a viscous fluid transfer surface caused by leveling said viscous fluid flatly by a squeegee with a carriage operation of said belt conveyor, wherein said squeegee is provided above said belt surface.

* * * * *